United States Patent
Ang et al.

(10) Patent No.: US 10,923,525 B2
(45) Date of Patent: Feb. 16, 2021

(54) CMOS CAP FOR MEMS DEVICES

(71) Applicant: Meridian Innovation Pte Ltd, Singapore (SG)

(72) Inventors: Wan Chia Ang, Singapore (SG); Piotr Kropelnicki, Singapore (SG); Ilker Ender Ocak, Singapore (SG); Paul Simon Pontin, Singapore (SG)

(73) Assignee: Meridian Innovation Pte Ltd, Singapore (SG)

( * ) Notice: Subject to any disclaimer, the term of this patent is extended or adjusted under 35 U.S.C. 154(b) by 0 days.

(21) Appl. No.: 16/809,561

(22) Filed: Mar. 5, 2020

(65) Prior Publication Data
US 2020/0203417 A1     Jun. 25, 2020

Related U.S. Application Data

(63) Continuation-in-part of application No. 16/517,653, filed on Jul. 21, 2019, which is a continuation of (Continued)

(51) Int. Cl.
*H01L 27/146* (2006.01)
*H01L 31/0224* (2006.01)
(Continued)

(52) U.S. Cl.
CPC .......... *H01L 27/14669* (2013.01); *B81C 1/00* (2013.01); *G01J 5/024* (2013.01);
(Continued)

(58) Field of Classification Search
CPC ..... B81C 1/00; G01J 2005/123; G01J 5/0225; G01J 5/024; G01J 5/046; G01J 5/048;
(Continued)

(56) References Cited

U.S. PATENT DOCUMENTS 6,335,478 B1   1/2002   Chou et al.
6,803,250 B1   10/2004  Yaung et al.
(Continued)

FOREIGN PATENT DOCUMENTS

CN   104501970 A   4/2015
CN   106744656 A   5/2017
(Continued)

OTHER PUBLICATIONS

J. H. Smith et al., Embedded Micromechanical Devices for the Monolithic Integration of MEMS with CMOS, IEEE International Electron Devices Meeting, Dec. 10-13, 1995, pp. 1-5, Sandia National Labs., Albuquerque, New Mexico, U.S.A.
(Continued)

*Primary Examiner* — Long K Tran
(74) *Attorney, Agent, or Firm* — Horizon IP PTE LTD.

(57) ABSTRACT

A complementary metal oxide semiconductor (CMOS) device embedded with micro-electro-mechanical system (MEMS) components in a MEMS region. The MEMS components, for example, are infrared (IR) thermosensors. The device is encapsulated with a CMOS compatible IR transparent cap to hermetically seal the MEMS sensors in the MEMS region. The CMOS cap includes a base cap with release openings and a seal cap which seals the release openings.

20 Claims, 44 Drawing Sheets

Related U.S. Application Data application No. 15/647,284, filed on Jul. 12, 2017, now Pat. No. 10,403,674.

(51) Int. Cl.

| | | |
|---|---|---|
| *G01J 5/16* | (2006.01) | |
| *G01J 5/08* | (2006.01) | |
| *G01J 5/12* | (2006.01) | |
| *G01J 5/04* | (2006.01) | |
| *B81C 1/00* | (2006.01) | |
| *G01J 5/02* | (2006.01) | |
| *H01L 31/09* | (2006.01) | |

(52) U.S. Cl.
CPC ............ *G01J 5/0225* (2013.01); *G01J 5/046* (2013.01); *G01J 5/048* (2013.01); *G01J 5/0853* (2013.01); *G01J 5/12* (2013.01); *G01J 5/16* (2013.01); *H01L 27/146* (2013.01); *H01L 27/14612* (2013.01); *H01L 27/14629* (2013.01); *H01L 27/14643* (2013.01); *H01L 27/14649* (2013.01); *H01L 31/0224* (2013.01); *H01L 31/09* (2013.01); *G01J 2005/123* (2013.01)

(58) Field of Classification Search
CPC ... G01J 5/0853; G01J 5/12; G01J 5/16; H01L 27/146; H01L 27/14612; H01L 27/14629; H01L 27/14643; H01L 27/14649; H01L 27/14669; H01L 31/0224; H01L 31/09
USPC ........................................................ 257/665
See application file for complete search history.

(56) References Cited

U.S. PATENT DOCUMENTS

| | | |
|---|---|---|
| 7,755,048 B2 | 7/2010 | Hsu |
| 9,324,760 B2 | 4/2016 | Vasseur et al. |
| 9,505,611 B1 | 11/2016 | Liu et al. |
| 9,577,001 B2 | 2/2017 | Enichlmair et al. |
| 2007/0057343 A1 | 3/2007 | Chinthakindi et al. |
| 2008/0142912 A1 | 6/2008 | Inaba et al. |
| 2008/0216883 A1 | 9/2008 | Leneke et al. |
| 2009/0243004 A1 | 10/2009 | Lan et al. |
| 2010/0031992 A1 | 2/2010 | Hsu |
| 2010/0181484 A1 | 7/2010 | Inada et al. |
| 2010/0243892 A1 | 9/2010 | Dupont |
| 2011/0147869 A1 | 6/2011 | Lazarov et al. |
| 2012/0061569 A1 | 3/2012 | Noguchi |
| 2012/0097415 A1 | 4/2012 | Reinert et al. |
| 2013/0234270 A1 | 9/2013 | Yama et al. |
| 2015/0076651 A1 | 3/2015 | Noguchi |
| 2015/0168221 A1 | 6/2015 | Mao et al. |
| 2015/0177069 A1 | 6/2015 | Maes et al. |
| 2015/0210540 A1 | 7/2015 | Sadaka et al. |
| 2015/0321905 A1 | 11/2015 | Gooch et al. |
| 2016/0079306 A1 | 3/2016 | Kropelnicki et al. |
| 2016/0214855 A1 | 7/2016 | Yeh et al. |
| 2016/0264402 A1 | 9/2016 | Yu et al. |
| 2016/0289063 A1 | 10/2016 | Ocak et al. |
| 2016/0318758 A1 | 11/2016 | Chou et al. |
| 2016/0332867 A1 | 11/2016 | Tseng et al. |
| 2016/0379961 A1 | 12/2016 | Lee et al. |
| 2016/0379962 A1* | 12/2016 | Huang ................ H01L 27/1469 257/459 |
| 2017/0107097 A1* | 4/2017 | Cheng ................... B81B 7/0006 |
| 2017/0179119 A1 | 6/2017 | Chang et al. |
| 2018/0257927 A1 | 9/2018 | Rothberg et al. |
| 2019/0027522 A1 | 1/2019 | Kropelnicki et al. |

FOREIGN PATENT DOCUMENTS

| | | |
|---|---|---|
| EP | 2105963 A2 | 9/2009 |
| EP | 2264765 A1 | 12/2010 |
| TW | 201339544 A | 10/2013 |
| WO | 2014100706 A1 | 6/2014 |

OTHER PUBLICATIONS

A Graf et al, Review of micromachined thermopiles for infrared detection, Measurement Science and Technology, Jul. 1, 2007, pp. R59-R75, vol. 18, No. 7, IOP Publishing, Bristol, GB.

* cited by examiner

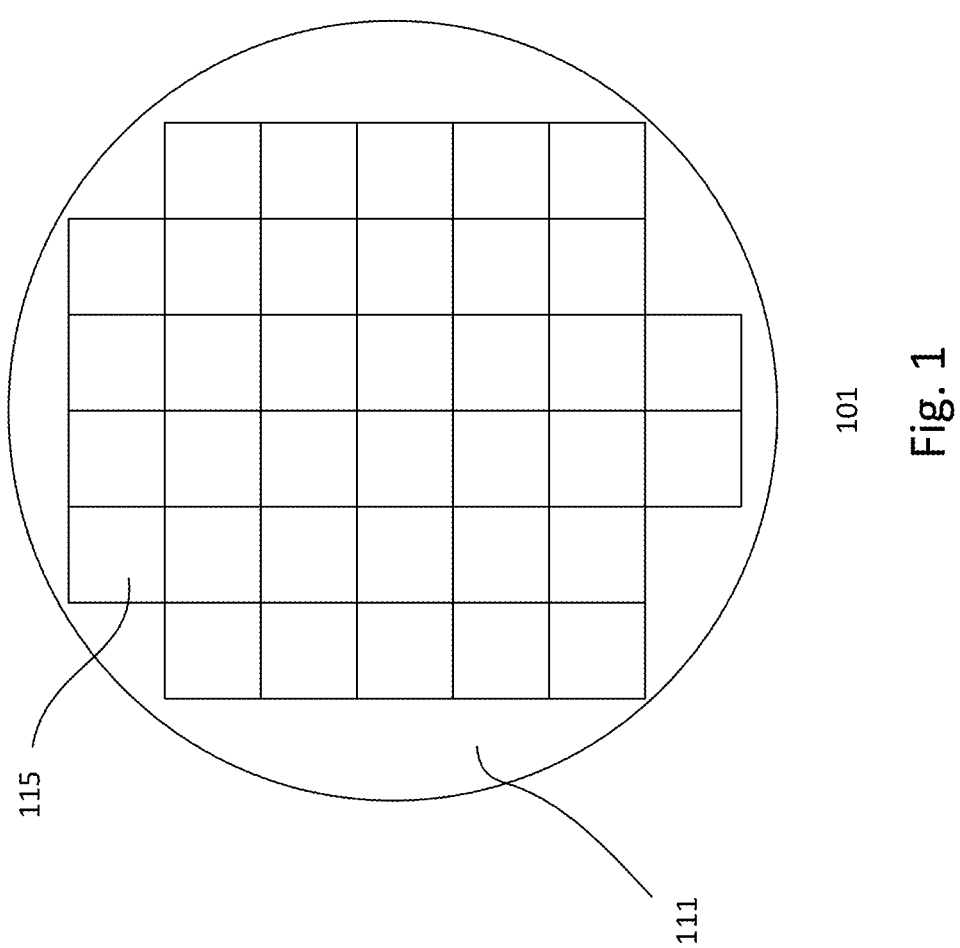

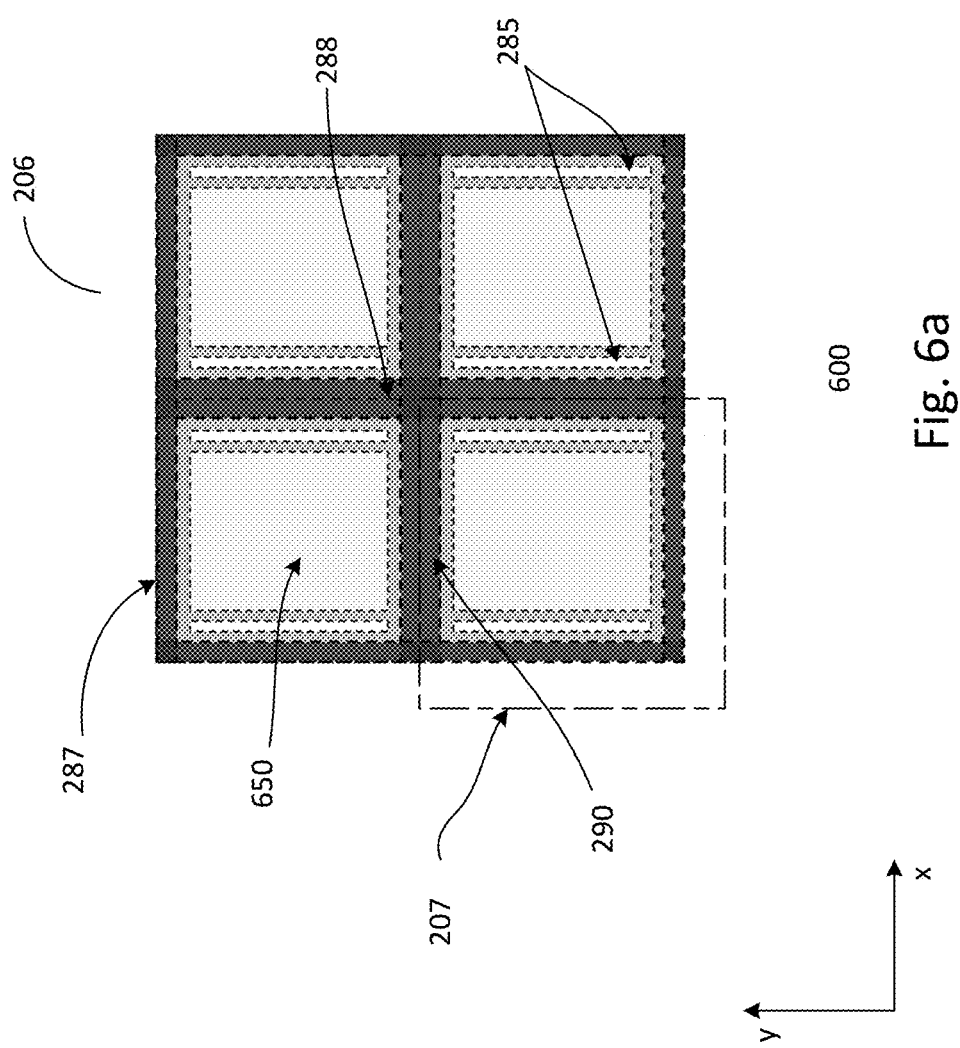

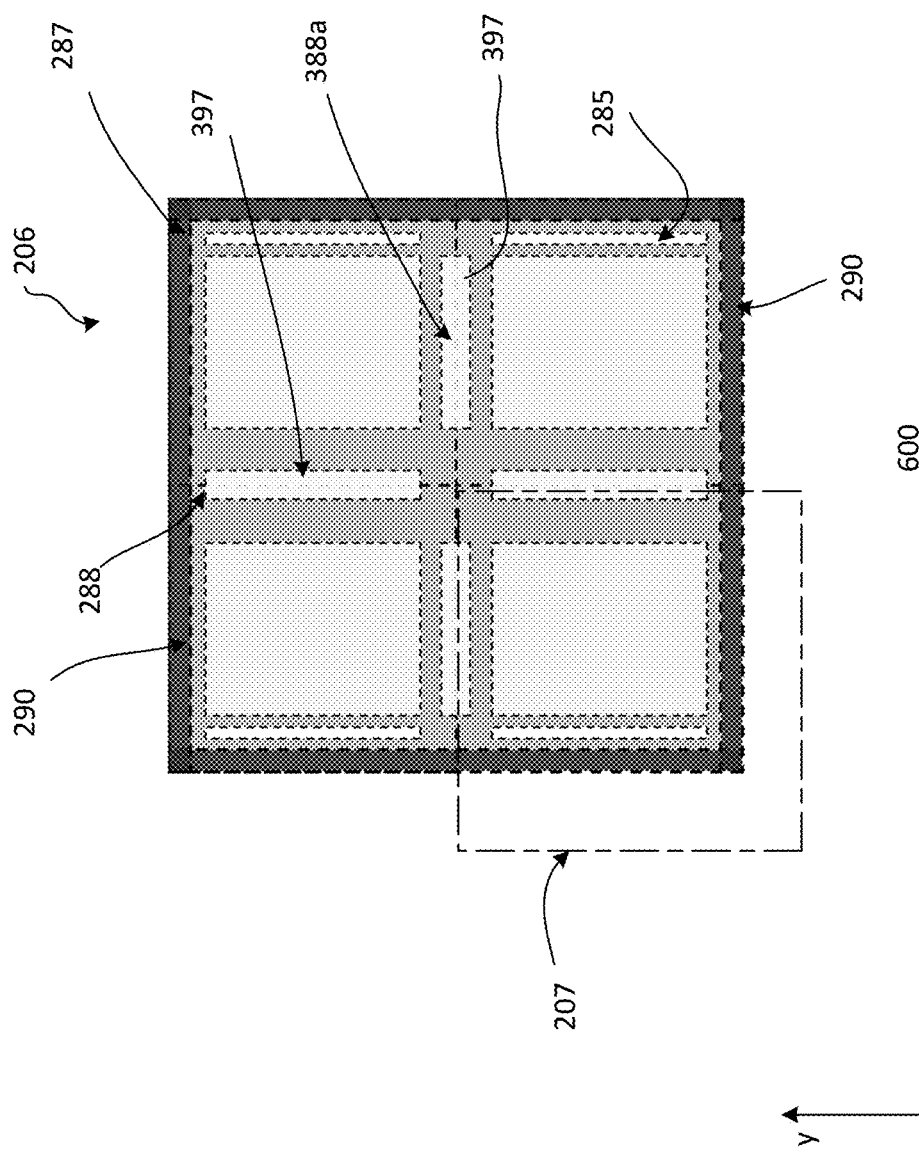

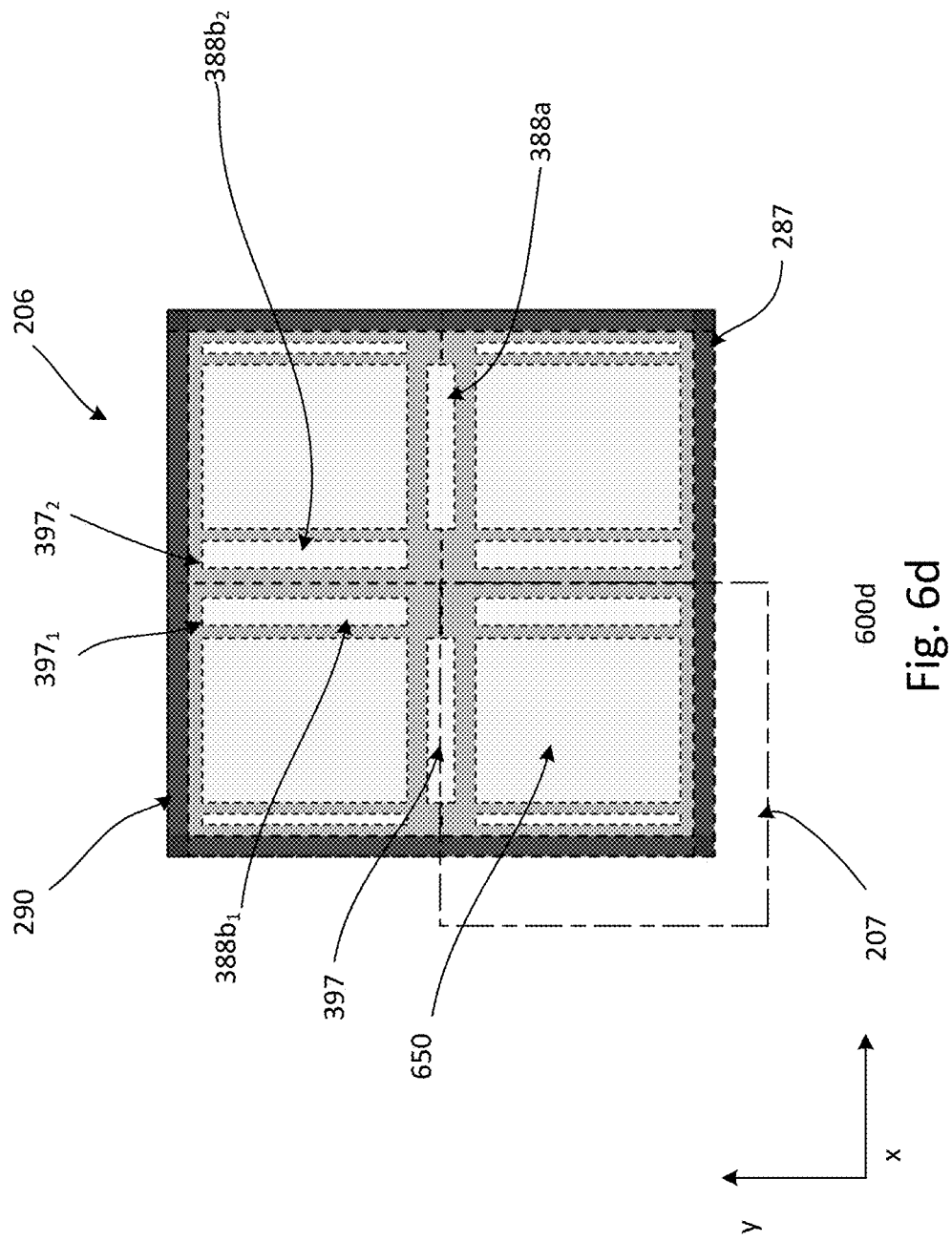

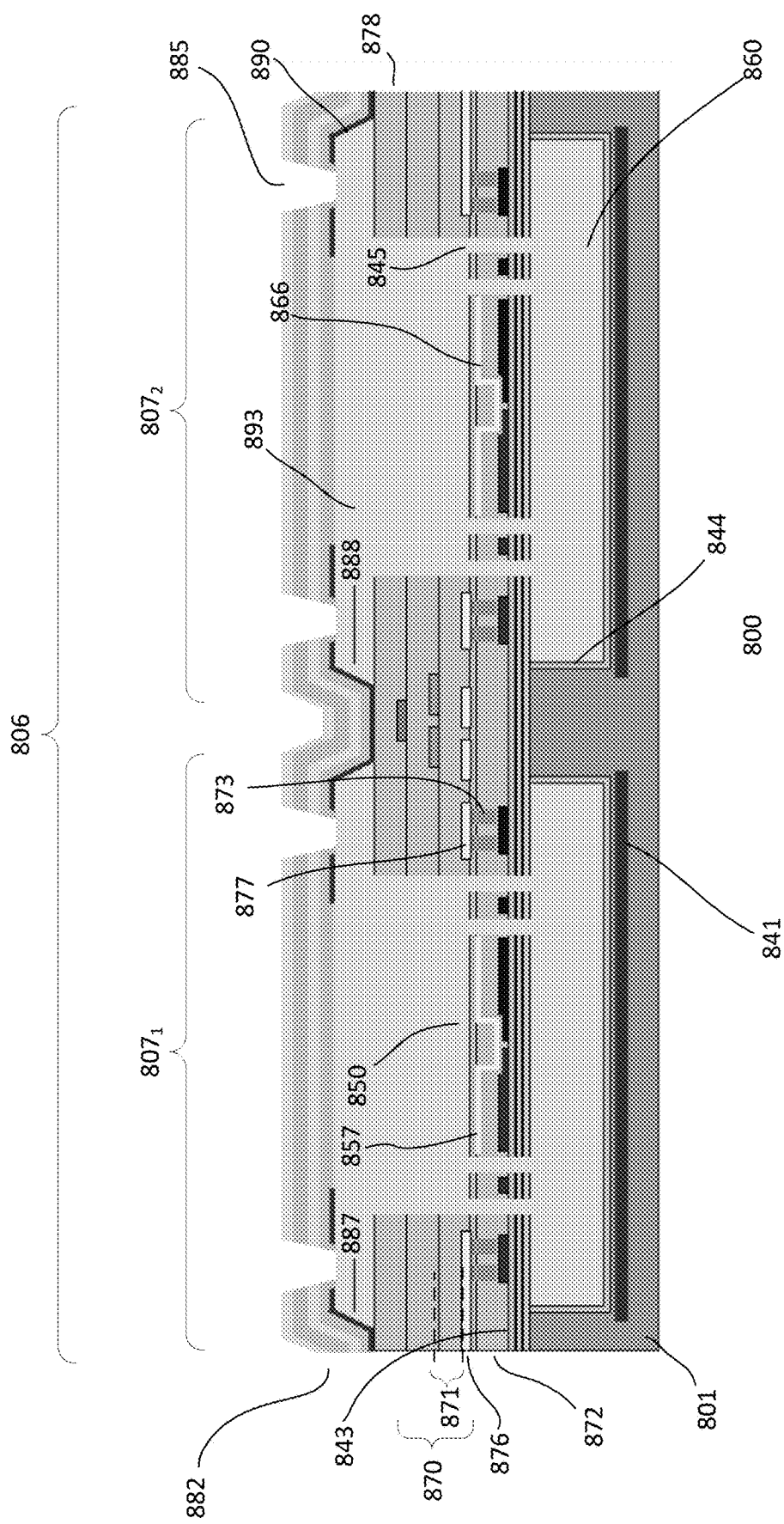

CMOS CAP FOR MEMS DEVICES

CROSS-REFERENCE TO RELATED APPLICATIONS

This application is a continuation-in-part application which claims benefit of co-pending U.S. patent application Ser. No. 16/517,653, filed on Jul. 21, 2019 which is a continuation application which claims benefit of U.S. patent application Ser. No. 15/647,284, titled Scalable Thermoelectric-based Infrared Detector, now U.S. Pat. No. 10,403,674, filed on Jul. 12, 2017. This application cross-references to U.S. patent application Ser. No. 16/224,782, filed on Dec. 18, 2018, which is a divisional application of U.S. patent application Ser. No. 15/653,558, titled Thermoelectric-based Infrared Detector with high CMOS Integration, now U.S. Pat. No. 10,199,424, filed on Jul. 19, 2017, the disclosure of which is herein incorporated by reference in their entireties for all purposes.

BACKGROUND

The demand for uncooled infrared (IR) detectors is continually growing due to the increased demand from numerous applications. These applications, just to name a few, include air conditioning systems, handphones, autonomous driving cars, internet of things (IoT), fire-fighting and traffic safety. Furthermore, it is expected that there will be numerous more applications in the near future.

Conventional uncooled IR detectors have been implemented using microbolometers. However, microbolometers require mechanical components for calibration purposes. As an example, microbolometers require mechanical shutters for offset correction. The required mechanical components for microbolometers increases manufacturing complexity. Such complexity increases costs. In addition, the need for mechanical components for microbolometer makes it difficult to produce small or compact devices.

The present disclosure is directed to cost-effective and compact IR detectors.

SUMMARY

Embodiments of the present disclosure generally relate to device and method of forming thereof.

In one embodiment, a device includes a substrate prepared with a complementary metal oxide semiconductor (CMOS) region with CMOS devices and a sensor region with micro-electro-mechanical system (MEMS) region with a MEMS component. The device further includes a CMOS compatible cap disposed on the substrate over the CMOS region and MEMS region. The CMOS compatible cap includes CMOS layers and the CMOS compatible cap is elevated over the MEMS region to provide a cap cavity between the cap and the MEMS region.

In another embodiment, a method for forming a device includes providing a substrate prepared with a complementary metal oxide semiconductor (CMOS) region with CMOS devices and a sensor region with micro-electro-mechanical system (MEMS) region with a MEMS component. The method further includes forming a CMOS compatible cap on the substrate over the CMOS region and MEMS region. The CMOS compatible cap includes CMOS layers, the CMOS compatible cap is elevated over the MEMS region to provide a cap cavity between the cap and the MEMS region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIG. 1 shows a top view of a semiconductor wafer;

FIGS. 6a-d show top views of various embodiments of layout or design for the getter layer, release openings and bearing walls;

DETAILED DESCRIPTION

Figure 2A:
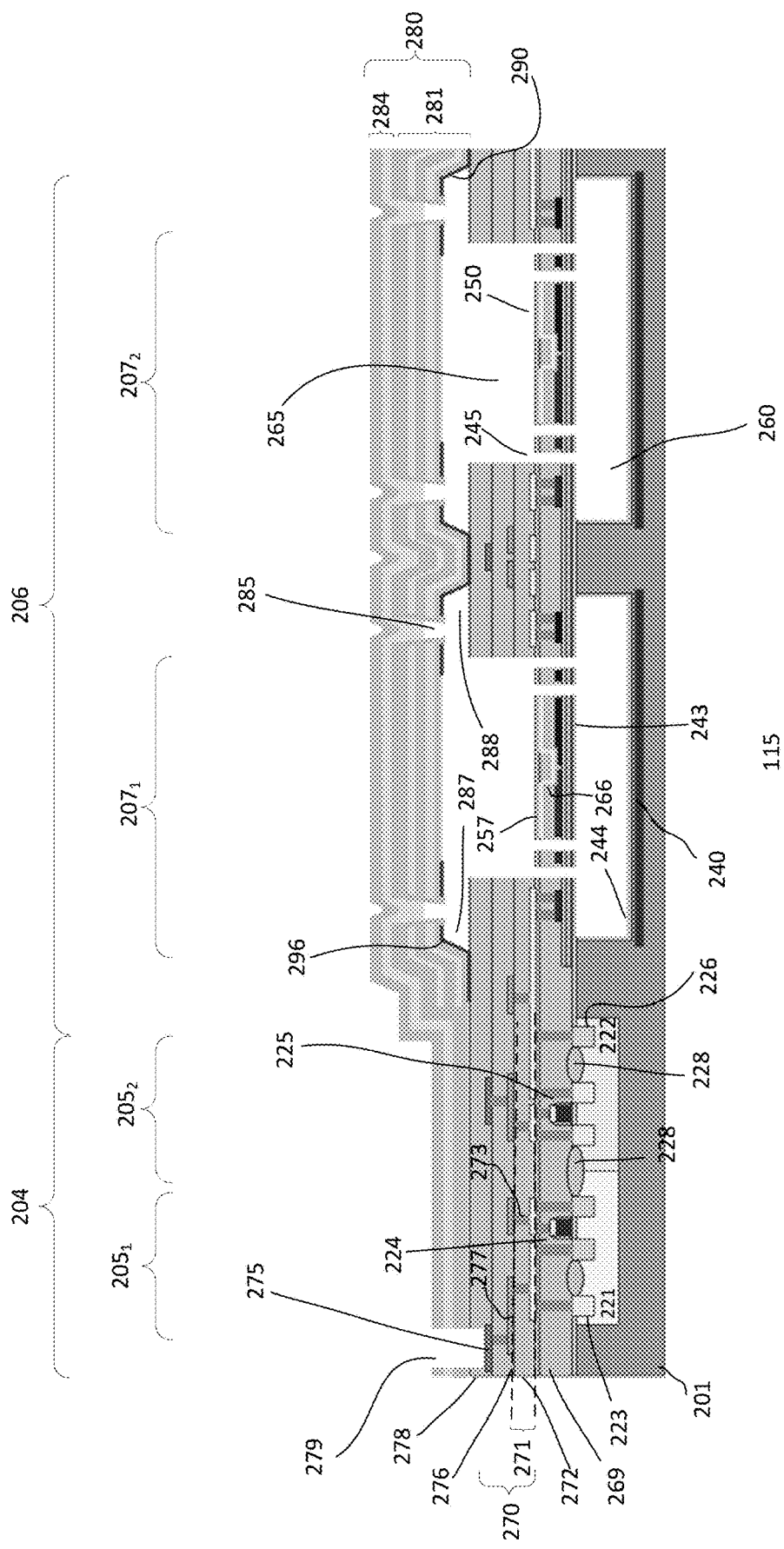
FIGS. 2a-b show simplified cross-sectional views of embodiments of a device.

Embodiments generally relate to devices, for example, semiconductor devices or integrated circuits (ICs) with thermoelectric-based infrared (IR) detectors. The IC, for example, is a complementary metal oxide semiconductor (CMOS) device. As for the IR detector or sensor, it is, for example, a micro-electrical-mechanical system (MEMS). The MEMS detector is embedded in the IC. Furthermore, the MEMS detector is compatible with CMOS processing. The devices can be incorporated into products, such as thermal imagers. For example, a device may include a plurality of MEMS sensors which can be configured to form a sensor array for a thermal imager. The sensors may be used for other types of applications, such as single pixel or line array temperature or motion sensors. The fabrication of devices may involve the formation of features on a substrate that makes up circuit components, such as transistors, resistors, capacitors and MEMS sensors, as part of a front-end-of-line (FEOL) processing. As part of back-end-of-line (BEOL) processing, interconnections are formed to interconnect the components, enabling the device to perform the desired functions. The BEOL processing also includes forming a CMOS compatible in-situ infrared transparent cap which hermetically seals the MEMS sensors.

To form the features, such as CMOS circuit components, sensors, interconnections and caps, layers are repeatedly deposited on the substrate and patterned as desired using lithographic techniques. For example, a wafer is patterned by exposing a photoresist layer with an exposure source using a reticle containing the desired pattern. After exposure, the photoresist layer is developed, transferring the pattern of the reticle to the photoresist layer. This forms a photoresist etch mask. An etch is performed using the etch mask to replicate the pattern on the wafer below, which may include one or more layers, depending on the stage of the process. In the formation of the devices, numerous reticles may be used for different patterning processes. Furthermore, a plurality of devices may be formed on the wafer in parallel. By hermetically sealing the sensors using a CMOS IR transparent cap which is compatible with CMOS standard process flow, the manufacturing cost is greatly reduced, enabling mass production of integrated sensor devices.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI), or silicon germanium wafer, as well as wafers doped with other types of dopants or dopant concentrations, may also be useful.

The wafer includes an active surface 111 on which a device 115 is formed. A plurality of devices may be formed on the wafer in parallel. The devices, for example, are arranged in rows along a first (x) direction and columns along a second (y) direction. Separating the devices is a process of dicing channels. After processing and packaging are completed, the wafer is diced along the dicing channels to singulate the devices into individual chips.

Figure 2B:
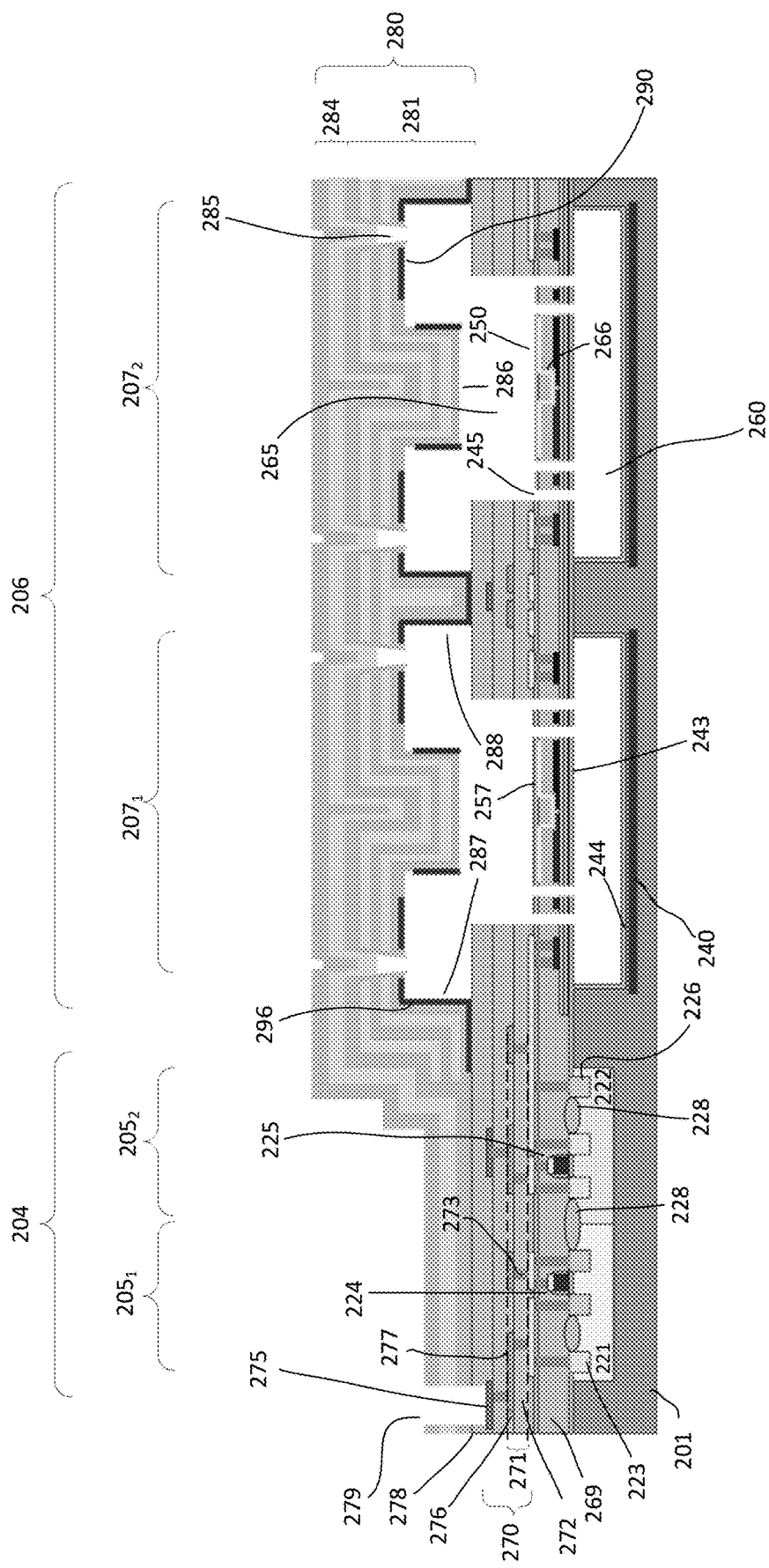

FIGS. 2a-b show simplified cross-sectional views of embodiments of a device 115. The device, for example, is a CMOS device with an embedded MEMS structure or component. In one embodiment, the device is a CMOS device embedded with a thermoelectric-based IR sensor or detector. In some embodiments, the MEMS structure of the device includes a plurality of thermoelectric-based IR sensors. The plurality of sensors may be configured to form a sensor or detector array. For example, the device may be an IR imager in which each sensor may be a pixel of an infrared image. Other types of MEMS structures or applications may also be useful. The device, for example, may be formed in parallel with other devices on a wafer and subsequently singulated.

Referring to FIGS. 2a-b, the device includes a substrate 201. The substrate, for example, may be a part of the wafer on which devices are formed and singulated into individual dies, as described in FIG. 1. Common elements may not be described or described in detail. The substrate may be a semiconductor substrate, such as a silicon substrate, which is part of a wafer. The substrate may be a lightly doped p-type silicon substrate. Other types of substrates or wafers may also be useful.

In one embodiment, the substrate includes first and second device regions 204 and 206. The first region is a CMOS region while the second region is a MEMS region. The CMOS region includes CMOS components and the MEMS region includes MEMS structures or components. As shown, the CMOS region includes first and second CMOS device regions $205_{1-2}$ for first and second CMOS components or devices. The CMOS components include first and second polarity type metal oxide semiconductor (MOS) transistors 224 and 225.

The first transistor includes a second polarity type first well 221. The first transistor includes a gate on the surface of the well between first polarity type source/drain (S/D) regions. The first well may also include a second polarity type first tap 223 for biasing the first well. In the case the first transistor is n-type, the well and tap are p-type while the S/D regions are n-type. The second transistor includes a first polarity type second well 222. The second transistor includes a gate on the surface of the well between second polarity type S/D regions. The second well may include a first polarity type second tap 226 for biasing the second well. In the case the second transistor is p-type, the well and tap are n-type while the S/D regions are p-type.

A gate may include a gate electrode over a gate dielectric. The gate electrode may be polysilicon and the gate dielectric may be thermal silicon oxide. Other types of materials or configurations of gates may also be useful. The S/D regions may include lightly doped extension regions. The lightly doped extension regions are lightly doped with the same polarity type dopants as the heavily doped S/D regions. The sidewalls of the gate may include dielectric spacers. The spacers facilitate aligning the S/D and lightly doped extension regions.

Although only 2 transistors are shown, it is understood that the CMOS region may include numerous transistors as well as other CMOS components. The transistors may be configured to operate in different voltages. For example, the CMOS region may include a low voltage (LV) region for LV transistors, an intermediate or medium voltage (MV) region for MV transistors and a high voltage (HV) region for HV transistors. Other types of device regions may also be included. For example, a memory region may be included in which a memory array is disposed.

As discussed, the device may include a sensor array in the MEMS region with a plurality of sensors arranged in a matrix with rows and columns of sensors. Each sensor may correspond to a pixel of an array of pixels. In such case, the CMOS components may include select switches, row and column decoders and readout circuits. Other CMOS components may also be included. The CMOS components are configured to read out each pixel of the array. Once the full array of sensors is read out, an image may be reconstructed. The image, for example, is one frame corresponding to the sensors of the array.

Isolation regions 228 are provided to isolate the component regions. For example, isolation regions are provided to isolate the first and second transistor regions as well as the CMOS and MEMS components. In addition, isolation regions may be provided to isolate a device well contact from an S/D region. The isolation regions may be field oxide (FOX) isolation regions. Other types of isolation regions, such as shallow trench isolation (STI) regions may also be useful.

The MEMS region 206 includes at least one MEMS device region for a MEMS structure or sensor. In one embodiment, the MEMS region includes a plurality of MEMS device regions, each with a MEMS sensor. The sensors are configured and interconnected to form a sensor array. As shown, the MEMS region includes first and second MEMS device regions $207_{1-2}$. Providing the MEMS region with other numbers of MEMS device regions may also be useful. For example, the MEMS region may include M×N MEMS device regions for a M×N sensor array. For example, the MEMS region may include 2×2 MEMS device regions arranged in a 2×2 matrix to form a 2×2 sensor array.

A MEMS device region includes a lower device or sensor cavity 260. In one embodiment, the lower device cavity is disposed in the substrate, creating a substrate cavity. For example, the lower device cavity may be a trench formed from etching the substrate. The substrate cavity includes cavity sidewalls and bottom which are defined by the substrate. Providing a lower device cavity above the substrate surface may also be useful. The lower device cavity may have a square or rectangular footprint or shape. Other shapes for the lower device cavity may also be useful. As for the top of the lower device cavity, it is defined by a dielectric layer 243. The dielectric layer covers the lower device cavity. In the case where the MEMS region includes multiple MEMS device regions, each with a lower device cavity, the dielectric layer covers all the cavities of the sensor array. The dielectric layer may be a silicon oxide layer. Other types of dielectric layers, such as silicon nitride may also be useful. For example, the dielectric layer may be a dielectric stack having multiple dielectric layers. The dielectric layer serves as a membrane for a MEMS structure 250 of the MEMS device region.

A reflector 240 is disposed at the bottom of the lower device cavity. In one embodiment, a first reflector is disposed in the first lower device cavity and a second reflector is disposed in the second lower device cavity. The reflector is configured to reflect infrared (IR) radiation. The reflector may be formed from a conductive material. In one embodiment, the reflector is a conductive metal silicide reflector. The metal silicide reflector may be a titanium silicide ($TiSi_x$), a tungsten silicide ($WSi_x$) or an aluminum silicide ($AlSi_x$) reflector. Other types of metal silicide reflectors which reflect IR radiation may also be useful. For example, the reflector may be a conductive doped reflector layer. The doped reflector layer may be a doped silicon layer, such as a doped polysilicon layer. The doped reflector layer may be heavily doped with p-type or n-type dopants. For example, the dopant concentration of the doped reflector layer may be about $10^{21}$ dopants/cm$^3$. The conductive properties of the surface of the doped region are attributed to the high concentration of dopants being applied, thereby enabling the reflection of the incoming IR radiation. In other embodiments, the reflector may be a non-conductive reflector, such as a photonic crystal reflector. For example, a photonic crystal layer is formed by etching the surface of the lower device cavity. The photonic crystal layer may include a grating pattern configured to reflect incident IR radiation. For example, different grating patterns of varying depths may be etched from the surface of the photonic crystal layer to adjust the wavelengths and properties of the reflected IR radiation. Other types of reflectors may also be useful.

A protective liner 244 may be provided. The protective liner, in one embodiment, lines the sidewalls and bottom of a lower device cavity, covering the reflector. The protective liner serves to protect the reflector and sidewalls of the lower device cavity from subsequent processes. For example, the protective liner serves to protect the reflector from etchants, such as $XeF_2$, used in a release process to form the lower device cavity. The protective liner may be a dielectric protection liner. In one embodiment, the protective liner is a silicon oxide liner. Other types of liners, including non-dielectric liners, which are CMOS compatible and are selective to the etchant used in the release process may also be employed. The liner should also be a non-IR absorbing liner. Preferably, the liner is IR transparent and non-IR absorbing. The protective liner, for example, may be less than 200 nm thick. Any other thickness for the protective liner which adequately protects the cavity sidewall and reflector during the release process may also be useful.

A MEMS structure 250 is disposed in the sensor region on the dielectric layer which defines the top of the first and second lower device cavities. For example, the MEMS structure may be disposed on the liner which lines the dielectric layer defining the top of the first and second lower device cavities. The MEMS structure may be a sensor. In one embodiment, the MEMS structure is a thermopile line structure which serves as a thermoelectric IR sensor or detector. The thermopile structure may be similar to those described in, for example, U.S. Ser. No. 16/517,653, U.S. Ser. No. 10,403,674, U.S. Ser. No. 16/224,782, and U.S. Ser. No. 10,199,424, which are all already herein incorporated by reference for all purposes. Other types of MEMS structures or sensors, including non-IR sensors, may also be disposed in the sensor region.

A thermopile line structure, in one embodiment, includes doped thermoelectric material. In one embodiment, the thermopile line structure includes doped polysilicon. Other types of thermoelectric materials which are stable at high temperatures may also be used as the thermopile line structure. For example, other thermoelectric materials may include silicon germanium (SiGe), gallium nitride (GaN) or a 2D material, such as graphene, black phosphorus or molysulfide. The thermoelectric material may be a doped thermoelectric material. The pattern of the line structure may be a serpentine or meandering line pattern.

In one embodiment, the thermopile line structure includes N line units, where N>1. For example, a thermopile line structure may include 1 (N=1) or more (N>1) line units. A line unit includes first and second line segments doped with first and second thermopile dopants. The first thermopile dopants are first polarity type dopants and the second thermopile dopants are second polarity type dopants. The first and second polarity type dopants are opposite polarity type dopants. For example, the first polarity type is p-type and the second polarity type is n-type. The first and second segments, preferably, have about symmetrical lengths. For example, the lengths of the first and second segments have about the same length. This produces about symmetrical heat dissipation between the segments. In some cases, the lengths of the segments may be ±20% of each other. This produces an acceptable difference in heat dissipation between the segments. The doping of the line segments may, for example, be integrated into the S/D doping processes of the p-type and n-type transistors. Alternatively, separate doping processes may be employed to form the doped line segments.

In the case where the line structure includes a single line unit, the segments of the line units are disposed on a line level. For example, the first and second line segments of the line unit are disposed on the same line level over the dielectric layer.

In one embodiment, a metal contact 266 couples the first and second line segments. The metal contact may be disposed at the interface of the first and second line segments. In one embodiment, the metal contact should be a high temperature contact. For example, the contact can sustain subsequent process temperatures. The high temperature metal contact, for example, may be a titanium (Ti) or an aluminum (Al) alloy contact. Other types of high temperature metals may also be used to form the contact. A first thermopile terminal is disposed at a first end of the line structure and a second thermopile terminal is disposed at a second end of the line structure. The terminals may be part of the line structure.

In the case where the line structure includes a multi-line unit line structure (N>1), a line unit of the multi-line unit structure is a stacked line unit. The line units of the multi-line unit line structure are coupled in series. Providing multiple line units to form a sensor improves sensor performance without increasing surface area. In one embodiment, the multi-line structure includes first and second stacked line units (N=2). Providing other numbers of line unit for a line structure may also be useful. For example, a line structure may have 1-4 (N=1-4) line units. Preferably, a line structure has $2^N$ line units, where N=0-2. Other numbers of line unit may also be useful.

In one embodiment, the first and second stacked line units are disposed adjacent to each other on the dielectric layer within the sensor region. A stacked line unit includes a first segment disposed in a first line level and a second line segment disposed in a second line level. The first and second line level may be separated by a dielectric layer. For example, the second line segment of a line unit is overlaid over the first line segment of the line unit and separated by an interline level dielectric layer. A contact connects the first line segment in the first line level to the second line segment in the second line level.

The first and second line units, as discussed, are coupled in series. For example, a second terminal of the first line unit may be coupled to a first terminal of the second line unit while a first terminal of the first line unit serves as a first terminal of the multi-line unit line structure and a second terminal of the second line unit serves as a second terminal of the multi-line unit line structure. As an example, a line structure with 2 line units may be connected in series to form an n-p-n-p line structure.

The line units of the multi-line unit line structure preferably have similar designs. For example, the line structures have similar patterns with similar line segment lengths which allow for the same cuts through the dielectric layers to the sacrificial layer for an easier release process. Other configurations of line units may also be useful.

In the case of a polysilicon line structure, it may be formed with one of the polysilicon layers used to form the gate electrodes. For example, the CMOS process may include a gate electrode layer for gate electrodes and may also be employed to also serve as the polysilicon line structure. In the case where the CMOS process includes more than one polysilicon gate electrode layer, the thinner polysilicon gate electrode layer may be preferably selected to serve as the polysilicon line structure. In another embodiment, a separate layer may be employed to serve as the line structure. When multiple line structures are stacked, the different stacked structures preferably have the same material and thickness. Providing line structures with different thicknesses may also be useful. For example, the resistance can be adjusted with varying thicknesses and thermal isolation can be improved with thinner polysilicon line structure due to improved sensitivity. Additional line structure layers may be included in the process to serve as line structures of the stack.

An absorber layer 257 may be provided over the line structure. The absorber layer, for example, is configured to absorb incident IR radiation. In one embodiment, the absorber layer is disposed on a central portion of the line structure. The absorber layer is thermally coupled to a center of the line structure. The absorber layer may be a titanium nitride (TiN) layer. Other types of absorber layers may also be useful. For example, the absorber layer may be a nickel-chromium (NiCr) layer or a doped silicon layer. In one embodiment, the absorber is configured to absorb most of the incident IR radiation. For example, the absorber may be configured to absorb greater than 85% of incident IR radiation having a wavelength of 8-14 μm. Providing any other configurations may also be useful. In other embodiments, the absorber is configured to absorb incident radiation having a wavelength of 2-5 μm. For example, another harmonic of the interferometric absorber is used. In one embodiment, the absorber is configured to absorb >50% of incident radiation having a wavelength of 2-5 μm.

A sensor protection layer, in one embodiment, is disposed over the absorber layer. The sensor protection layer serves to protect the sensor from subsequent etch processes. For example, the protection layer serves to protect the line structure and absorber layer from etchants, such as $XeF_2$, used to form the lower device cavity. In one embodiment, the protection layer is a silicon oxide layer. Other types of layers which are transparent to IR radiation and are selective to the etchant used to form the lower device cavity may also be useful.

Release openings 245 are provided in the membrane and other layers above, such as the dielectric layer between the sensor, the absorber layer, and the protective layer, to enable removal of lower device cavity sacrificial material in the lower device cavity during a release process. In one embodiment, the lower device cavity has a depth which is selected for optimal reflection of the desired wavelengths of IR radiation by the reflector. In one embodiment, the depth of the cavity is sufficient to ensure ¼ wavelength optical distance between the absorber and reflector. For example, the optical distance may be about 2-3 μm for detecting IR radiation having a wavelength of 8-12 μm. Other distances may also be useful, depending on the wavelength to be detected. For example, by decreasing or increasing the optical distance, IR radiation with smaller or larger wavelengths can be detected respectively. The optical distance is defined as the distance where the IR radiation wave possesses an optical path going through several layers.

An interlayer dielectric (ILD) layer 269 is disposed on the substrate in the CMOS and MEMS region, covering the CMOS and MEMS components. The ILD layer, for example, is a silicon oxide layer. Other types of ILD layers or a combination of dielectric layers may also be useful.

Metal contacts 266 are disposed in the ILD layer for contacting the segments of the MEMS sensors in the MEMS regions. The contacts may be formed by etching trench openings in the dielectric layer and lining them with a metal layer. The metal layer is patterned to form the contacts. A dielectric liner, such as silicon oxide, may be disposed over the metal contacts in the MEMS region. The dielectric liner fills the trench openings over the contacts and lines the ILD layer over CMOS and MEMS region.

Conductive contact plugs, such as tungsten plugs are provided in the ILD layer and are coupled to contact regions on the substrate and MOS components. For example, contact plugs are coupled to S/D regions and gates of the CMOS components as well as to well taps for biasing the wells and substrate. The contact plugs are also coupled to contact regions of MEMS components in the MEMS region, such as through first and second thermopile terminals of a line structure. Providing contact plugs for other types of contact regions may also be useful. The contact plugs, for example, are formed by a damascene process. The dielectric liner serves protect the metal contacts while forming the contact plugs in the CMOS region. The dielectric liner, for example, may be considered part of the ILD layer. For example, the ILD layer may be a lower portion of the ILD layer while the liner may be an upper portion of the ILD layer.

A back-end-of-line (BEOL) dielectric 270 is provided on the substrate over the ILD layer. For example, the BEOL dielectic covers the CMOS and MEMS regions. The BEOL dielectric includes a plurality of intermetal dielectric (IMD) levels 271 formed by BEOL dielectric layers. An IMD level includes a via dielectric level 272 and a metal dielectric level 276. A via dielectric level and a metal dielectric level of an IMD level may be formed of one or more dielectric layers, depending on the design and process approach. The via dielectric level 272 may be disposed below a metal dielectric level 276. The metal dielectric level includes metal lines 277 and the via dielectric level includes via contacts 273. Providing a metal level dielectric level below a via dielectric level may also be useful. As shown, a first metal level dielectric is disposed over the ILD layer. Other configurations of BEOL dielectric layers may also be useful.

The metal lines and via contacts may be formed using damascene techniques, such as a single or a dual damascene process. In the case of a single damascene process, the contacts and metal lines are formed in separate processes. In the case of a dual damascene process, the metal lines and contacts are formed in the same process. In some embodiments, an IMD level may be formed by a combination of damascene and a reactive-ion etching (RIE) process. For example, metal lines may be formed by an RIE process while the contacts are formed by a single damascene process. In the case of an RIE process, a metal layer is formed and patterned by RIE using an etch mask to form the metal lines. It is understood that the different IMD levels of the BEOL dielectric may be formed using different techniques or combination of techniques or processes. For example, the first IMD level may form contacts using a damascene process and metal lines using an RIE process, intermediate IMD levels may be formed using a dual damascene process, while the pad level forms contacts and pads by overfilling damascene openings with metal and patterning the excess metal to form pads. Alternatively, the IMD levels may be formed by a combination of damascene and RIE processes. Other configurations of forming the IMD levels may also be useful.

As for the top metal level of the BEOL dielectric, it may serve as a pad level with pad metal lines. The pad lines may be formed by a damascene or an RIE process. A passivation layer is formed over the pad lines. Pad openings are formed in the passivation layer to pads of the pad lines. Other approaches for forming the pad level may also be useful.

The ILD and IMD levels may be planarized to form a planar top surface over the CMOS region and the MEMS region. For example, CMP is performed on the substrate. Providing any other planarization techniques such as spin-on-glass (SOG) to fill the gaps or planarize the surface of the substrate may also be useful. The overall thickness of the ILD and IMD levels over the structure may be from 100-400 nm. Providing any other thicknesses for the IMD levels over the structure to define the depth of the vias for subsequent standard CMOS process may also be useful.

A passivation layer 278 is disposed above the top metal level. The passivation layer may be a silicon nitride layer. Other types of passivation layers may be used. For example, the passivation layer may be a passivation stack having multiple passivation layers, such as a combination of silicon oxide and silicon nitride layers. The top metal level of the top IMD level serves as a pad level. Bond openings 279 are provided in the periphery of a cap to expose the bond pads 275 below. The bond pads provide external access to the internal components of the device. For example, input, output and power signals may be provided via the bond pads. Bond pads are provided in the periphery of the device. As shown, bond pads are provided on one side of the device which is the opposite side of the sensor region. Bond pads may also be provided on one or more of the other sides of the device.

As shown, the BEOL layers include metal layers M1, M2 and M3. The metal layer M1 is the bottom metal layer and the metal layer M3 is the top metal layer. Providing other numbers of metal layers may also be useful. The number of metal layers may depend on the CMOS process employed. Typically, the contacts of the ILD level are formed using a single damascene process. For example, contacts are formed to couple to various terminals of the components. The contacts may contact S/D regions of the transistors, well contacts and terminals of the sensor. The first metal level of the first IMD level may be formed using a single damascene or an RIE process. As for the contacts of the next via level and metal lines of the next metal level, they may be formed by a dual damascene process. The top contact level may be formed by a single damascene process and the top metal level may be formed by an RIE process. In some cases, the top metal may be formed by overfilling the via openings and patterning the excess metal to form the top metal line and bond pads. Other configurations of processes for forming the various contacts and metal lines of the IMD levels may also be useful.

As shown, the BEOL dielectric material in a MEMS region is removed, creating an opening 265 to expose the sensor. The opening, for example, forms a BEOL cavity. The BEOL cavity serves as a lower portion of an upper device cavity in the MEMS device region. In the case where multiple MEMS device regions are provided, multiple BEOL cavities are created. The BEOL dielectric between MEMS device regions separates the BEOL cavities. A BEOL cavity may be a rectangular-shaped cavity.

As shown, a BEOL cavity includes vertical sidewalls. Providing BEOL cavities with non-vertical sidewalls may also be useful. For example, a BEOL cavity includes a tapered stepped shape, as described in U.S. Ser. No. 16/517, 653 and U.S. Ser. No. 10,403,674, which are already herein incorporated by reference for all purposes. The tapered stepped shape tapers from top inwardly to the bottom, resulting in the top part of the BEOL cavity being larger than the bottom part of the BEOL opening. The shape of the stepped cavity can be defined by using the various metal layers having patterned metal lines which serve as etch masks to define the shape of the BEOL cavity. In addition, one of the metal layers may also be used to serve as an etch hardmask for the etch process to pattern line structure from the membrane. The metal layer which serves as a line structure etch hardmask may be M1. Other metal layers may also be useful. For example, in the case M1 is used to form the metal contact of the line structure, M2 may be employed to serve as the etch hardmask. The portion of the metal layer used as the etch hardmask is removed after the etch process.

A cap 280 is disposed on the substrate, encapsulating the MEMS region 206. In one embodiment, the cap is a CMOS compatible cap. For example, the cap is formed using layers compatible with CMOS processes. The cap includes, in one embodiment, IR transparent layers. The IR transparent layers may be configured for a specific application. For example, IR transparent layers for thermal imaging may be configured to be transparent to IR wavelengths in the range of about 8-12 um. Providing IR transparent layers which are transparent to IR or light in other wavelength ranges may also be useful, depending on the application. In one embodiment, the cap includes a seal cap which encapsulates the MEMS region and covers the CMOS region. In one embodiment, the cap hermetically seals the MEMS device region, providing a vacuum therein.

In one embodiment, the MEMS device region of the cap is elevated, creating an upper portion of the upper device cavity. For example, the cap in the MEMS region includes an outer bearing wall 287 which surrounds the MEMS region. In the case where the MEMS region includes multiple MEMS device regions, inner bearing walls 288 are provided for separating adjacent device regions. The external bearing wall is disposed on the BEOL dielectric surrounding the MEMS region while the inner bearing walls are disposed on the BEOL dielectric between adjacent MEMS device regions. In one embodiment, the cap is configured to hermetically seal each MEMS device region individually. For example, a MEMS device region is hermetically sealed by the cap to form a micro-casing, which includes a MEMS device 250, such as an IR sensor, on a membrane 243 separating lower and upper device cavities 260 and 265.

As shown in FIG. 2a, the bottom surface of the cap above a MEMS device region is planar. The planar bottom surface is due to planarization of the sacrificial layer, such as by chemical mechanical polishing (CMP), which fills the upper device cavity. For example, the planarized sacrificial layer creates a planar top for the upper device cavity 265. Alternatively, the bottom surface of the cap above a MEMS device region may be non-planar, as shown in FIG. 2b. For example, the cap includes a depression 286, creating a topography in the bottom surface of the cap above the MEMS device region. The non-planar bottom surface is due to forming the cap over a non-planarized sacrificial layer which fills the upper device cavity.

In one embodiment, a getter layer 296 is disposed on the inner bottom surface of the first layer of the cap structure. The getter absorbs moisture and outgassing within the encapsulated device. The getter layer, for example, may be titanium (Ti), iron, (Fe), nickel (Ni), vanadium (V), cobalt (Co), aluminum (Al), barium (Ba), zirconium (Zr), magnesium (Mg). Alternatively, a 2-layer metal film stack, such as Ti/Ni, may be provided for the getter layer. Other types of getter materials, such as rare earth elements, including cerium (Ce), lanthanum (La), thorium (Th) or Uranium (U), may also be useful. The getter layer facilitates in maintaining the integrity of the vacuum in the cavity, improving reliability. The getter layer, for example, is non-IR transparent. As such, the getter layer is patterned to allow IR to penetrate through the cap to the IR sensor. For example, the getter layer may be patterned to only cover the bottom of the cap in the periphery of the MEMs device region without blocking IR through to the IR sensor 250. As shown, the getter layer may be disposed on sides of the bearing walls (inner and outer) as well as the depression in the cap (as shown in FIG. 2b).

In one embodiment, the MEMS region may include one or more blind pixels along with the one or more active pixels in IR sensing applications. A blind pixel, for example, is used for calibration purposes. The blind pixel, for example, may be created by leaving the getter layer unpatterned, preventing transmission of IR to the sensor. To further ensure no transmission of IR to the sensor, a reflective metal layer, such as Al, can be provided over the cap above blind pixel device region. In one embodiment, the blind pixels may be disposed at the boundary of the active pixel or pixel array. For example, the MEMS region may include active device regions with unblinded pixels and inactive device regions with blinded pixels at the boundary of the active device regions. The inactive device region may include a single blind pixel or a line array of blind pixels.

As discussed, the cap is an IR transparent cap. For example, in a thermal imaging device, the cap is configured to transmit IR radiation within the wavelength of about 8-12 µm. The cap is a CMOS process compatible cap. In one embodiment, the cap includes various IR transparent CMOS compatible layers. Depending on the type of device or application, the cap layers can be configured to be transparent to light having other wavelengths or wavelength ranges. Infrared transparent layers may include, for example, silicon (Si), such as amorphous silicon (αSi) and silicon oxide (SiO$_2$). Other types of IR transparent layers, including non-silicon containing layers, may also be useful. For example, IR transparent layers such as polysilicon (pSi), germanium (Ge), silicon-germanium (SiGe) or zinc sulfide (ZnS), Magnesium fluoride (MgF$_2$), Calcium fluoride (CaF$_2$), Zirconium dioxide (ZrO$_2$), Zinc selenide (ZnSe), Cadmium telluride (CdTe), Gallium arsenide (GaAs) or a combination thereof may also be used.

In one embodiment, the cap includes a lower or base cap 281 and an upper or seal cap 284. The base cap and seal cap each may include one or more IR transparent layers. Alternatively, the seal cap may be configured with a non-IR transparent layer or a combination of IR transparent and non-IR transparent layers. In the case the seal cap includes a non-IR transparent layer, it is patterned so it doesn't prevent IR being transmitted to the sensors. The IR transparent layers may be different for the different caps or the same. Various configurations of the cap can be employed. The cap is configured to provide sufficient mechanical strength to maintain the hermetic seal of the device. For example, the cap can withstand stress, whether external or internal, so as to maintain the hermetic seal of the device.

In one embodiment, the cap is configured such that the base cap includes at least one IR transparent layer and the seal cap includes at least one IR transparent layer. Both the base cap and seal cap can be configured with more than one IR transparent layer. Alternatively, the seal cap may also be configured to include a non-IR transparent layer or a combination of a non-IR transparent layer and one or more IR transparent layer. Other configurations of the base cap and seal cap may also be useful. The base cap includes release openings 285, enabling release etchant to pass through to remove sacrificial layers of the lower and upper device cavities. The seal cap seals the release openings after the release etch process. In one embodiment, the release openings are sufficiently small to prevent the sealing material from landing on top of the BEOL layers stack during deposition.

In one embodiment, the cap includes seven layers, five layers for the base cap and two layers for the seal cap. Other configurations of the cap may also be useful. In one embodiment, the IR layers of the base cap are alternating layers and the IR layers of the seal cap are alternating IR layers. In one embodiment, the top layer of the base cap and the bottom layer of the seal cap are different. Other configurations of layers of the base cap and seal cap may also be useful.

As for the five alternating IR layers of the base cap, the bottom and top layers are configured to be etch resistant to the etchant used to remove the sacrificial layers of the lower and upper device cavities. In the case wherein the sacrificial layers of the cavities are αSi, the bottom and top layers may be SiO$_2$ layers. This forms an alternating SiO$_2$/αSi layered stack with the top and bottom layers being SiO$_2$. For example, this forms a SiO$_2$/αSi/SiO$_2$/αSi/SiO$_2$ base cap stack.

In one embodiment, the layers of the base cap except for the top base cap layers 284 are local MEMS region layers while the top cap layer is a global device layer. Other configurations of the base cap layers and the seal cap layers may also be useful. Providing base cap layers which are local to the MEMS region except for the top base cap layer reduces the overall thickness of the cap outside of the MEMS region, facilitating faster formation of bond openings while maintaining overall mechanical stability of the cap. In addition, the fifth layer, which is global, lines the sidewalls of the release openings in the other layers of the base cap, serving as a protective layer from the release etchants during the etch process. For example, the top base layer is etch resistant to the etchant used to remove the sacrificial layers of the cavities.

As for the seal cap, in one embodiment, it includes two seal cap IR transparent layers. For example, the bottom seal cap layer is αSi while the top seal cap layer is $SiO_2$, forming a $αSi/SiO_2$ seal cap stack. This forms a cap with a $SiO_2/αSi/SiO_2/αSi/SiO_2/αSi/SiO_2$ cap stack. The seal cap creates hermetically sealed individual MEMS device regions. In one embodiment, the cap stack is configured to provide high or optimum IR transparency while maintaining mechanical stability.

As discussed, the thickness of the various layers of the cap is selected to provide IR transparency and mechanical stability. In one embodiment, the cap stack includes the following sequence of layers and thicknesses:

| | | |
|---|---|---|
| $1^{st}$ layer: | $SiO_2$ | 400 nm |
| $2^{nd}$ layer: | α-Si | 200 nm |
| $3^{rd}$ layer: | $SiO_2$ | 500 nm |
| $4^{th}$ layer: | α-Si | 900 nm |
| $5^{th}$ layer: | $SiO_2$ | 500 nm |
| $6^{th}$ layer: | α-Si: | 200 nm |
| $7^{th}$ layer: | $SiO_2$ | 400 nm |

Other configurations of the cap stack may also be useful. For example, the cap stack may include other numbers of layers, thicknesses as well as types of IR transparent layers.

The layers forming the cap structure, in one embodiment, may have uniform or different thickness. In one embodiment, the cap structure comprises seven layers of alternating amorphous silicon and dielectric materials and the materials are deposited in the following sequence starting with the bottom first level: 400 nm silicon oxide/200 nm α-Si/500 nm silicon oxide/900 nm α-Si/500 nm silicon oxide/200 nm α-Si/400 nm silicon oxide. This provides the cap structure with a total thickness of 3.10 μm, thereby allowing an endurance of maximum film stress of 25.4 MPa. The height of the cap structure enables a maximum downward deflection of about 3.35 nm, thereby achieving more than 90% transmission of the IR wavelength between 8-12 μm.

The BEOL dielectric facilitates defining the micro-casing which forms the cavities of the MEMS device regions. In addition, the BEOL dielectric provides additional mechanical strength to the IR transparent cap by avoiding high aspect ratio etching. Furthermore, the extended upper cavity due to the cap and the BEOL dielectric enhances long-term vacuum stability of the MEMS device or pixel regions.

Bond openings 279 are provided in the periphery of a cap structure to expose the bond pads 275 below. The bond pads provide external access to the internal components of the device. For example, input, output and power signals may be provided via the bond pads. Bond pads are provided in the periphery of the device. As shown, bond openings and bond pads are provided on one side of the device which is the opposite side of the sensor region, but they may also be provided on one or more of the other sides of the device, for example, the CMOS region surrounding the MEMS region. Other configurations may also be useful. For example, bond pads can be provided on 1 side, 2 sides or 3 sides of the device.

Figure 3A:
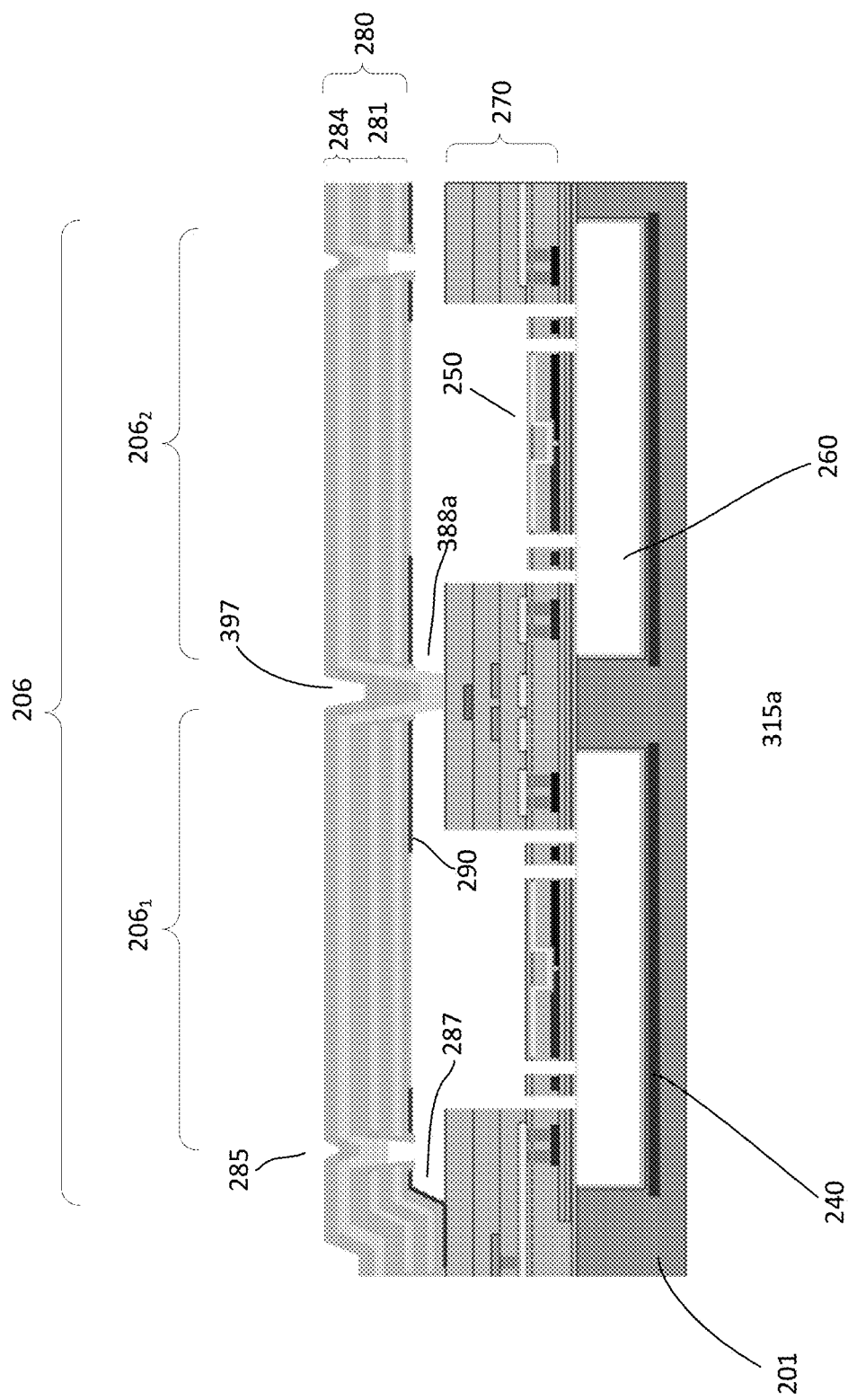
FIGS. 3a-b show simplified cross-sectional views of alternative embodiments for internal bearing walls of CMOS in-situ caps in different numbers in the sensor region.
Figure 3B:
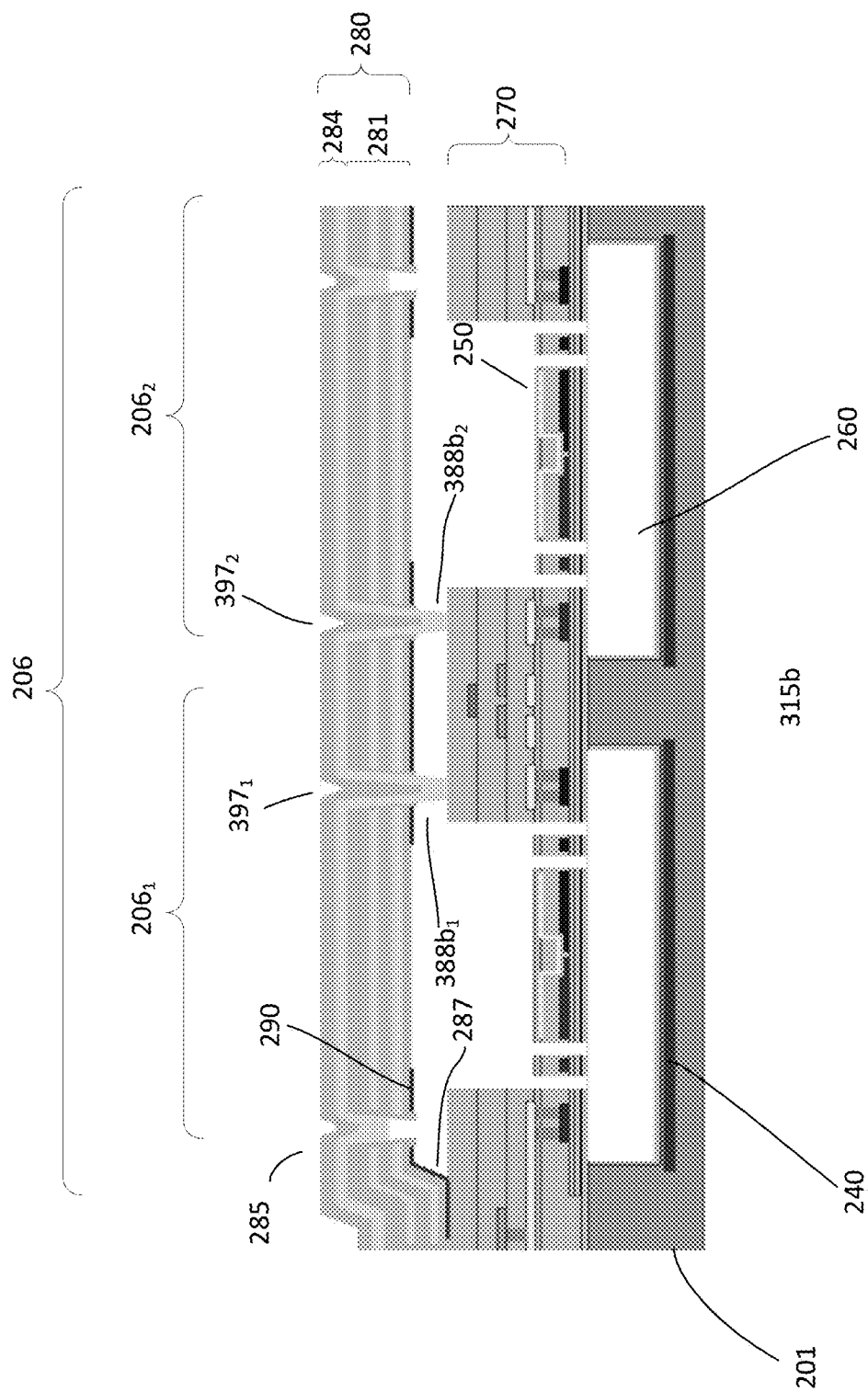

FIGS. 3*a*-*b* show simplified cross-sectional views of a portion of other embodiments of a device. Referring to FIG. 3*a*, a portion of a device 315*a* is shown. The portion illustrates the MEMS region 206 of the device. The portion of the device includes common elements as those described in FIGS. 2*a*-*b*. Common elements may not be described or described in detail.

The MEMS region, for example, includes MEMS device regions $206_{1-2}$. A cap 280 is disposed on the BEOL dielectric of the device, covering the CMOS region and creating hermetically sealed micro-casings for the MEMS device regions. The cap, as shown, is an IR cap which includes a base cap 281 and a seal cap 284. The base cap includes at least one IR transparent layer and the seal cap includes at least one IR transparent layer. In one embodiment, the base cap includes 5 alternating $SiO_2/αSi$ layers which form a $SiO_2/αSi/SiO_2/αSi/SiO_2$ base cap stack. As for the seal cap, it includes two alternating $αSi/SiO_2$ layers which form a seal cap stack. The base cap stack and alternative seal cap stack form a $SiO_2/αSi/SiO_2/αSi/SiO_2/αSi/SiO_2$ cap stack. In one embodiment, the cap stack includes the following sequence of layers and thicknesses:

| | | |
|---|---|---|
| $1^{st}$ layer: | $SiO_2$ | 400 nm |
| $2^{nd}$ layer: | α-Si | 200 nm |
| $3^{rd}$ layer: | $SiO_2$ | 500 nm |
| $4^{th}$ layer: | α-Si | 900 nm |
| $5^{th}$ layer: | $SiO_2$ | 500 nm |
| $6^{th}$ layer: | α-Si: | 200 nm |
| $7^{th}$ layer: | $SiO_2$ | 400 nm |

Other configurations of the cap stack, other numbers of layers, thicknesses as well as alternative types of IR transparent layers may also be useful.

As shown, the base cap includes first and second release openings 285 and 397. The first release openings 285 are configured so that the layers of the seal cap does not penetrate through into the upper cavities while the second release openings are configured to be aligned with the BEOL separating the MEMS device regions. Furthermore, the dimensions of the second release openings are configured to allow the seal cap layers to penetrate through and rest on the BEOL dielectric, serving as the inner bearing wall 388*a*. For example, the dimensions of the first release openings are narrower than the dimensions of the second release openings. As shown, an inner bearing wall separating two adjacent device regions is formed by one enlarged second release opening.

Referring to FIG. 3*b*, a portion of another embodiment of a device 315*b* is shown. The portion illustrates the MEMS region 206 of the device. The portion of the device includes common elements as those described in FIGS. 2*a*-*b* and FIG. 3*a*. Common elements may not be described or described in detail.

The MEMS region, for example, includes MEMS device regions $206_{1-2}$. A cap 280 is disposed on the BEOL dielectric of the device, covering the CMOS region and creating hermetically sealed micro-casings for the MEMS device regions. The cap, as shown is an IR cap which includes a base cap and a seal cap, each with one or more IR transparent layers. As shown, the base cap includes 5 alternating SiO$_2$/αSi layers which form a SiO$_2$/αSi/SiO$_2$/αSi/SiO$_2$ base cap stack while the seal cap includes two alternating αSi/SiO$_2$ layers, forming a SiO$_2$/αSi/SiO$_2$/αSi/SiO$_2$/αSi/SiO$_2$ cap stack.

Similar to FIG. 3a, the base cap includes first and second release openings 285 and 397. The first release openings 285 are configured so that the layers of the seal cap do not penetrate through and into the upper cavities while the second release openings are configured to be aligned with the BEOL separating the MEMS device regions. Furthermore, the dimensions of the second release openings are configured to allow the seal cap layers to penetrate through and rest on the BEOL dielectric, serving as the inner bearing wall. For example, the dimensions of the first release openings are narrower than the dimensions of the second release openings.

In one embodiment, a plurality of second release openings is provided to form a plurality of bearing walls between two adjacent device regions. For example, first and second openings 397$_{1-2}$ are provided to form first and second inner bearing walls 388$b_{1-2}$ between two adjacent device regions. Providing other numbers of inner bearing walls between adjacent device regions is also useful.

Figure 4A:
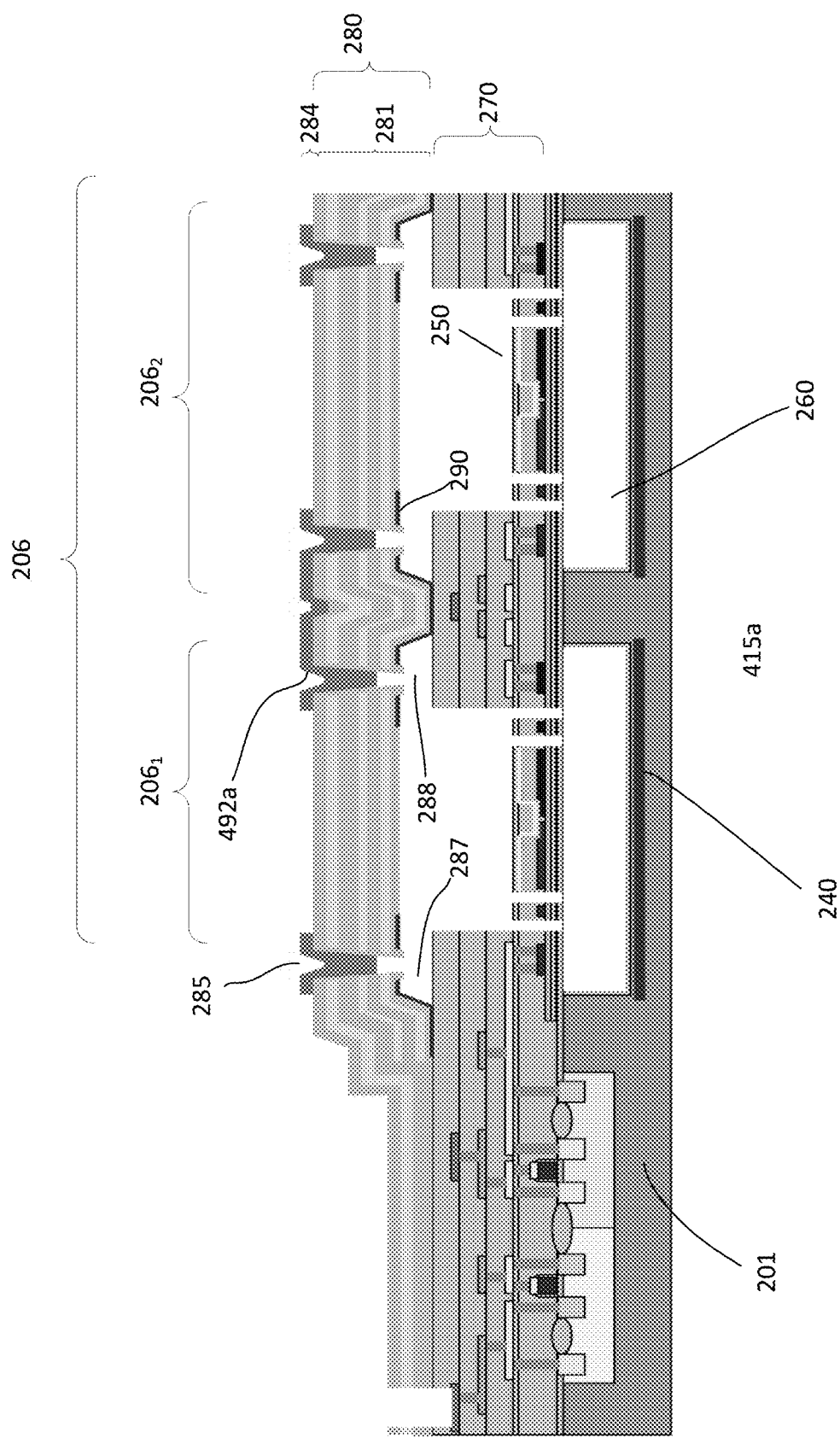
FIGS. 4a-b show simplified cross-sectional views of alternative embodiments for sealing caps of CMOS in-situ caps in the sensor region.
Figure 4B:
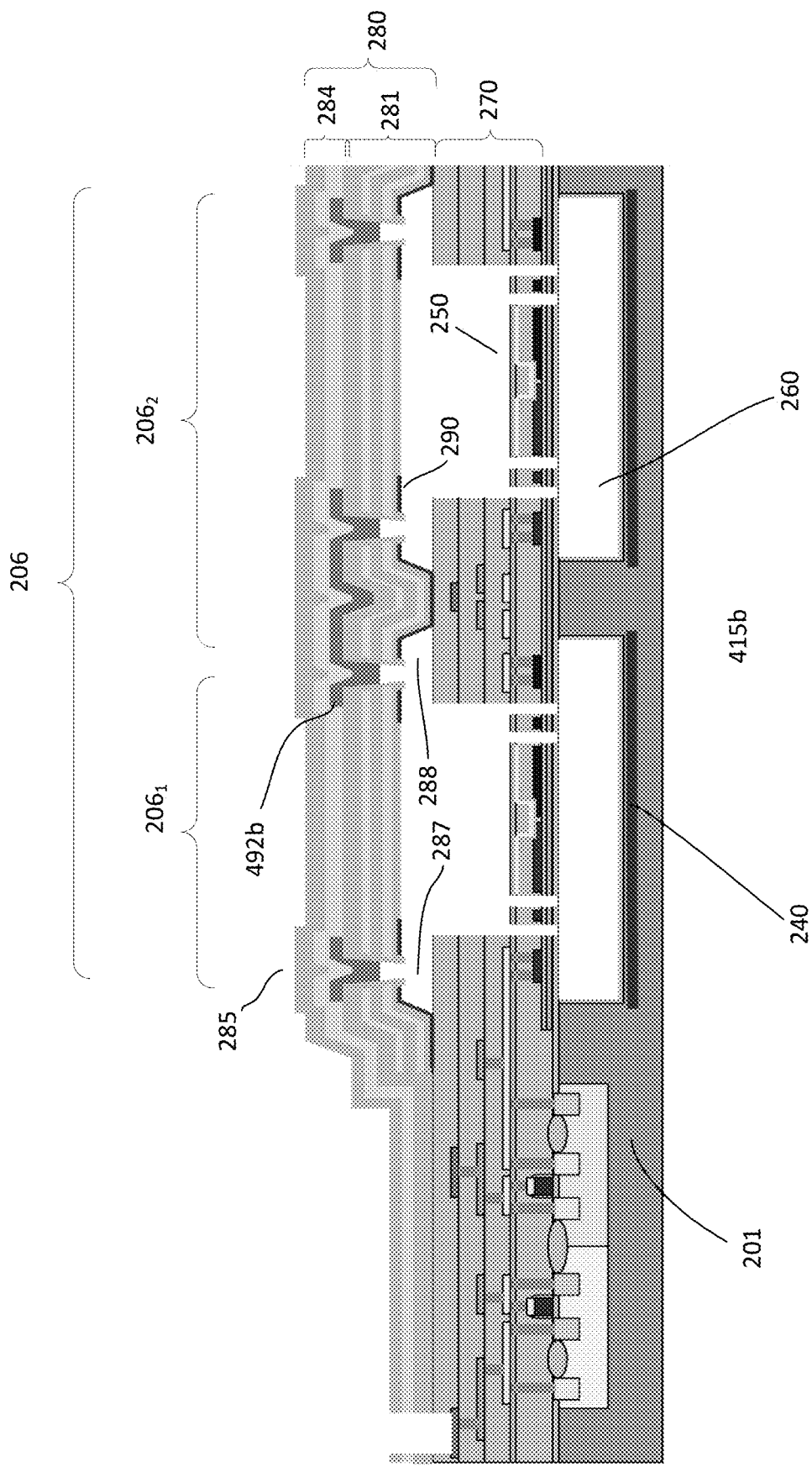

FIGS. 4a-b show simplified cross-sectional views of a portion of other embodiments of a device. Referring to FIG. 4a, a portion of a device 415a is shown. The portion illustrates the MEMS region 206 of the device. The portion of the device includes common elements as those described in FIGS. 2a-b and 3a-b. Common elements may not be described or described in detail.

The MEMS region, for example, includes MEMS device regions 206$_{1-2}$. A cap 280 is disposed on the BEOL dielectric of the device, covering the CMOS region and creating hermetically sealed micro-casings for the MEMS device regions. The cap, as shown is an IR cap which includes a base cap 281 and a seal cap 284. The base cap, for example, includes at least one IR layer. In one embodiment, the base cap includes alternating IR transparent layers, such as SiO$_2$/αSi layers. Other types of IR transparent layers may also be useful. In one embodiment, the base cap includes seven alternating SiO$_2$/αSi layers forming a SiO$_2$/αSi/SiO$_2$/αSi/SiO$_2$/αSi/SiO$_2$ base cap stack. As shown, the base cap includes a lower base cap which includes 4 alternating SiO$_2$/αSi layers and an upper base cap which includes 3 alternating SiO$_2$/αSi layers. The lower base cap layers are local MEMS region layers while the upper base cap includes global device layers which cover both the MEMS and CMOS regions. The base cap includes release openings 285.

As for the seal cap, it includes a patterned non-transparent seal cap layer 492a. The patterned non-transparent seal cap layer, for example, includes a patterned metal layer which forms metal studs to seal the release openings. The metal layer, for example, may be Al. Other types of metal layers may also be useful. Since the metal layer deposition process, such as sputtering or evaporation, is carried out in extreme vacuum levels, vacuum micro-casings are formed.

Referring to FIG. 4b, a portion of another embodiment of a device 415b is shown. The portion illustrates the MEMS region 206 of the device. The portion of the device includes common elements as those described in FIGS. 2a-b, FIGS. 3a-b and FIG. 4a. Common elements may not be described or described in detail.

The MEMS region, for example, includes MEMS device regions 206$_{1-2}$. A cap 280 is disposed on the BEOL dielectric of the device, covering the CMOS region and creating hermetically sealed micro-casings for the MEMS device regions. The cap, as shown is an IR cap which includes a base cap 281 and a seal cap 284.

The base cap includes at least one IR layer. In one embodiment, the base cap includes alternating IR transparent layers, such as SiO$_2$/αSi layers. Other types of IR transparent layers may also be useful. In one embodiment, the base cap includes five alternating SiO$_2$/αSi layers forming a SiO$_2$/αSi/SiO$_2$/αSi/SiO$_2$ base cap stack. The base cap includes release openings 285.

As for the seal cap, it includes a lower seal cap and an upper seal cap. The lower seal cap, in one embodiment, includes a patterned non-transparent lower seal cap layer 492b. The patterned non-transparent seal cap layer, for example, includes a patterned metal layer which forms metal studs to seal the release openings. The metal layer, for example, may be Al. Other types of metal layers, such as gold (Au) or platinum (Pt) may also be useful.

The upper seal cap is disposed over the patterned metal layer of the lower seal cap and the base cap. The upper seal cap, in one embodiment, includes an αSi/SiO$_2$ stack. This produces a cap having a transparent base cap, a lower patterned seal cap and an upper transparent seal cap.

Figure 5A:
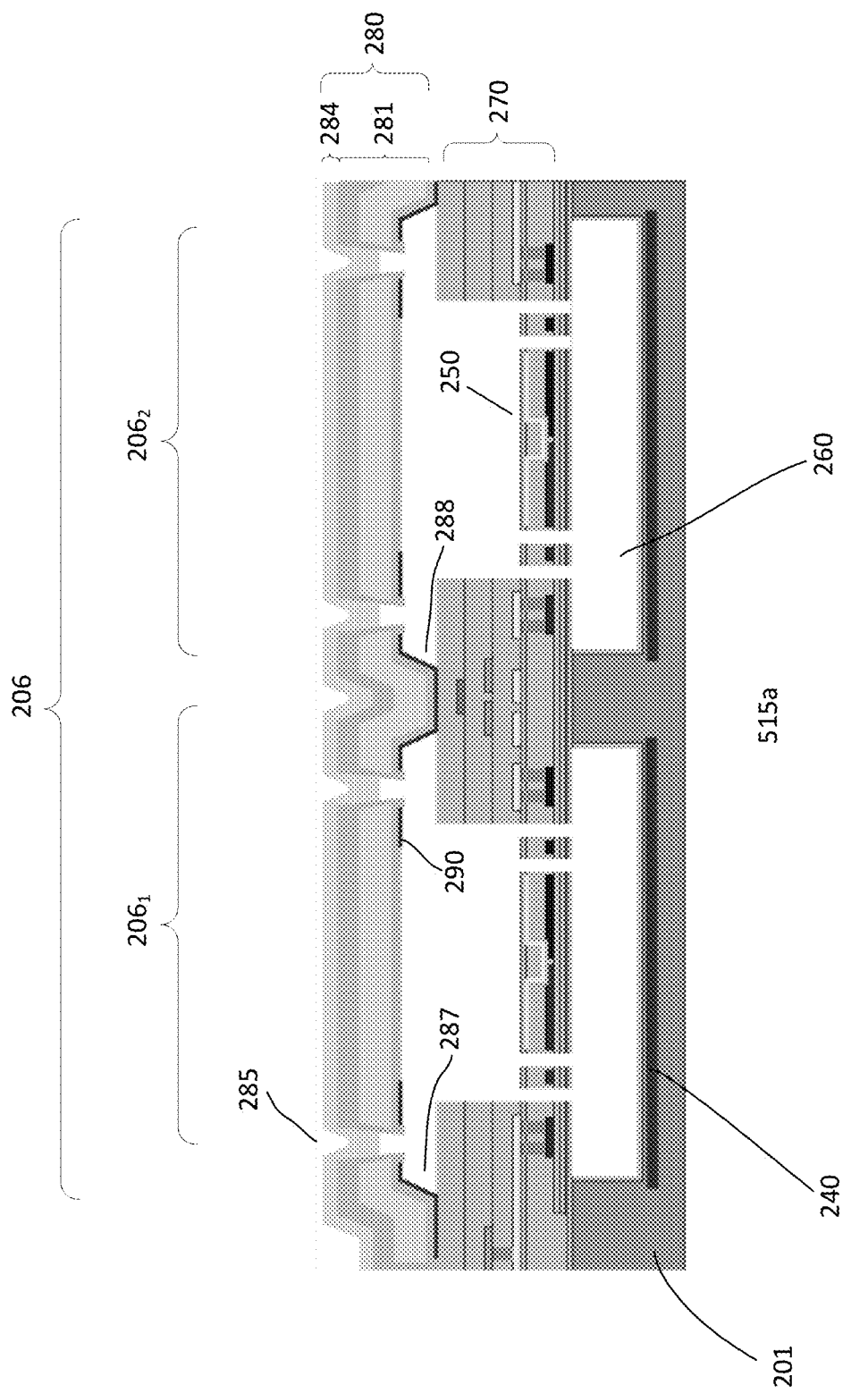
FIGS. 5a-d show simplified cross-sectional views of alternative embodiments of CMOS in-situ caps in the sensor region.

FIGS. 5a-d show simplified cross-sectional views of a portion of other embodiments with different cap configurations for a device. Referring to FIG. 5a, a portion of a device 515a is shown. The portion illustrates the MEMS region 206 of the device. The portion of the device includes common elements as those described in FIGS. 2a-b, FIGS. 3a-b, and FIGS. 4a-b. Common elements may not be described or described in detail.

The MEMS region, for example, includes MEMS device regions 206$_{1-2}$. A cap 280 is disposed on the BEOL dielectric of the device, covering the CMOS region and creating hermetically sealed micro-casings for the MEMS device regions. The cap, as shown, is an IR cap which includes a base cap 281 and a seal cap 284. In one embodiment, the base cap includes at least one IR layer. In one embodiment, the base cap includes alternating IR transparent layers, such as SiO$_2$/αSi layers. Other types of IR transparent layers may also be useful. In one embodiment, the base cap includes three alternating SiO$_2$/αSi layers forming a SiO$_2$/αSi/SiO$_2$ base cap stack. The base cap includes release openings 285. Due to a lesser number of layers than the cap described in FIGS. 2a-b, the thickness of the layers may be larger to maintain sufficient mechanical stability. The thickness of the layers should be selected to provide efficient IR transmission.

As for the seal cap, it includes one IR transparent layer. In one embodiment, the seal cap layer is different from the top base cap layer. In one embodiment, the seal cap layer is an αSi layer. For example, the αSi layer of the seal cap is disposed on the SiO$_2$ top base cap layer. The seal cap may have a thickness which is sufficient to fill the release openings as well as to maintain efficient IR transmission. A lesser number of layers allow for a simpler wafer fabrication process.

Figure 5B:
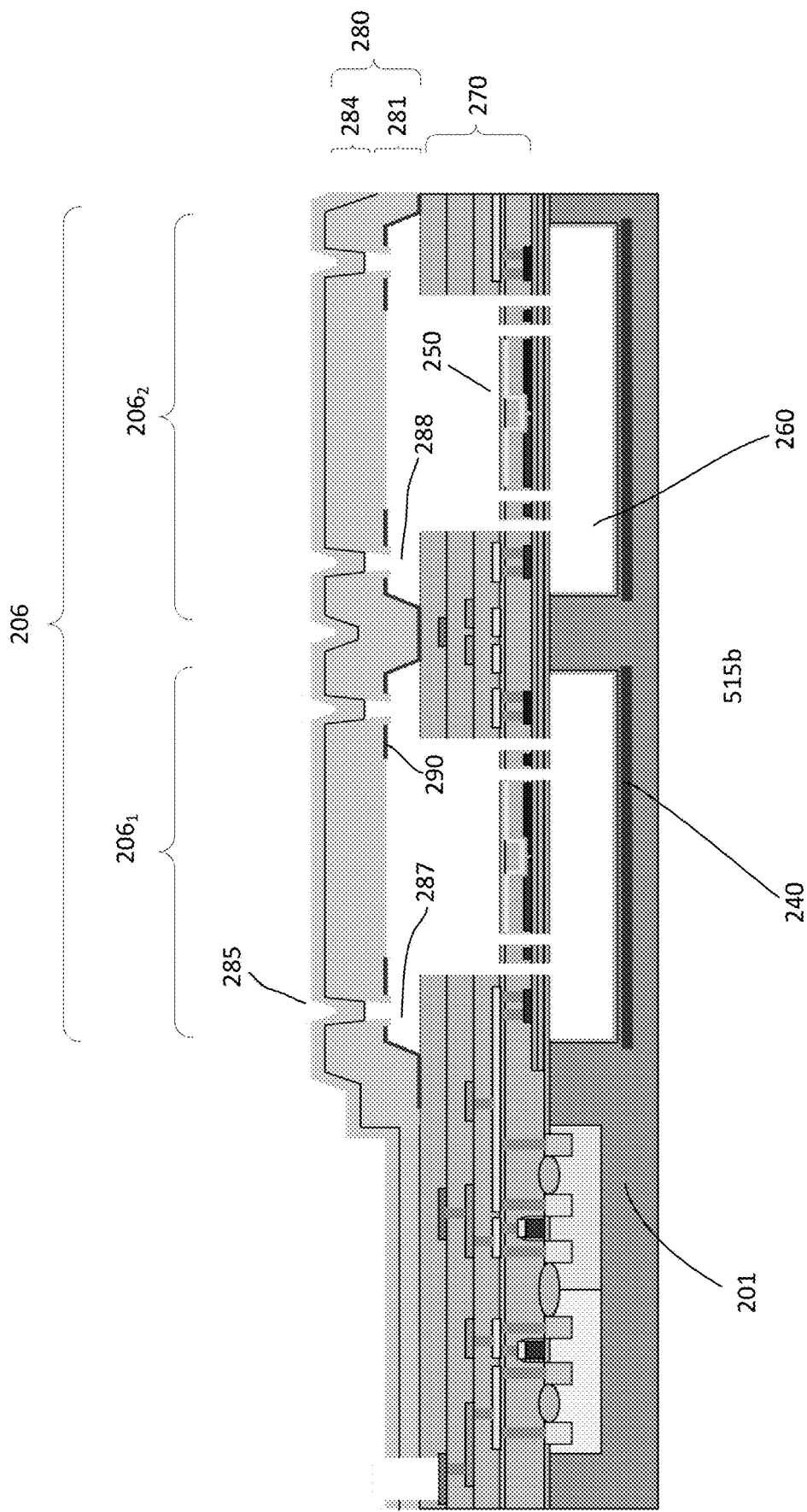

FIG. 5b shows a portion of another embodiment of a device 515b. The portion illustrates the MEMS region 206 of the device. The portion of the device includes common elements as those described in FIGS. 2a-b, FIGS. 3a-b, FIGS. 4a-b, and FIG. 5a. Common elements may not be described or described in detail.

The MEMS region, for example, includes MEMS device regions 206$_{1-2}$. A cap 280 is disposed on the BEOL dielectric of the device, covering the CMOS region and creating hermetically sealed micro-casings for the MEMS device regions. The cap, as shown is an IR cap which includes a base cap 281 and a seal cap 284. In one embodiment, the base cap includes at least one IR transparent layer. In one embodiment, the base cap includes one IR transparent layer. For example, the base cap includes a layer which is resistant to the etchant used to remove the sacrificial material during the release process. The IR transparent layer, for example, may be a zinc sulfide (ZnS), barium fluoride ($BaF_2$), magnesium fluoride ($MgF_2$) or a gallium arsenide (GaAs) layer. Other types of IR transparent layers which are resistant to the etchant used may also be useful. The base cap includes release openings 285. The thickness of the base cap is configured to maintain sufficient mechanical stability and also to provide efficient IR transmission. The thickness of the base cap may differ for different types of IR transparent layers. For example, the thickness of a base cap which includes a ZnS layer may be different from the thickness of a base cap which includes a $MgF_2$ layer.

As for the seal cap, it includes one IR transparent layer. In one embodiment, the seal cap layer is the same as the base cap layer. The seal cap layer may be a ZnS, $BaF_2$, $MgF_2$ or a GaAs layer. Other types of IR transparent layers which are resistant to the etchant used may also be useful. Providing other types of seal cap layers, including those which are different from the base cap, may also be useful. The seal cap may have a thickness which is sufficient to fill the release openings. The seal cap may have a thickness which is sufficient to fill the release openings as well as to maintain efficient IR transmission. A lesser number of layers allow for a simpler wafer fabrication process.

Figure 5C:
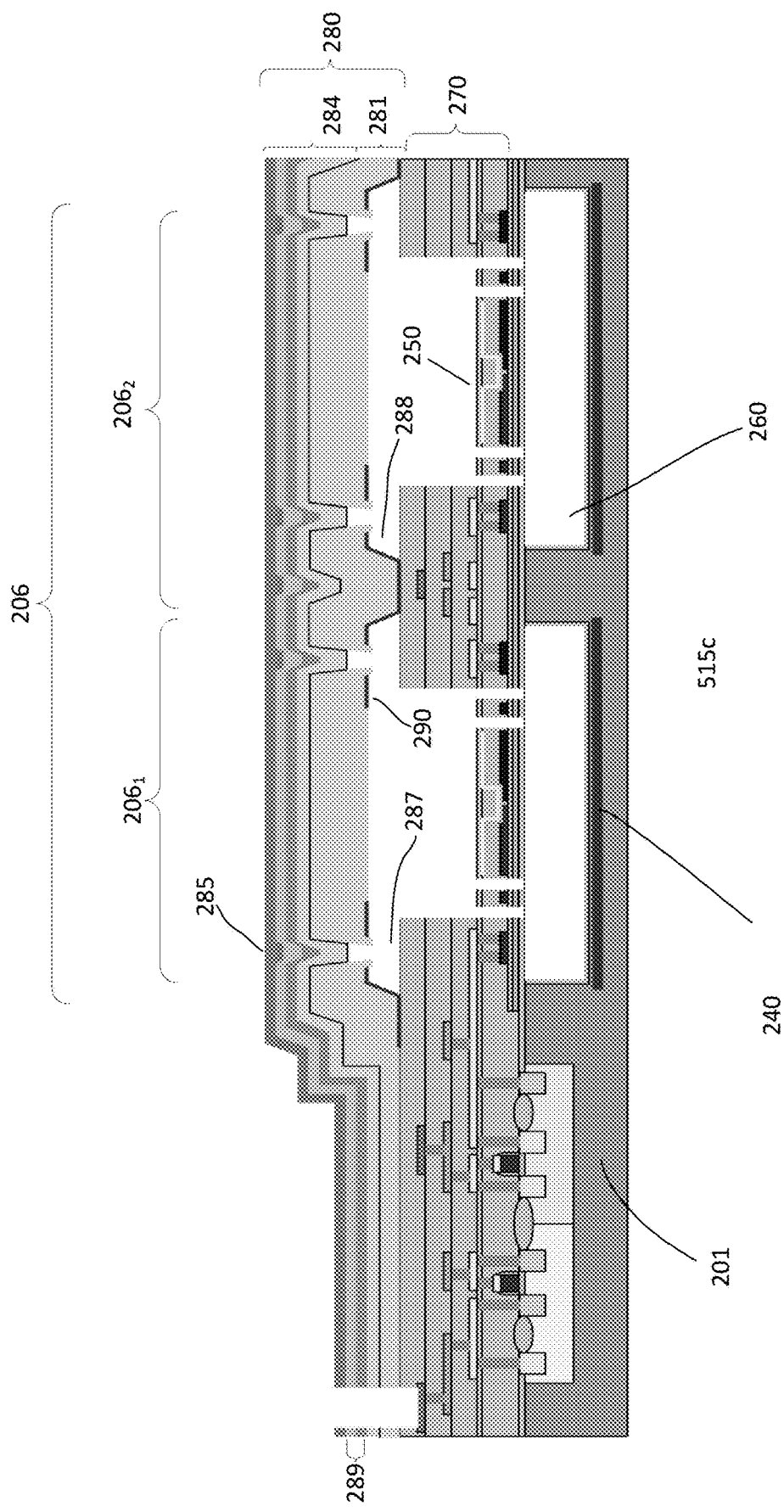

As for FIG. 5c, it shows a portion of yet another embodiment of a device 515c. The portion illustrates the MEMS region 206 of the device. The portion of the device includes common elements as those described in FIGS. 2a-b, FIGS. 3a-b, FIGS. 4a-b, and FIG. 5a-b. Common elements may not be described or described in detail.

The MEMS region, for example, includes MEMS device regions $206_{1-2}$. A cap 280 is disposed on the BEOL dielectric of the device, covering the CMOS region and creating hermetically sealed micro-casings for the MEMS device regions. The cap, as shown is an IR cap which includes a base cap 281 and a seal cap 284. The base cap includes at least one IR transparent layer. In one embodiment, similar to FIG. 5b, the base cap includes one IR transparent layer. For example, the base cap includes a layer which is resistant to the etchant used to remove the sacrificial material during the release process. The IR transparent layer can be a ZnS, $BaF_2$, $MgF_2$ or a GaAs layer. Other types of IR transparent layers which are resistant to the etchant used may also be useful. The base cap includes release openings 285. The thickness of the base cap is configured to maintain sufficient mechanical stability as well as to provide efficient IR transmission. The thickness of the base cap may differ for different types of IR transparent layers. For example, the thickness of a base cap which includes a ZnS layer may be different from the thickness of a base cap which includes a $MgF_2$ layer.

As for the seal cap, it includes lower and upper seal caps. In one embodiment, the lower seal cap includes one IR transparent layer. In one embodiment, the lower seal cap layer is the same as the base cap layer. The seal cap layer can be a ZnS, $BaF_2$, $MgF_2$ or a GaAs layer. Other types of IR transparent layers which are resistant to the etchant used may also be useful. Providing other types of seal cap layers, including those which are different from the base cap, may also be useful. The seal cap may have a thickness which is sufficient to fill the release openings as well as to maintain efficient IR transmission. A lesser number of layers allow for a simpler wafer fabrication process. The upper seal cap portion 289 includes an anti-reflective coating (ARC) stack. The ARC stack, for example, may be employed to minimize IR reflection from the cap. For example, after the pad openings are formed, the ARC stack may remain over the cap.

Figure 5D:
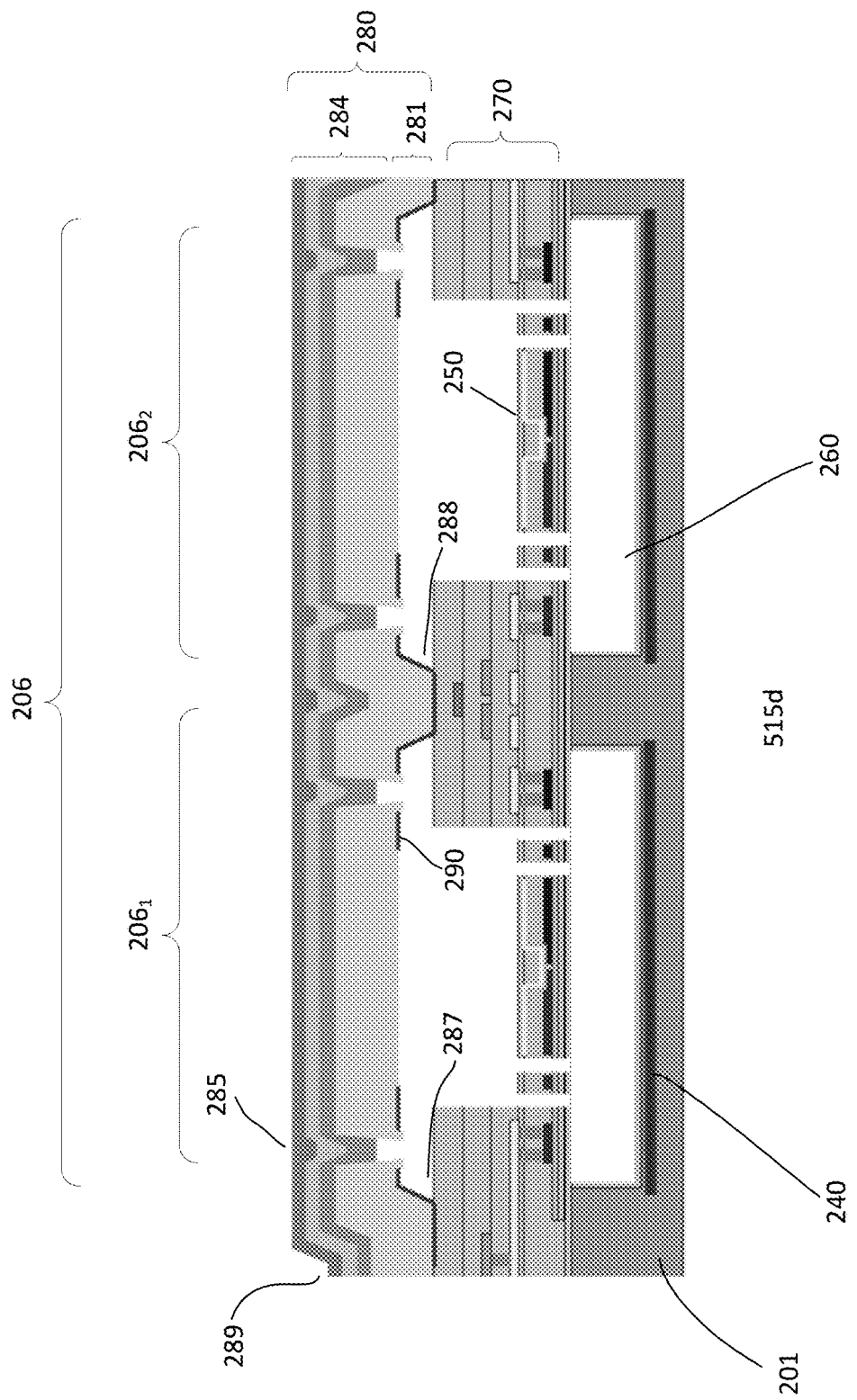

Regarding FIG. 5d, it shows a portion of another embodiment of a device 515d. The portion illustrates the MEMS region 206 of the device. The portion of the device includes common elements as those described in FIGS. 2a-b, FIGS. 3a-b, FIGS. 4a-b, and FIG. 5a-c. Common elements may not be described or described in detail.

The MEMS region, for example, includes MEMS device regions $206_{1-2}$. A cap 280 is disposed on the BEOL dielectric of the device, covering the CMOS region and creating hermetically sealed micro-casings for the MEMS device regions. The cap, as shown is an IR cap which includes a base cap 281 and a seal cap 284. The base cap includes at least one IR transparent layer. In one embodiment, similar to FIGS. 5b-c, the base cap includes one IR transparent layer. For example, the base cap includes a layer which is resistant to the etchant used to remove the sacrificial material during the release process. The IR transparent layer may be a ZnS, $BaF_2$, $MgF_2$ or a GaAs layer. Other types of IR transparent layers which are resistant to the etchant used may also be useful. The base cap includes release openings 285. The thickness of the base cap is selected to maintain sufficient mechanical stability and also to provide efficient IR transmission. The thickness of the base cap may differ for different types of IR transparent layers. For example, the thickness of a base cap which includes a ZnS layer is different from the thickness of a base cap which includes a $MgF_2$ layer.

As for the seal cap, it includes an ARC stack, which is IR transparent. The ARC stack, for example, may be employed to minimize IR reflection from the cap. For example, after the pad openings are formed, the ARC stack may remain over the cap.

As described in FIGS. 3a-b, the cap is provided with different configurations of inner bearing walls. For example, the inner bearing walls may be served by the seal cap. Providing inner bearing walls using the seal cap may be applied to the various embodiments described herein, such as those in FIGS. 2a-b, FIGS. 4a-b and FIGS. 5a-d.

As described in FIGS. 4a-b, the seal cap includes metal plugs formed from a patterned metal layer to seal the release openings. Providing metal plugs as a seal cap can be applied to the various embodiments described herein, such as those in FIGS. 2a-b, FIGS. 3a-b, and FIGS. 5a-d.

As described in FIGS. 5a-d, the cap includes different configurations, such as having different numbers of layers. For example, the base cap may be a single layer or multi-layer base cap and the seal cap can be a single layer or multi-layer seal cap. The various cap configurations of FIGS. 5a-d can be applied to the various embodiments described herein, such as those in FIGS. 2a-b, FIGS. 3a-b, and FIGS. 4a-b.

FIGS. 6a-d show exemplary simplified top views of bearing walls, getter and release opening patterns 600 of a MEMS region. The MEMS region is similar to those described previously. Common elements may not be described or described in detail.

Referring to FIG. 6a, a MEMS region 206 is shown. The MEMS region includes four MEMS device regions 207 arranged in a 2×2 matrix. For example, the matrix includes 2 rows of MEMS device regions in the y-direction and 2 columns of MEMS device regions in the x-direction. The MEMS region is encapsulated with a CMOS compatible cap, hermetically sealing it to create a vacuum. The cap includes an outer bearing wall 287 surrounding the MEMS region and inner bearing walls 288 in the x- and y-directions to separate the rows and columns of MEMS device regions. In one embodiment, the inner bearing walls and the outer bearing wall completely isolate the MEMS device regions, forming separate vacuum micro-casings for each pixel. In other embodiments, openings are provided in the inner bearing walls between micro-casings, creating a homogeneous vacuum level for the pixels across the array.

The base cap includes release openings 285. The openings are disposed in the periphery of the device region in which the MEMS IR sensor occupies. This avoids interference with the sensor. In one embodiment, the release openings are configured as elongated slots located on opposing sides of a device region along the column or y-direction. Other configurations of release openings may also be useful. For example, the release openings may be elongated slots along the row or x-direction. Alternatively, the release openings may be disposed along opposing x- and y-directions. Other configurations may include disposing the release openings in two adjacent sides of the device region or 3 sides of the device regions. As shown, a release opening is depicted as a continuous elongated slot. Providing a release opening which includes a plurality of discontinuous slots or release openings which include a combination of continuous elongated and discontinuous slots may also be useful.

Below the cap is a getter 290. The getter is configured to avoid, like the release openings, interfering with the IR reception of the sensor. As such, the getter is configured to surround the sensor region 650. In one embodiment, the getter surrounds all four sides of the sensor region. For example, the getter may be disposed on the bottom or inner surface of the cap, including the sides and bottoms of the outer and inner bearing walls, except for the release openings.

The pattern of the bearing walls can be defined by the pattern of the sacrificial layer above the BEOL over the device cavity. For example, the pattern of the sacrificial layer determines the configuration of the outer and inner bearing walls. The bearing walls may be defined by a recessed pattern in the sacrificial layer which surrounds the MEMS region (outer bearing wall) and within the MEMS region surrounding the MEMS device region (inner bearing walls) in the sacrificial layer pattern. The recessed pattern surrounding the MEMS region and MEMS device region may be continuous to form isolated micro-casings. In one embodiment, the recessed pattern surrounding the MEMS region is continuous while those defining the individual MEMS device region may be discontinuous.

Figure 6B:
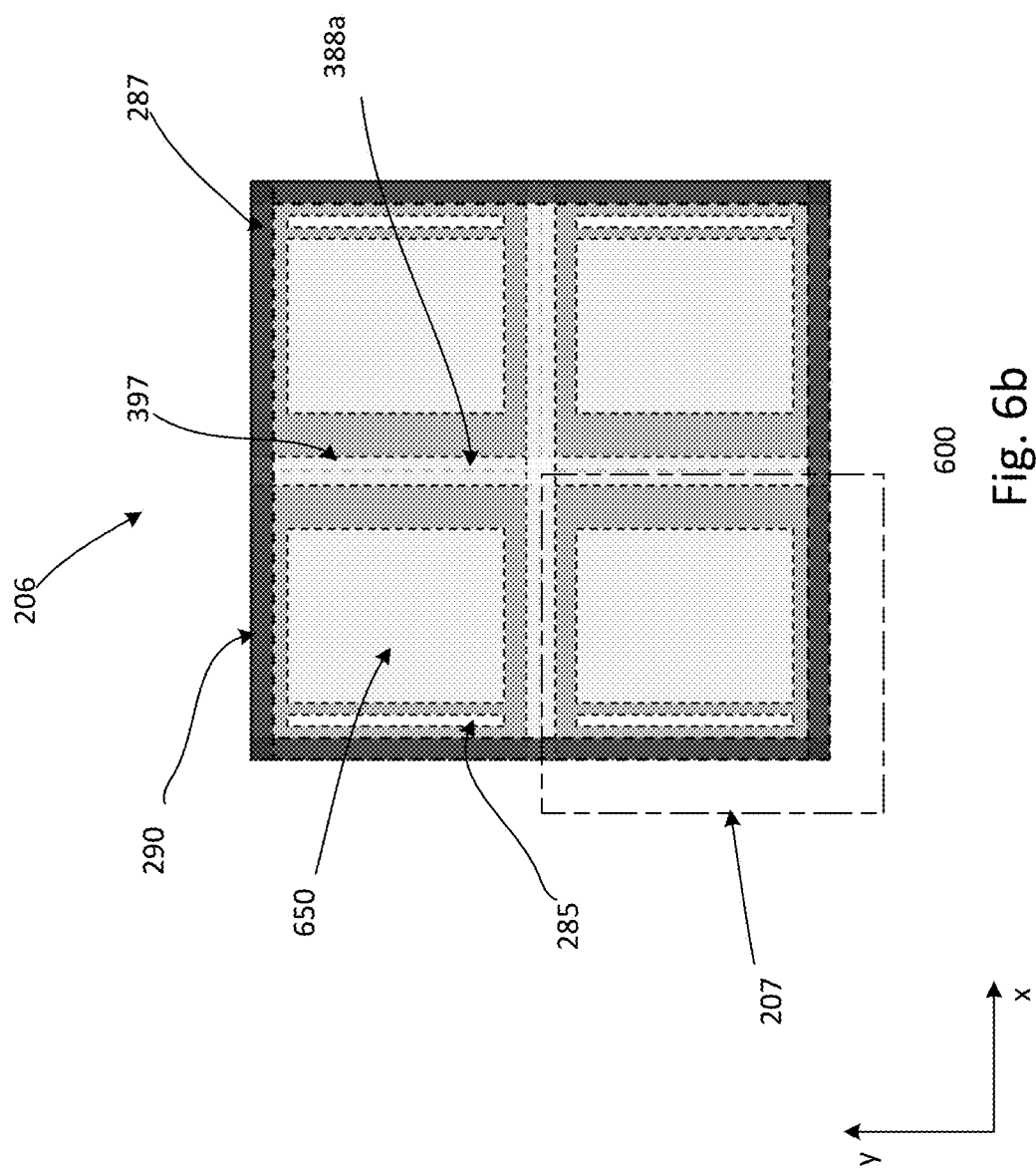

FIG. 6b shows another embodiment of a MEMS region 206. The MEMS region is similar to that described in FIG. 6a. Common elements may not be described or described in detail The MEMS region includes four MEMS device regions 207 arranged in a 2×2 matrix. The MEMS region is encapsulated with a CMOS compatible cap. The cap includes an outer bearing wall 287 surrounding the MEMS region and inner bearing walls 388a in the x- and y-directions to separate the rows and columns of MEMS device regions. In one embodiment, the inner bearing walls and the outer bearing wall completely isolate the MEMS device regions, forming separate vacuum micro-casings for each pixel. For example, the adjacent pixels share the same inner bearing walls.

In one embodiment, the inner bearing walls are formed using the seal cap through second release openings 397. For example, the second release openings are configured with larger dimensions than the first release openings, allowing the seal cap to penetrate therethrough and rest on the BEOL dielectric between pixels to form the inner bearing walls. As shown, the second release openings are continuous elongated openings which extend completely to opposing sides of the outer bearing wall in the x- and y-directions between MEMS device regions or pixel regions. The second release openings traverse each other. This forms inner bearing walls which completely isolate the MEMS device regions, forming separate vacuum micro-casings for each pixel.

In some cases, hybrid inner bearing walls may be employed. For example, hybrid inner bearing walls include both the base cap and seal cap as the bearing wall. This can be easily configured by defining an appropriate pattern for the sacrificial layer. For example, recesses may be provided in locations where the base cap serves as the inner bearing wall and no recesses where the seal cap serves as the inner bearing wall. In the case of a hybrid inner bearing wall, the second openings can be discontinuous openings.

Below the cap is a getter 290. The getter is configured to avoid, like the release openings, interfering with the IR reception by the sensor. As such, the getter is configured to surround the sensor region 650. In one embodiment, the getter surrounds all four sides of the sensor region. For example, the getter may be disposed on the bottom or inner surface of the cap, including the sides and bottoms of the outer and inner bearing walls, except for the release openings.

In FIG. 6c, a simplified top view 600 of another embodiment of a MEMS region 206 is shown. The MEMS region is similar to that described in FIGS. 6a-b. Common elements may not be described or described in detail. The MEMS region includes four MEMS device regions 207 arranged in a 2×2 matrix. The MEMS region is encapsulated with a CMOS compatible cap. The cap includes an outer bearing wall 287 surrounding the MEMS region and inner bearing walls 288 in the x- and y-directions to separate the rows and columns of MEMS device regions. In one embodiment, the inner bearing walls are configured to provide channels between MEMS device regions, creating a homogenous vacuum level for the MEMS region.

In one embodiment, the inner bearing walls 388a are formed using the seal cap through second release openings 397. For example, the second release openings are configured with larger dimensions than the first release openings, allowing the seal cap to penetrate therethrough and rest on the BEOL dielectric between pixels to form the inner bearing walls. As shown, the second release openings are discontinuous elongated openings. For example, the second release openings do not traverse each other. A second release opening extends from the outer bearing wall towards the opposing side of the MEMS device region without traversing each other. This forms inner bearing walls with channels between MEMS device regions, creating a homogenous vacuum level for the MEMS device regions across the MEMS region.

Other configurations or designs for the inner bearing wall may also be useful. For example, as shown, an inner bearing wall is a continuous inner bearing wall shared by two adjacent MEMS device regions along the x- or y-direction without traversing or extending to other device regions. However, the inner bearing wall may be a discontinuous inner bearing wall between two adjacent MEMS device regions along the x- or y-direction. Providing a hybrid inner bearing wall which does not completely seal a MEMS device region may also be useful.

Below the cap is a getter 290. The getter is configured to avoid, like the release openings, interfering with IR reception by the sensor. As such, the getter is configured to surround the sensor region 650. In one embodiment, the getter surrounds all four sides of the sensor region. For example, the getter may be disposed on the bottom or inner surface of the cap, including the sides and bottoms of the outer and inner bearing walls, except for the release openings.

FIG. 6*d* shows a simplified top view 600 of another embodiment of a MEMS region 206. The MEMS region is similar to that described in FIGS. 6*a-c*. Common elements may not be described or described in detail. The MEMS region includes four MEMS device regions 207 arranged in a 2×2 matrix. The MEMS region is encapsulated with a CMOS compatible cap. The cap includes an outer bearing wall 287 surrounding the MEMS region and inner bearing walls in the x- and y-directions to separate the rows and columns of MEMS device regions. In one embodiment, the inner bearing walls are configured to provide channels between MEMS device regions, creating a homogenous vacuum level for the MEMS region.

The inner bearing walls are formed using the seal cap through second release openings. For example, the second release openings are configured with larger dimensions than the first release openings, allowing the seal cap to penetrate therethrough and rest on the BEOL dielectric between pixels to form the inner bearing walls. In one embodiment, the inner bearing wall of a MEMS device region along the y-direction includes first and second inner bearing walls $388b_{1-2}$ formed through second release openings $397_{1-2}$ while the inner bearing wall 388*a* along the x-direction is formed by a single inner bearing wall through a second release opening. Forming multiple bearing walls in the x- and y-directions may also be useful. Other configurations of the bearing walls, similar to those described previously are also useful.

Below the cap is a getter 290. The getter is configured to avoid, like the release openings, interfering with IR reception by the sensor. As such, the getter is configured to surround the sensor region 650. In one embodiment, the getter surrounds all four sides of the sensor region. For example, the getter may be disposed on the bottom or inner surface of the cap, including the sides and bottoms of the outer and inner bearing walls, except for the release openings.

Figure 7A:
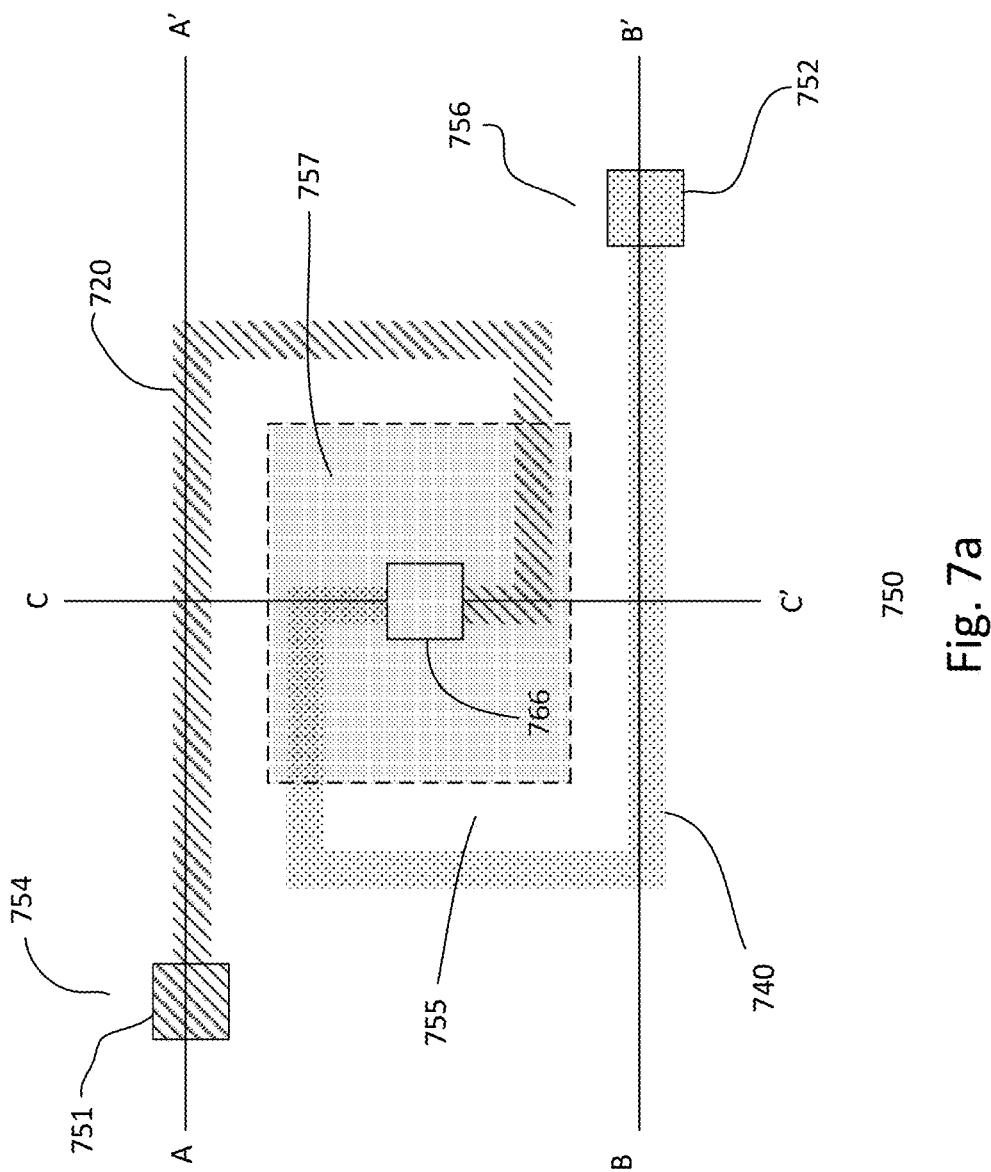
FIGS. 7a-d show top and cross-sectional views of various exemplary embodiments of thermopile structures.
Figure 7B:
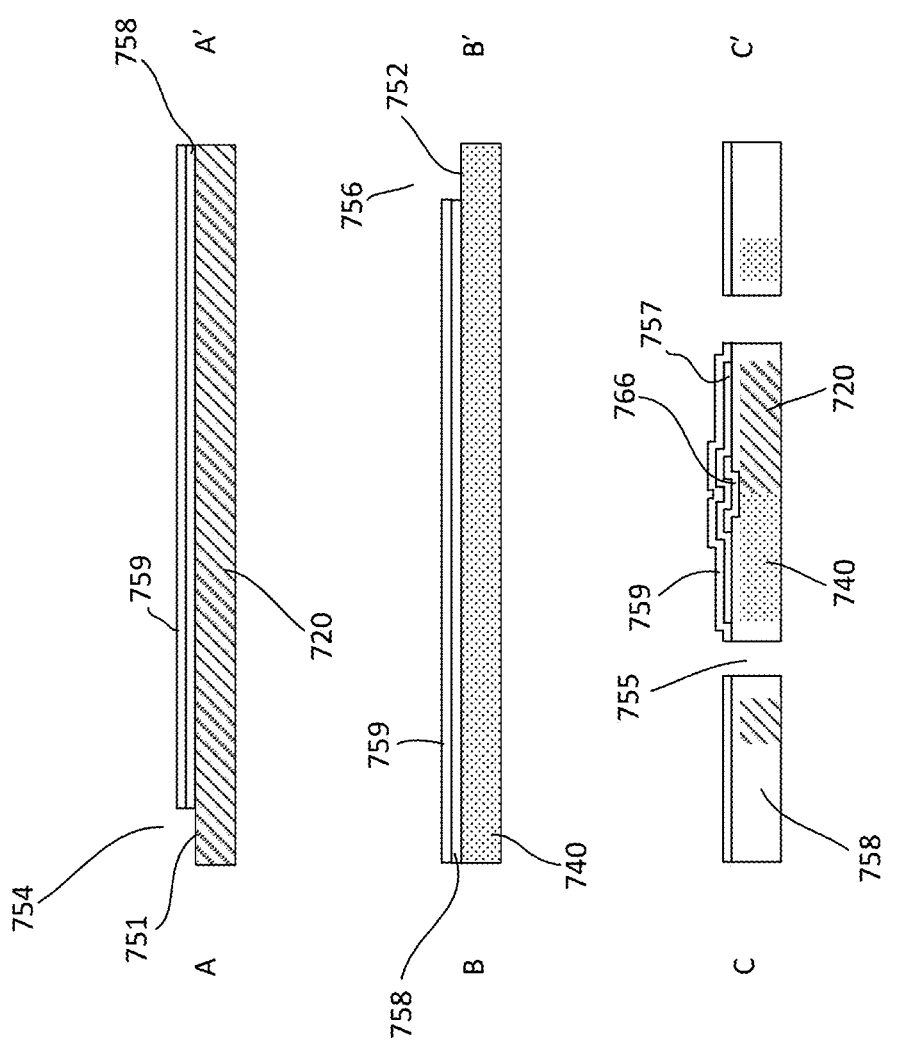

FIG. 7*a* shows a simplified top view of an embodiment of a MEMS sensor or structure 750 and FIG. 7*b* shows various cross-sectional views of the MEMS structure along A-A', B-B' and C-C'. The top view excludes the protective layer. The MEMS structure is a line structure. The line structure is a thermopile which serves as a thermoelectric IR sensor or detector. The line structure is disposed on the membrane or dielectric layer which defines the top of the lower device cavity. The line structure, in one embodiment, includes a single line unit (N=1) which has a meandering shape and occupies the surface of the membrane.

In one embodiment, the line unit includes polysilicon. Other types of line units may also be useful. For example, thermoelectric materials which are stable at high temperatures may be employed to form the line structure. Such materials may, for example, include SiGe, GaN and 2D materials, such as graphene, black phosphorus or molysulfide.

The line unit includes first and second line segments 720 and 740. A first end 751 is part of the first line segment and a second end 752 is part of the second line segment. In one embodiment, the first and second ends may serve as cold junctions of a thermopile. A first line structure terminal 754 is disposed at the first end and a second line structure terminal 756 is disposed at the second end. The terminals, for example, are part of the line unit of the line structure. The terminals serve as terminals of the MEMS structure or sensor.

In one embodiment, the first line segment is doped with first polarity type dopants and the second line segment is doped with second polarity type dopants. For example, the first line segment is heavily doped with first polarity type dopants and the second line segment is heavily doped with second polarity type dopants. The first polarity type may be p-type and the second polarity type may be n-type. Providing first polarity type which is n-type and second polarity type which is p-type may also be useful. The doping may be integrated into the implants which form the S/D regions and well contacts. Doping the line segments separately from the implants that form the S/D regions and well contacts may also be useful.

The line structure may be patterned using mask and etch techniques. For example, a photoresist is disposed on a line structure layer. The photoresist may be exposed by an exposure source through a reticle containing the desired pattern of the line structure. After development, the pattern of the reticle is transferred to the photoresist to form an etch mask. An etch is employed to pattern the line structure layer using the etch mask to form the line structure. The etch mask, for example, may be a photoresist mask. The etch, for example, is an anisotropic etch, such as a reactive ion etch (RIE). Other etch processes may also be useful. In one embodiment, the etch forms the line structure with the first and second line segments. Alternatively, the line structure may be a non-continuous line structure having, for example, first and second segments. The first and second segments may be electrically connected by a metal contact. If the line structure is integrated into the gate electrode layer, the mask used to pattern the gates may be used to pattern the line structure. Alternatively, separate mask and etch processes may be used to pattern the gates and the line structure.

As shown, the line segments are mirror images of each other. This produces line segments which are about the same length. By providing a meandering design for the line segments, efficient use of the sensor region can be achieved while producing a line structure having the desired resistance. For example, the line structure has a resistance of about 5-50 kΩ. Other resistances may also be useful.

To dope the first and second line segments, separate implants may be used. For example, a first implant using a first implant mask is used to dope the first line segment and a second implant using a second implant mask is used to dope the second line segment. In the case where doping of the line segments is integrated into the S/D implants, the implant masks may be those used for p-type and n-type S/D implants.

A line dielectric layer 758 covers the line structure, filling the gaps. The line dielectric layer provides mechanical support for the thermopile membrane. The line dielectric layer may be a self-planarizing dielectric layer, such as spin-on-glass (SOG). Other types of self-planarizing dielectric materials may also be useful. The dielectric layer may have a top surface which is about 100-400 nm above the top of the line structure. Providing a dielectric layer having other thicknesses over the top of the line structure may also be useful.

A contact 766 is provided to electrically couple the first and second segments. The contact, for example, is a metal contact, such as titanium (Ti) or aluminum (Al). Other types of contacts may also be useful. To form the contact, a contact opening is formed in the dielectric layer to expose the line structure at about the junction of the first and second segments. A metal layer is formed on the substrate and patterned, leaving the contact coupling the first and second segments. The metal layer, for example, may be titanium (Ti) or aluminum (Al) formed by sputtering or plating. Other types of metal layers or forming techniques may also be useful. In other embodiments, the contact may be formed by a damascene technique. For example, a via opening is formed in the dielectric layer. A conductive layer is formed, filling the via opening and covering the dielectric layer. A planarizing process, such as CMP, is performed to form the metal contact in the via opening, connecting the first and second segments of the line structure.

An absorber layer 757 is formed on the substrate, covering the dielectric layer. The absorber layer may be patterned using etch and mask processes. The patterned absorber layer serves as an absorber above the line structure. In one embodiment, the absorber layer is patterned, covering a central portion of the line structure and contact, leaving the leg portions outside the central portion exposed. The absorber layer, for example, absorbs IR radiation. The absorber layer may be a TiN or NiCr layer. The absorber layer, for example, may be formed by sputtering. Other types of absorber layers may also be useful. In one embodiment, the absorber is configured to absorb most of the IR radiation. For example, the absorber may be configured to absorb greater than 85% of IR radiation having a wavelength of 8-14 µm. Absorbing other wavelengths may also be useful. As shown, the absorber layer is disposed over the contact. The absorber serves as a hot junction of the thermopile. The first end 751 of the first line structure and the second end 752 of the second line structure serve as cold junctions of the thermopile. The leg portions of the line structure uncovered by the absorber provide thermal isolation between the hot and cold junctions.

A protective layer 759 may be provided. The protective layer, for example, covers the MEMS structure. The protective layer protects the MEMS structure from subsequent processes. The protective layer, for example, is a silicon oxide layer formed by CVD. Other types of protective layers may also be useful. The protective layer may be a dielectric layer between a metal layer and the metal contact. For example, the protective layer may be a dielectric layer between M1 (contact) and M2. Other configurations of metal layers and the protective layer may also be useful.

In one embodiment, the protective layer forms an upper portion of the first contact level of the ILD layer disposed below the BEOL dielectric layer. The protective layer, line dielectric layer and membrane forming the top of the cavity are patterned to form openings 755, separating the legs from the central portion of the line structure. The openings provide access to the cavity. This enables removal of the sacrificial fill in the cavity, releasing the line structure. In one embodiment, one of the metal layers in the BEOL dielectric may be patterned to serve as a line structure etch hardmask for patterning the various layers to form openings 755 to release the line structure. For example, the metal layer may be M1 or M2. Other metal layers may also be used to serve as an etch mask for the release etch process.

Figure 7C:
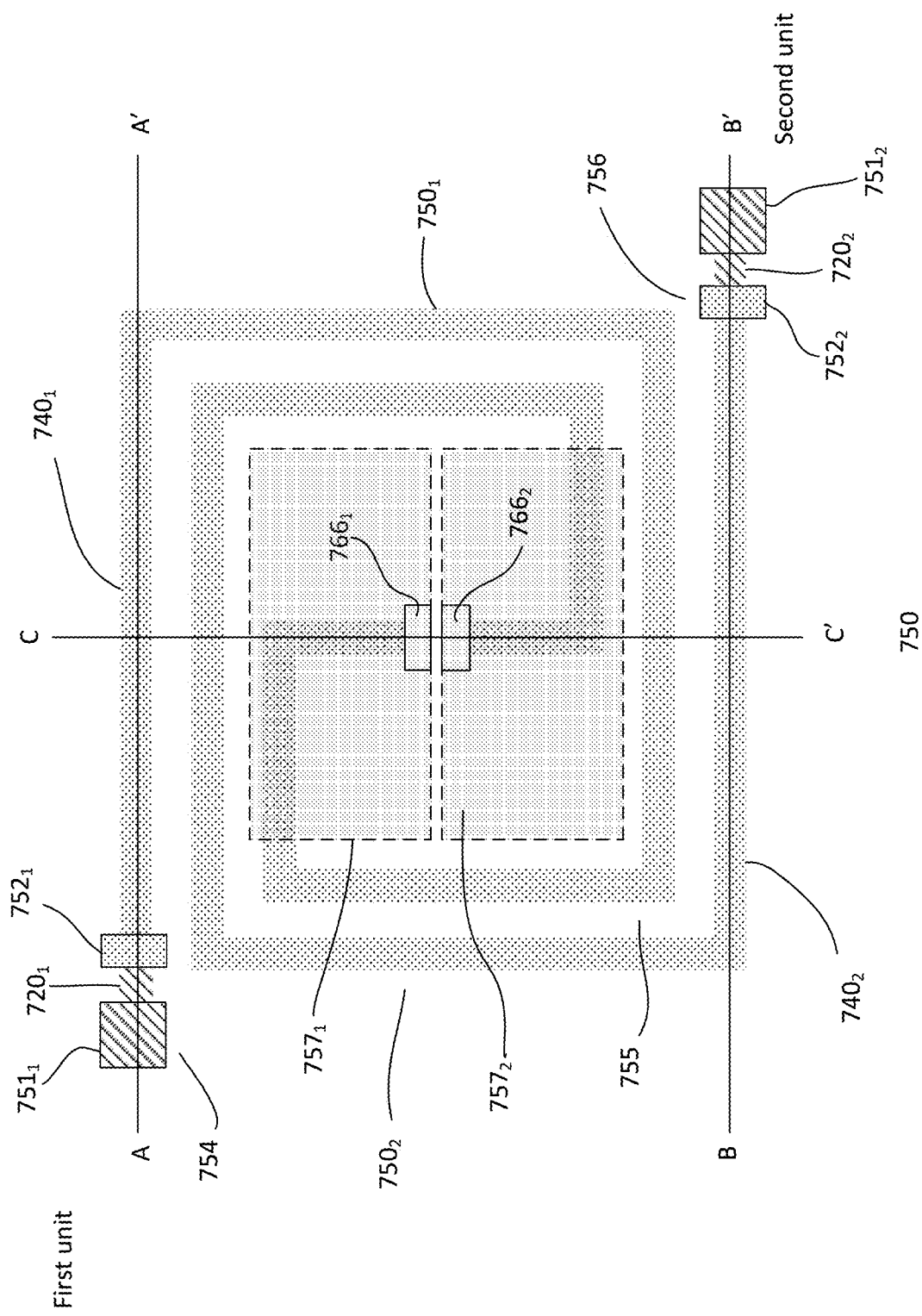
Figure 7D:
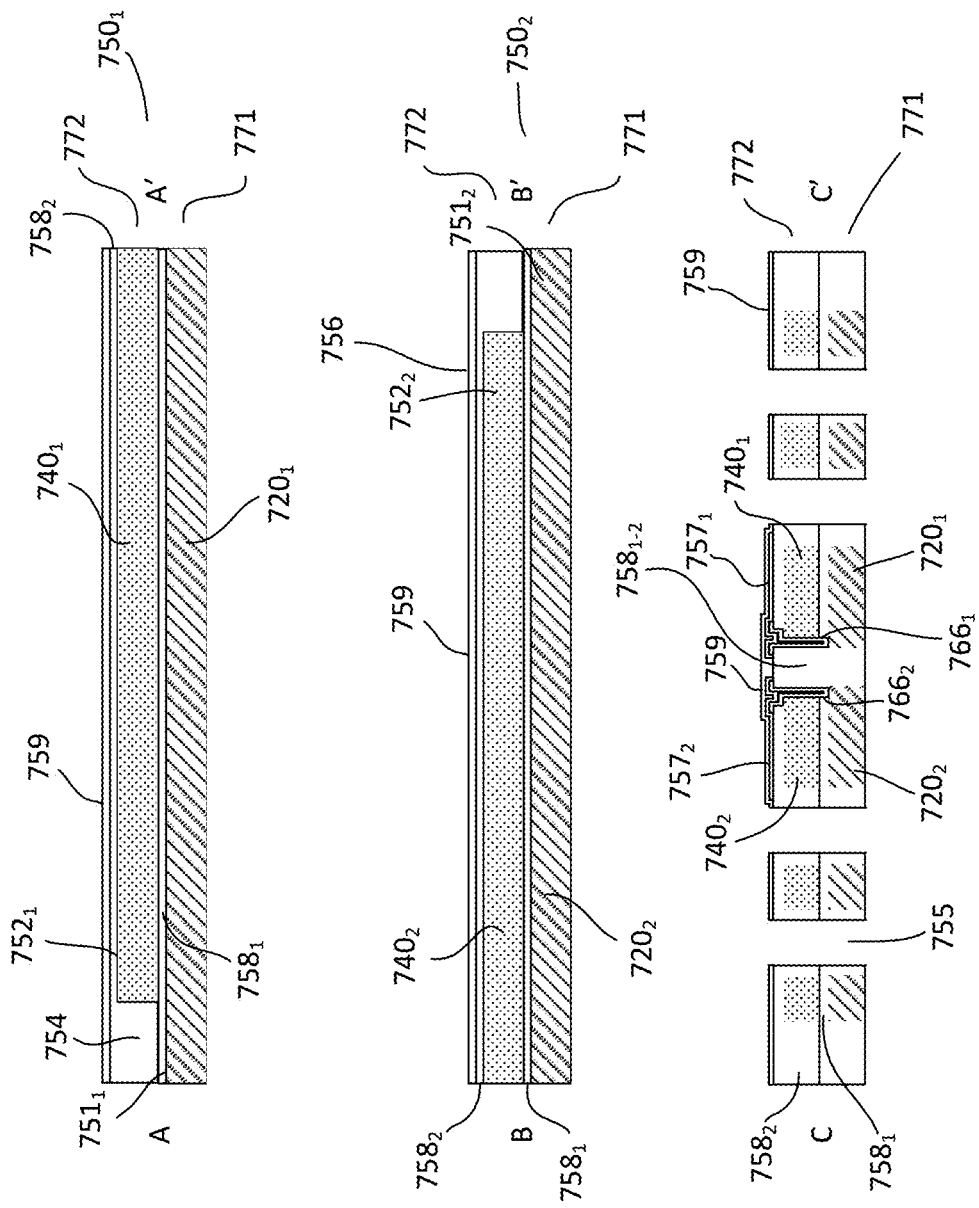

FIG. 7c shows a top view of another embodiment a MEMS structure 750 and FIG. 7d shows cross-sectional views of the MEMS structure based on the top view of the MEMS structure of FIG. 7c. The cross-sectional views are along A-A', B-B' and C-C'. The MEMS structure is a line structure forming a thermopile which serves as a thermoelectric IR sensor. The top view excludes the protective layer protecting the line structure. The line structure is similar to that described in FIGS. 7a-7b. Common elements may not be described or described in detail. The line structure is disposed on the membrane which structures the cavity.

The line structure has more meanderings or turns to increase the length of the segments which occupy the surface of the membrane as compared to FIGS. 7a-7b. This increases the resistance of the line structure. Other designs for the line segments to increase the length or to tailor the lengths of the segments to achieve the desired resistance may also be useful.

In one embodiment, the MEMS structure is a multi-line unit line structure with N number of line units that are coupled in series to form a thermoelectric IR sensor. As shown, the MEMS structure includes first and second line units $750_1$ and $750_2$ (e.g., N=2). Providing other numbers of line units for the multi-line unit line structure may also be useful. For example, a multi-line unit line structure may have 2-4 (N=2-4) line units. In one embodiment, a multi-line unit line structure includes an even number of line units, such as N=2M, where M is a whole number. Preferably, M is equal to 1-2 (N=2 and 4). Providing odd number of line units for a multi-line unit line structure may also be useful. Other numbers of line units may also be useful.

As discussed, the line structure shown includes first and second line units. In one embodiment, a line unit of the multi-line unit line structure is a stacked line unit. The first and second stacked line units may be disposed adjacent to each other on the dielectric layer within the sensor region. As shown, a center of the sensor region serves as contact regions for the first and second contacts $766_1$ and $766_2$ of the first and second line units $750_1$ and $750_2$. The line units at the contact region are separated by dielectric layers $758_{1-2}$.

A stacked line unit includes a first segment ($720_1$ or $720_2$) disposed in a first line level 771 and a second line segment ($740_1$ or $740_2$) disposed in a second line level 772. The first and second line levels may be separated by a first dielectric layer $758_1$. For example, the second line segment of a line unit in the second line level is overlaid over the first line segment of the line unit in the first line level. The first and second line segments of a line unit are separated by the first interline level dielectric layer $758_1$. The gaps of the line segments are filled by the first and second interline level dielectric layers $758_{1-2}$.

A contact ($766_1$ or $766_2$) connects the first line segment in the first line level to the second line segment in the second line level. The first and second contacts are formed in the first and second interline level dielectric layers. For example, the contacts are disposed in contact vias. A contact via for a line unit, for example, may overlap the first and second line segments, exposing them. A contact, such as Ti or Al, lines the contact via, connecting the exposed first and second line segments.

In one embodiment, the first line segments of the line units are doped with first polarity type dopants and the second line segments of the line units are doped with second polarity type dopants. For example, the first segments of the line units in the first level are doped with first polarity type dopants and the second segments of the line units in the second level are doped with second polarity type dopants. The first polarity type may be n-type and the second polarity type may be p-type. Other configurations of doped line segments may also be useful.

As shown, the first line unit has first and second ends $751_1$ and $752_1$ which are located at a diagonally opposite corner of the sensor region than the first and second ends $751_2$ and $752_2$ of the second line unit. The line units each meander throughout the sensor region from opposite diagonal corners towards the contact region. Other configurations of or meandering patterns for the line units may also be useful. For example, the first stacked line unit may occupy about one-half of the sensor region and the second stacked line unit may occupy about the other half of the sensor region.

First and second absorber layers $757_1$ and $757_2$ are disposed on the substrate over the second line dielectric layer $758_2$. As shown, the layers cover a central portion of the sensor region, including the contact regions of the first and second contacts. For example, the first absorber covers the central portion of the sensor region and first contact region of the first line unit and the second absorber covers the central portion of the sensor region and the second contact region. The first and second absorber layers, since they are conductive, are distinct absorber layers.

The absorber layers, for example, absorb IR radiation. The absorber layers may be TiN or NiCr layers. Other types of absorber layers may also be useful. In one embodiment, the absorber is configured to absorb most of the IR radiation. For example, the absorber may be configured to absorb greater than 85% of IR radiation having a wavelength of 8-14 μm. Absorbing other wavelengths may also be useful. As shown, the absorber layer is disposed over the contact. The absorber serves as a hot junction of the thermopile. The first ends $751_{1-2}$ of the first line segments of the line units and the second ends $752_{1-2}$ of the second line segments of the line units serve as cold junctions of the thermopile. The leg portions of the line segments uncovered by the absorber provide thermal isolation between the hot and cold junctions.

The process for forming the stacked line structure may include, for example, forming a first line segment layer on the substrate, including in the sensor region over the sensor membrane dielectric layer and over the cavity. In one embodiment, a polysilicon layer is formed on the substrate by CVD. The first line segment layer is patterned to form distinct first line segments $720_1$ and $720_2$ of the first and second line units. Patterning may be achieved using mask and etch techniques, such as a resist mask and RIE. The first segments may be doped with first polarity type dopants, such as n-type dopants. Doping the segments may be achieved by selectively implanting first polarity type dopants using an implant mask. A first interlevel line dielectric layer $758_1$ may be formed on the substrate. The first interlevel dielectric layer lines the line segments and surface of the sensor membrane layer. The first interlevel dielectric layer, for example, lines the line segments without filling the gaps therebetween. The first interlevel dielectric layer may be a silicon oxide layer formed by CVD. Providing a SOG dielectric layer may also be useful.

A second line segment layer, such as polysilicon is formed on the first interlevel line dielectric layer by CVD and patterned to form distinct second line segments $740_1$ and $740_2$ of the first and second line units using mask and etch techniques. The second line segments, for example, overlay the first line segments and are separated by the first interlevel line dielectric layer. The second line segments are doped with second polarity type dopants, such as p-type dopants. The second line segments may be doped by implanting second polarity type dopants using an implant mask.

A second interlevel line dielectric liner $758_2$ is formed on the substrate. In one embodiment, the second interlevel line dielectric layer may be a SOG layer, filling the gaps and forming a planar top surface over the second line segments.

First and second contact vias are formed in the interlevel line dielectric layers in the contact region. The first contact via exposes first and second segments of the first line unit and the second contact via exposes the first and second segments of the second line unit. The contact vias may be formed by mask and etch techniques. A contact layer, such as Ti or Al is deposited on the substrate. Other types of metal contact layers may also be useful. The contact layer, for example, may be deposited by sputtering and lines the second interlevel line dielectric layer and contact vias. In one embodiment, the contact layer lines the contact vias without filling them. The contact layer is patterned by mask and etch techniques to form first and second contacts $766_1$ and $766_2$ of the first and second line units. In other embodiment, a metal contact may be formed, filling the via openings. A polishing process, such as CMP, may be performed to remove excess metal material, leaving contacts in the contact vias.

An absorber layer is formed on the substrate, covering the second interlevel line dielectric layer and contacts. The absorber layer, for example, is a conductive layer formed by sputtering. The absorber layer is patterned to form distinct first and second absorber layers $757_1$ and $757_2$ in the central portion of the sensor region using mask and etch techniques. In the case the contacts line the vias without filling them, the absorber layer may serve to fill the contact vias over the contacts.

A protective layer 759 may be provided. The protective layer, for example, covers the MEMS structure. The protective layer protects the MEMS structure from subsequent processes. The protective layer, for example, is a silicon oxide layer formed by CVD. Other types of protective layers may also be useful.

The protective layer, line dielectric layer and membrane forming the top of the cavity are patterned to form openings 755, separating the legs from the central portion of the line structure. For example, a patterning process is performed to form the line units of the line structure. The openings provide access to the cavity. This enables removal of the sacrificial fill in the cavity, releasing the line structure. The mask of the patterning process, in one embodiment, may be served by a metal layer of the BEOL dielectric. For example, the mask may be served by M1 or M2 of the BEOL dielectric. In other embodiments, the mask may be a patterned resist mask.

As discussed, the first and second line units $750_1$ and $750_2$ are coupled in series. In one embodiment, the second end $752_1$ of the first line unit is coupled to the first end $751_2$ of the second line unit. The series connection in the line unit may be facilitated by via contacts in the interlevel line dielectric layers which are coupled to the second end of the first line unit and the first end of the second line unit. A metal line may be provided in the BEOL dielectric layer, such as in M1, to connect the via contacts. Other configurations of providing the series connection of the line units may also be useful.

As described, the line segments of the line units are disposed in the same line level and are doped with the same dopant type. This allows the line segments of the line units to be doped using a single implant process (e.g., same implant process using a single implant mask). In alternative embodiments, the line segments of the line units in the same line level may be doped with opposite polarity type dopants. In such cases, the line segments are doped by separate implant processes (e.g., different implant processes using different implant masks). As such, providing line segments of the line units which have the same doping type in the same line level reduces the need to use additional implant masks. Other configurations of line segments for the line units may also be useful.

As described, the MEMS structure includes 2 line units which are stacked and coupled in series. Stacking other numbers of line units which are coupled in series may also be useful. Preferably, the line structures of the stack line units have similar designs. However, it is understood that this is not necessary. In addition, the line units or structures may have layouts other than that described in FIGS. 7a-7d.

Figure 7E:
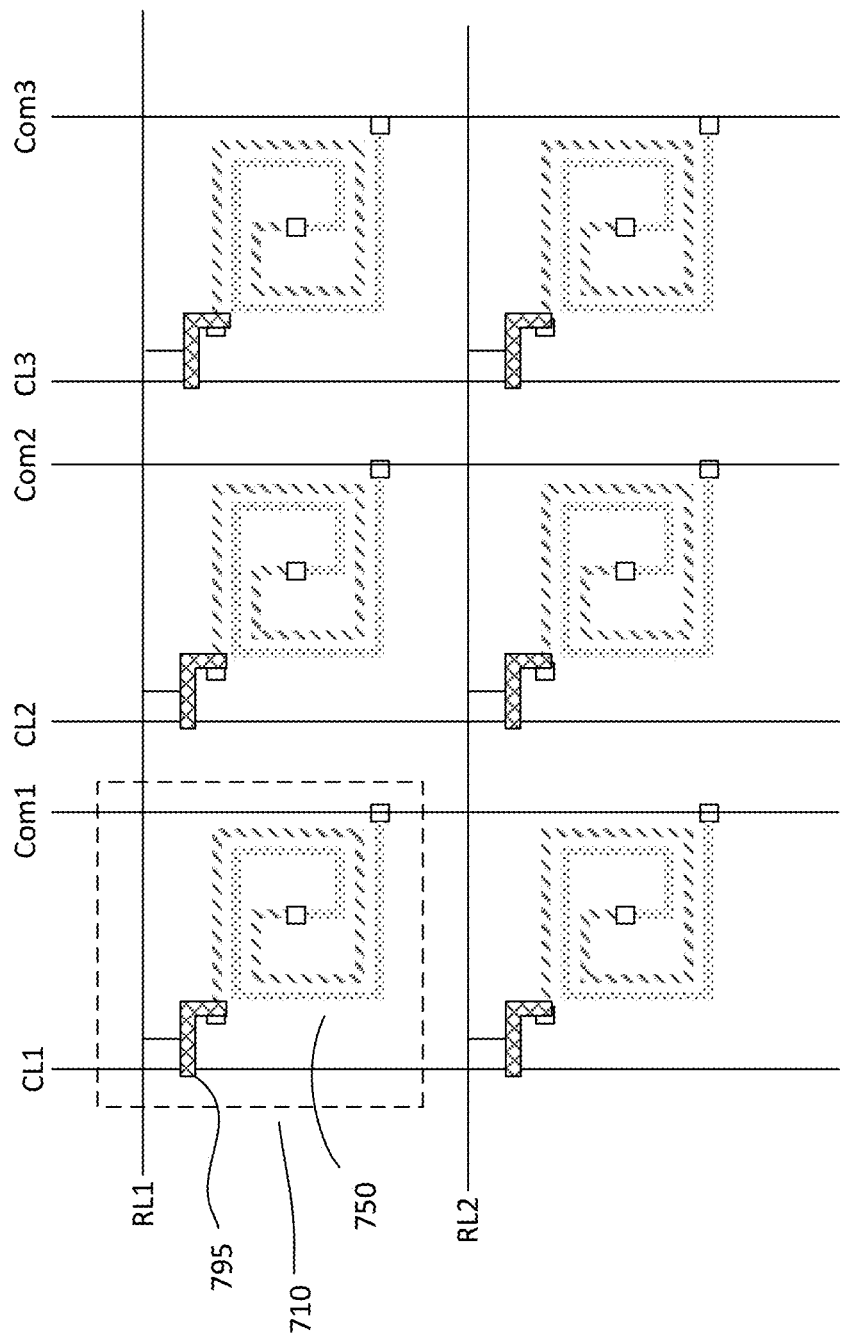
FIG. 7e shows an exemplary layout of a 2×3 sensor arrays.

FIG. 7e shows a sensor array 704. The sensor array includes a plurality of sensor cells 710. A sensor cell includes a switch coupled to a MEMS structure, such as a line structure or structures as described in FIGS. 7a-7d. Common elements may not be described or described in detail.

The sensor cells are configured to form an array having Y rows and Z columns. A sensor cell corresponds to a pixel of the sensor array. The sensor cells are coupled in a row direction by row lines ($RL_m$) and in the column direction by column lines ($CL_n$). A sensor cell may correspond to a pixel. Additionally, common lines (Coms) are also used to couple the sensor cells in each column. For example, each column of sensors is coupled to a respective Com (e.g., $Com_1$, $Com_2$ or $Com_3$). As shown, the array includes a 2×3 array (Y=2 and Z=3). For example, the sensor cells are arranged in 2 rows ($RL_1$ and $RL_2$) and 3 columns ($CL_1$, $CL_2$ and $CL_3$). Other sized arrays may also be useful. For example, the sensor array may be a 32×32 or 80×62 array.

The pixels of the sensor array may include a plurality of sensors arranged in a matrix on the substrate. For example, each pixel may include a sensor region and a CMOS switching or connection region. The sensor regions are disposed in, for example, a sensor array region of the substrate. For example, the sensor array region includes a plurality of sensor regions corresponding to sensor pixels.

In one embodiment, a first terminal of the MEMS structure of a sensor cell is coupled to the switch 795 while a second terminal is coupled to a common line (Com). As shown, each column of sensor cells is coupled to a respective Com (e.g., $Com_1$, $Com_2$, and $Com_3$). A switch may be a transistor having first and second S/D terminals and a gate or control terminal. For example, a first S/D terminal of the switch is coupled to the first terminal of the MEMS structure and the second S/D terminal is coupled to a CL. The RL is coupled to a gate or control terminal of the switch. In one embodiment, the n-type terminal of the sensor cell is coupled to Com and the p-type terminal of the sensor cell is coupled to CL. Other configurations of coupling the sensor cell to CL and Com may also be useful. An RL can be selected to select a row of sensor cells. A CL is activated to select a column of sensor cells. The selected cell is the intersection of the selected RL and selected CL. The interconnections between the CMOS components and sensor pixels may be achieved through the ILD and IMD levels of the BEOL dielectric.

In one embodiment, the sensor array is configured to read out a row of sensor cells or pixels. For example, the pixels of the array are read out one row at a time. In one embodiment, an RL of the array is selected. This selects a row of pixels. CLs are then selected, causing the pixels of the selected RL to be readout. In one embodiment, the array is configured to read out one row of pixels at a time, starting from the first row to the last. The information readout is stored in memory. An image or one frame of the imager will be produced once all pixels are read out or once all rows have been scanned through. For example, information stored in memory read out from the pixels may be reconstructed to form an image.

In the case of the 2×3 array in FIG. 7e, scanning the pixels to form an image may include selecting $RL_1$ (the first row) to select the pixels coupled to $RL_1$. After $RL_1$ is selected, $CL_1$, $CL_2$ and $CL_3$ are selected, causing the pixels coupled to $RL_1$ to be readout. The information of the pixels coupled to $RL_1$ is stored in memory. The next or second row $RL_2$ is selected to select the pixels of $RL_2$. After $RL_2$ is selected, $CL_1$, $CL_2$ and $CL_3$ are selected, causing the pixels coupled to $RL_2$ to be readout. The information of the pixels coupled to $RL_2$ is stored in memory. Since $RL_2$ is the final row of the array, the information of the pixels is reconstructed to form an image or a frame of the imager. Numerous frames may be collected by repeating the sensing, readout and reconstruction process. For example, an image or a frame is time-dependent. Select logic and output logic components may be employed to select the cell for outputting information contained. The logic components may be CMOS transistors or components in the CMOS region of the device. Other logic components, including memory and reconstruction logic components, may be included to store and reconstruct information to form an image or images. In one embodiment, the memory and reconstruction logic components may be off-chip logic. Providing these logic components as on-chip logic components or a combination of on-chip or off-chip components may also be useful.

Figure 8A:
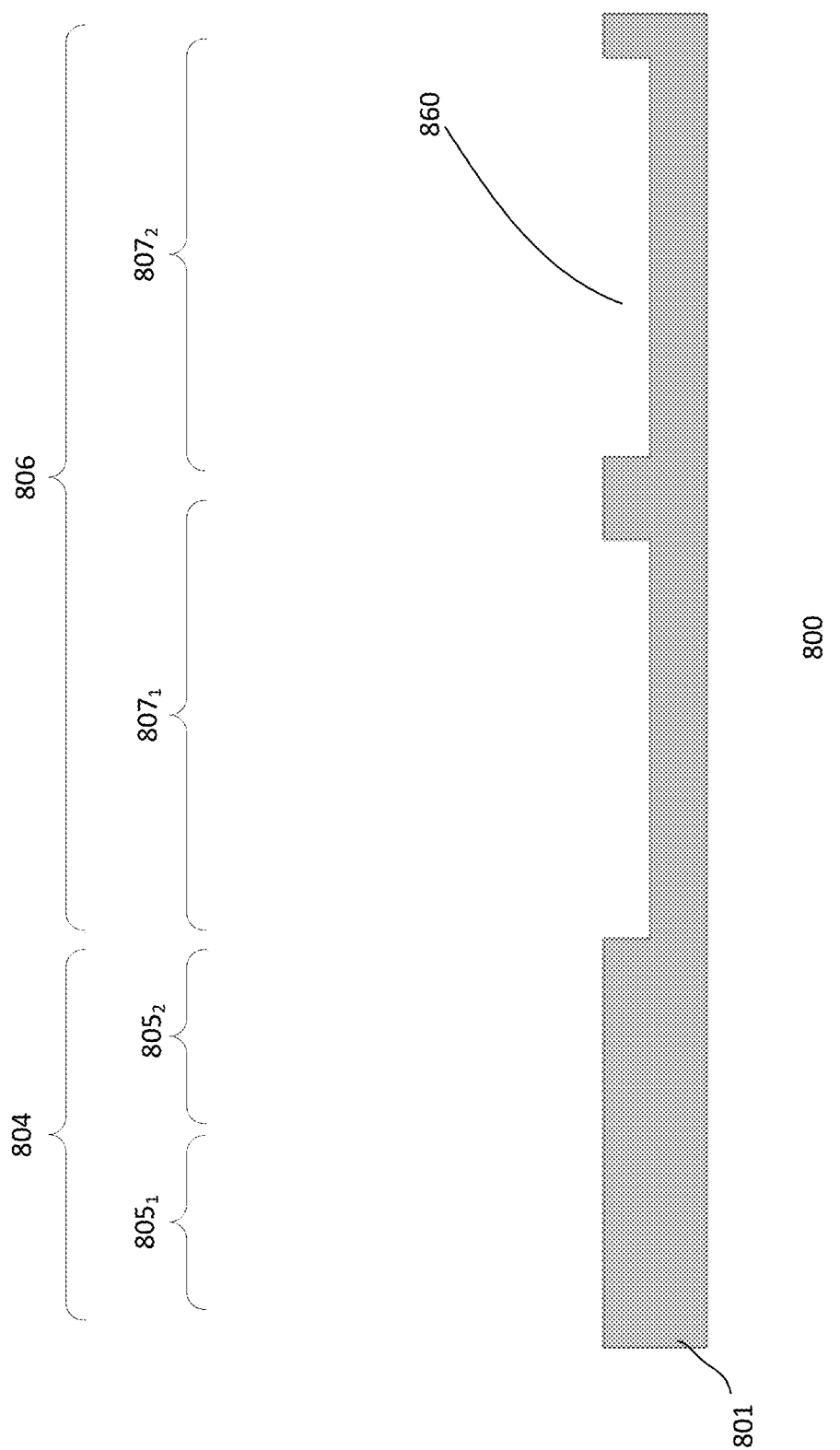
FIGS. 8a-r show simplified cross-sectional views of an exemplary process for forming a device.
Figure 8B:
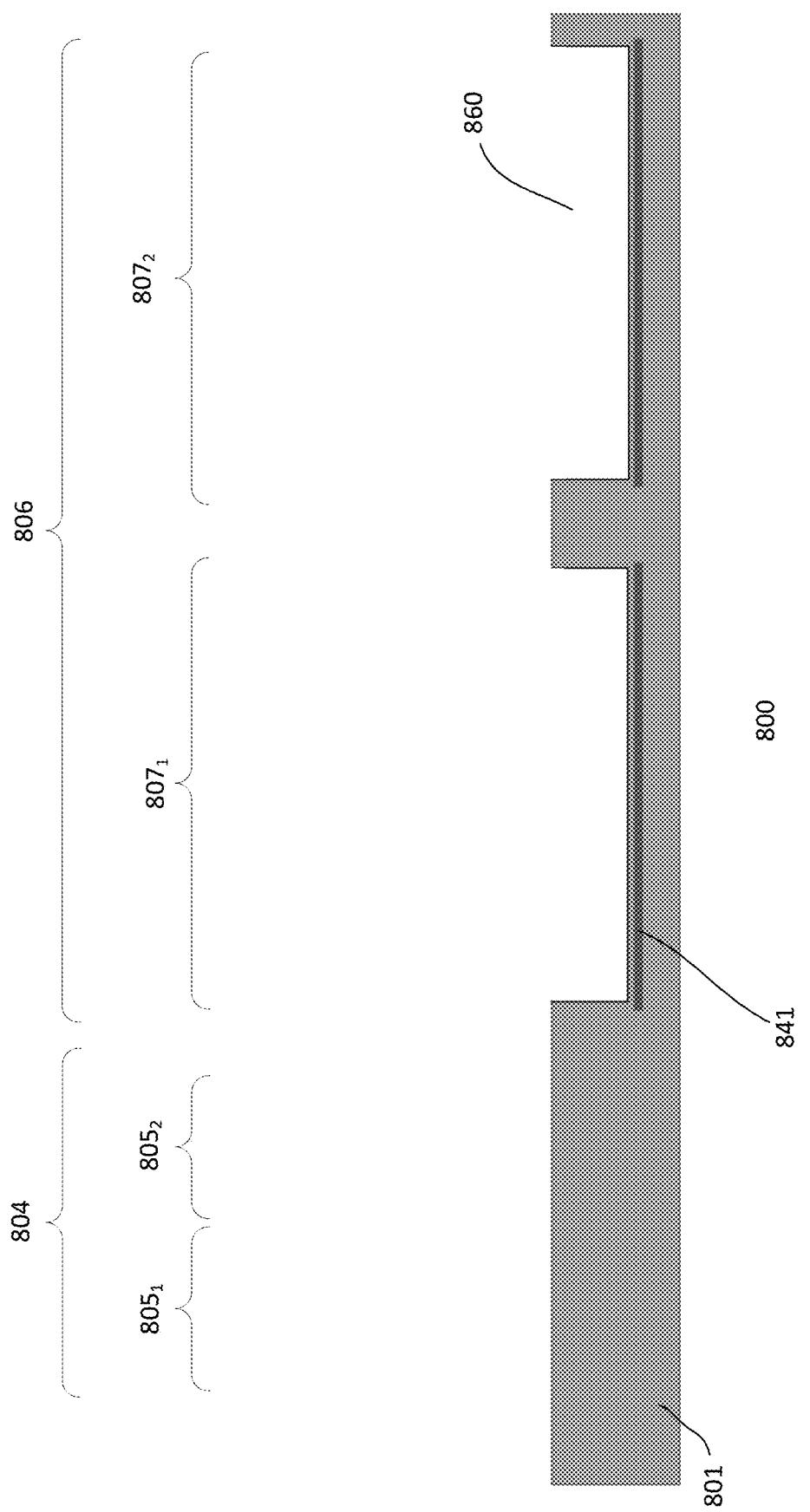
FIGS. 8s-t show simplified cross-sectional views of another process for forming a device.
FIGS. 8u-v show simplified cross-sectional views of another process for forming a device.
Figure 8C:
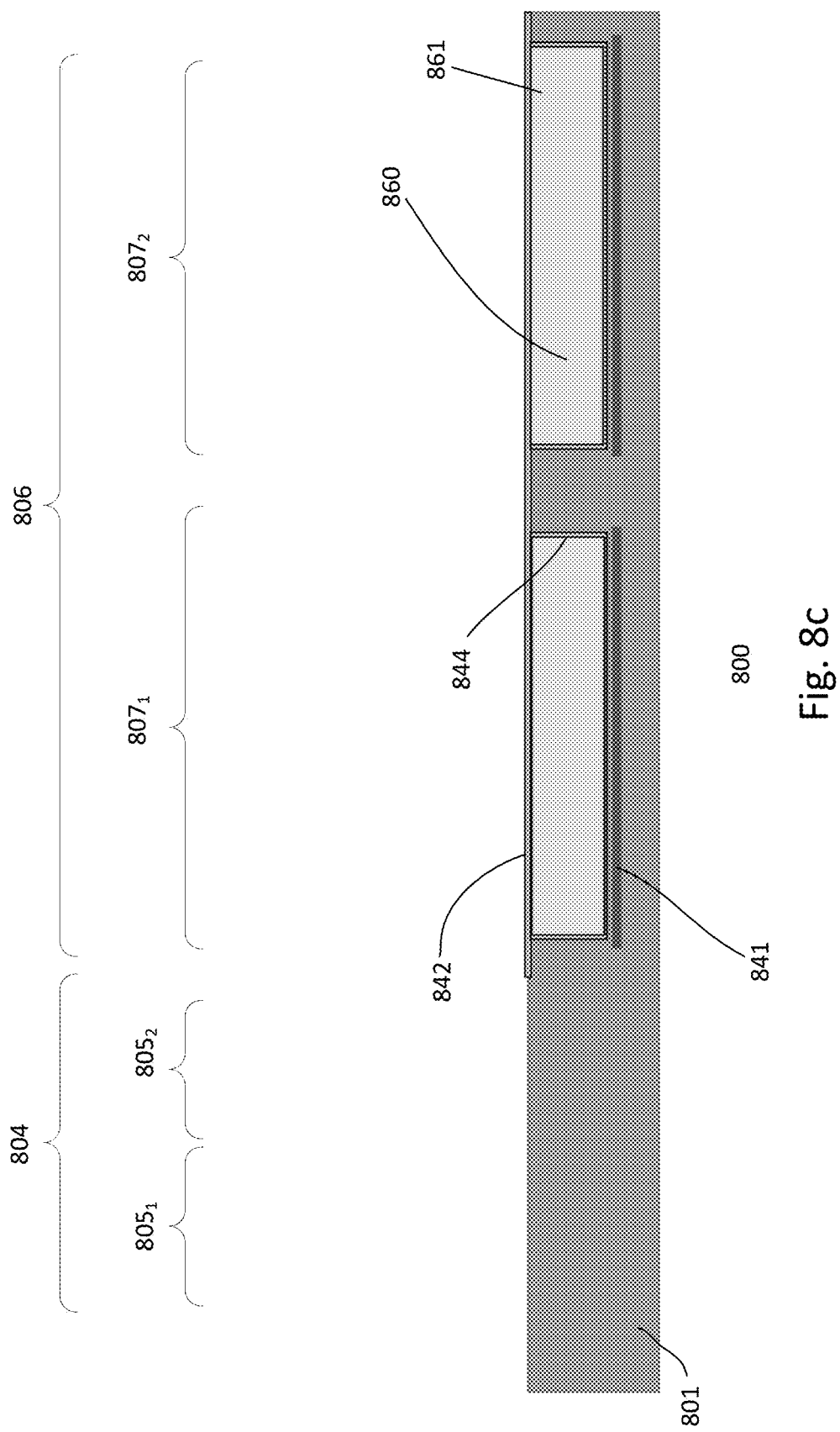
Figure 8D:
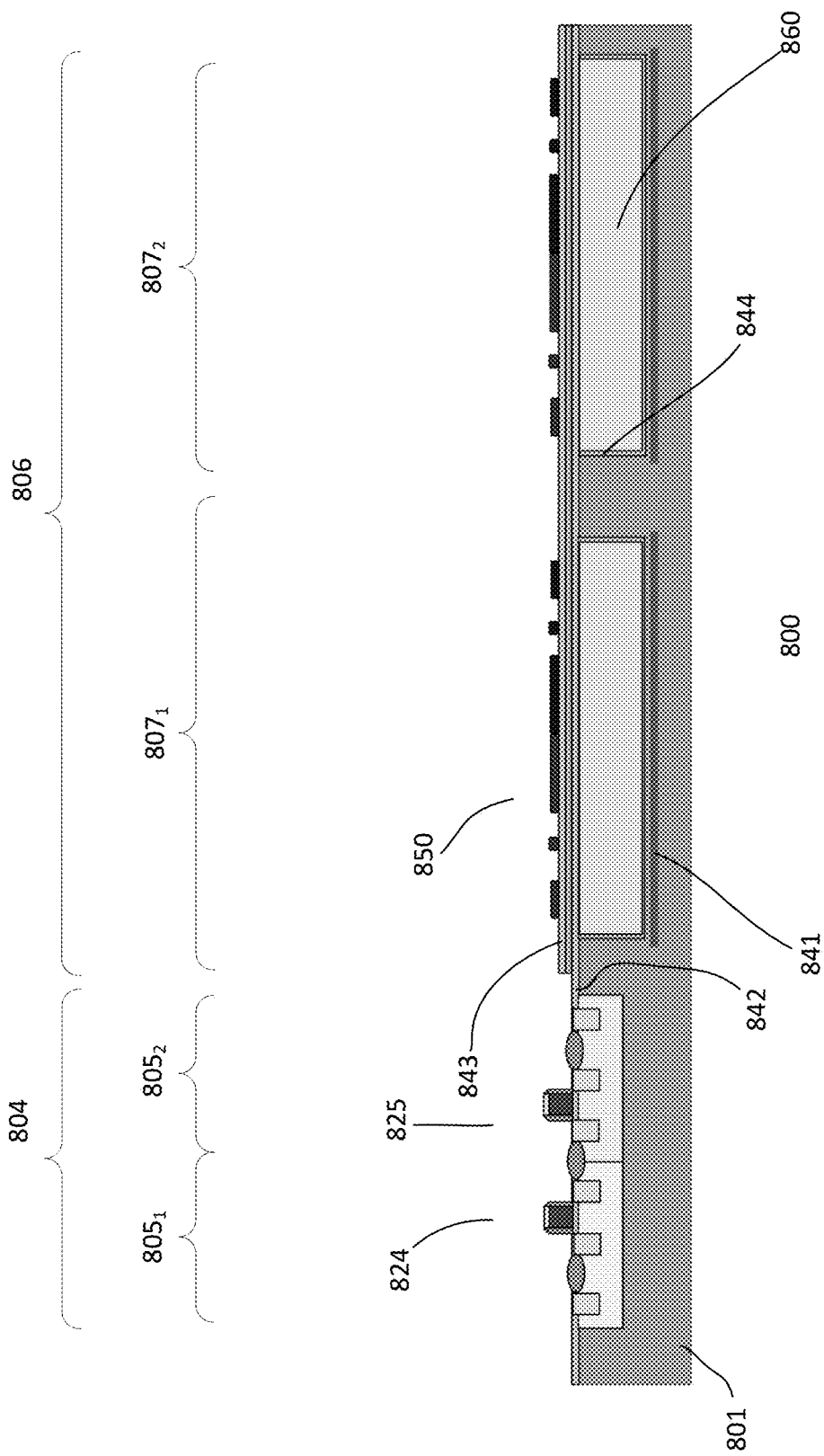
Figure 8E:
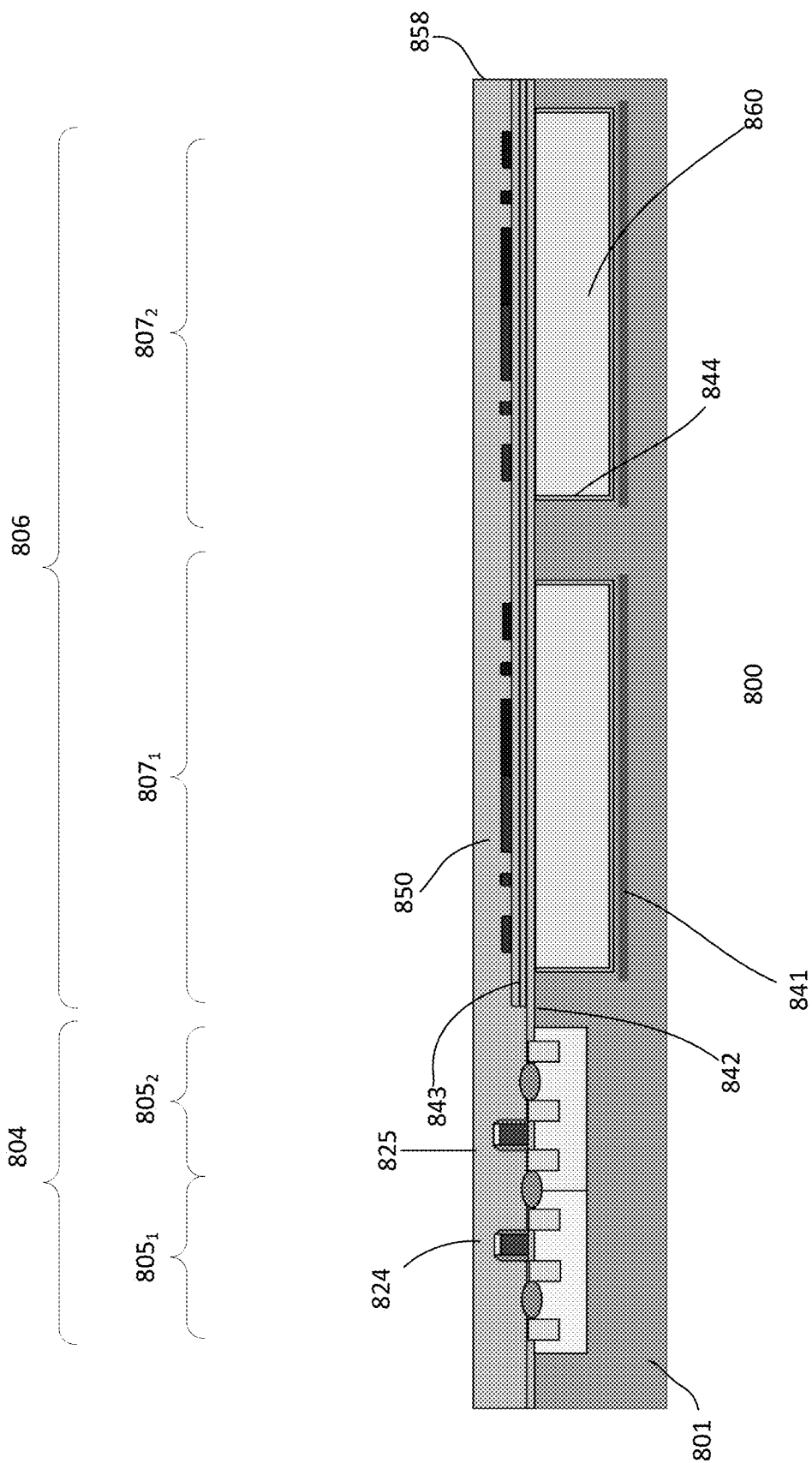
Figure 8F:
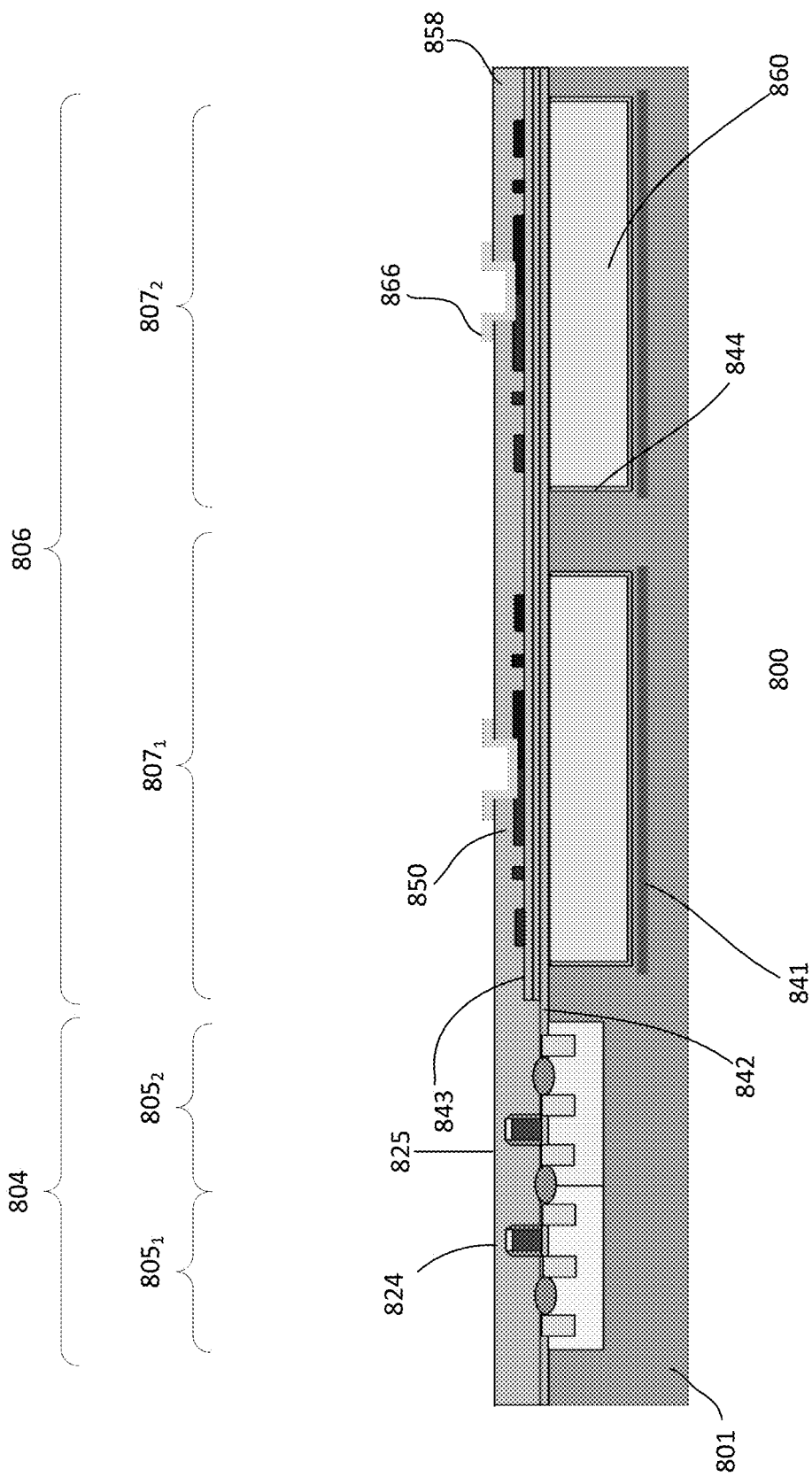
Figure 8G:
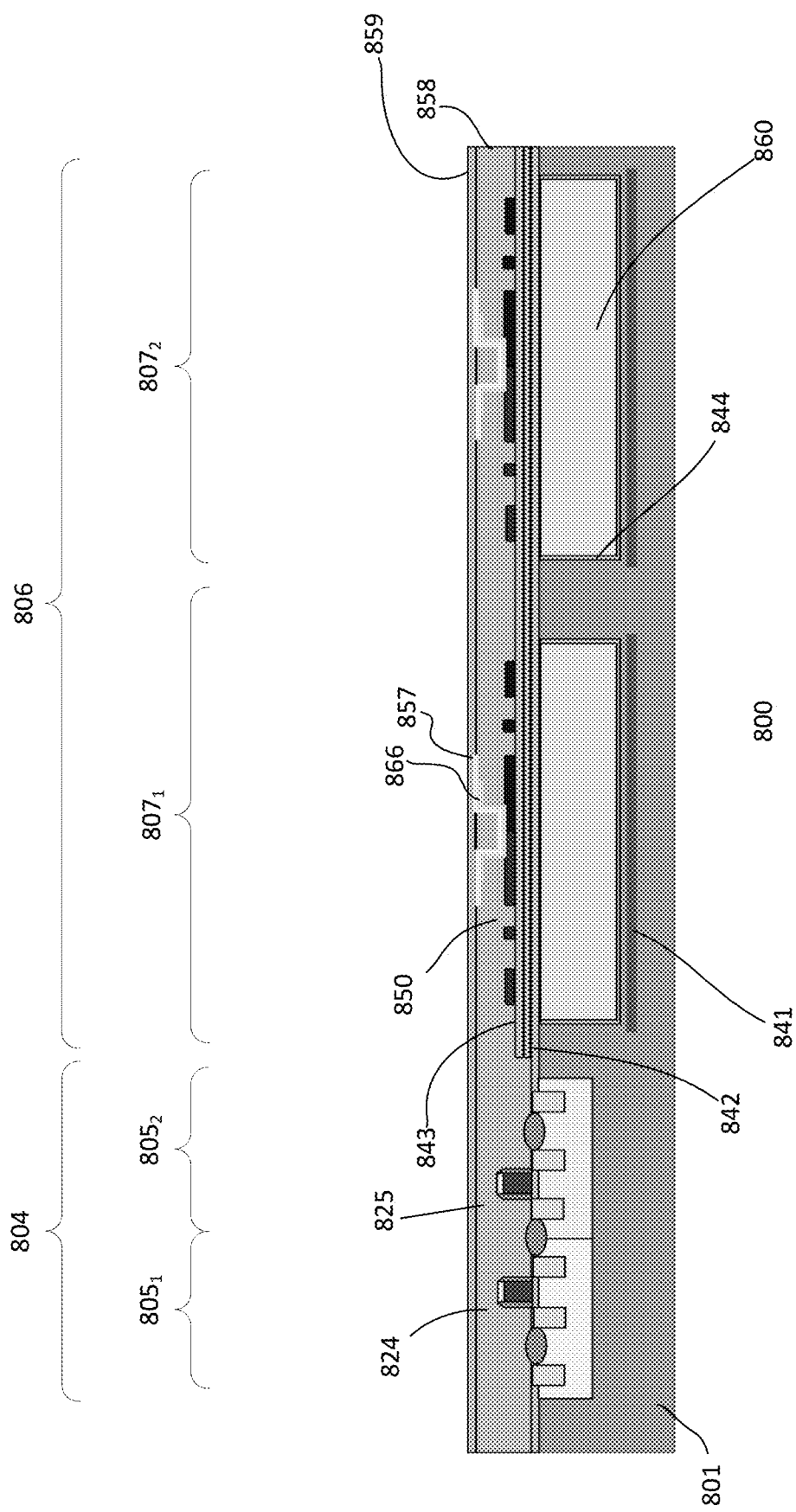
Figure 8H:
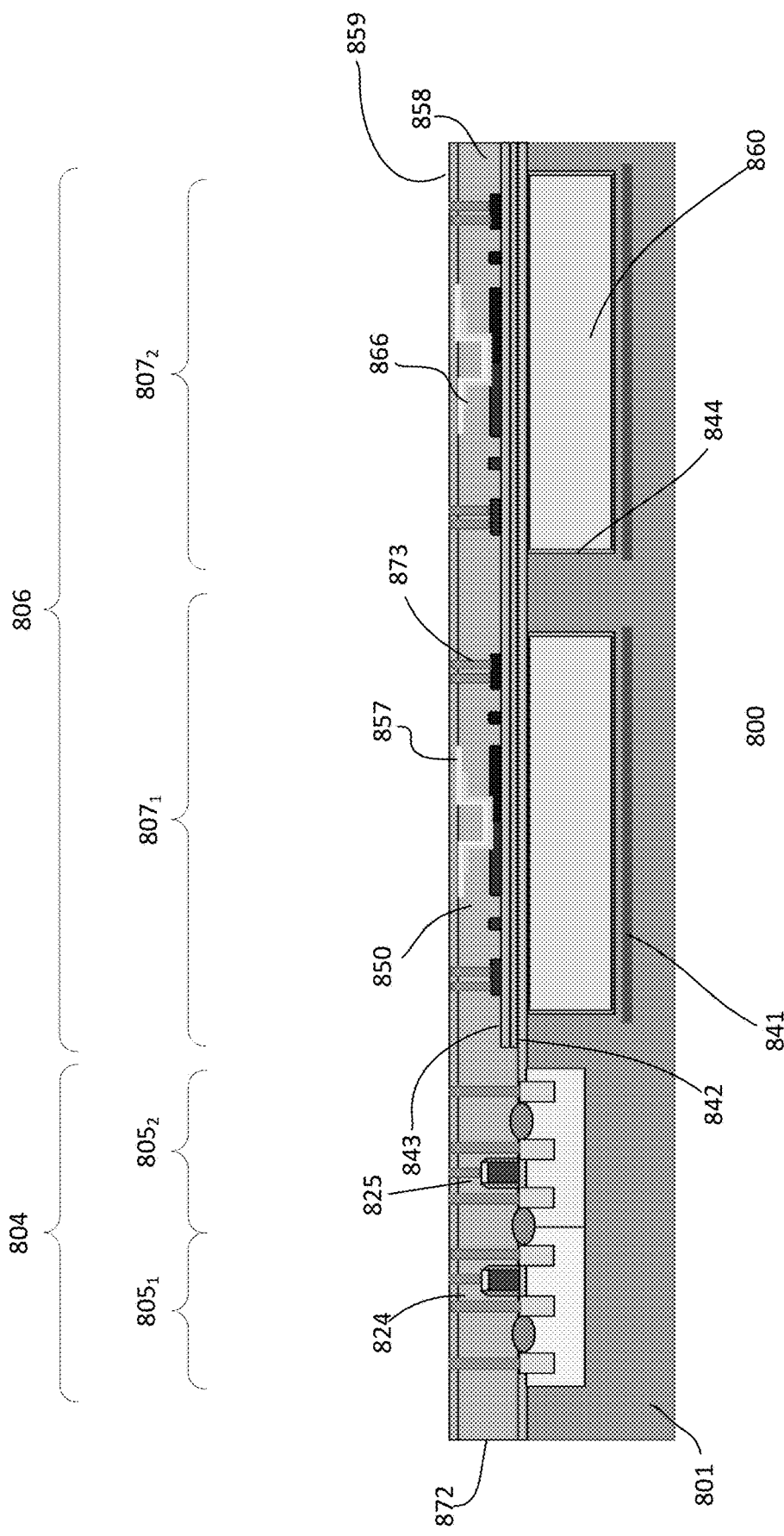
Figure 8I:
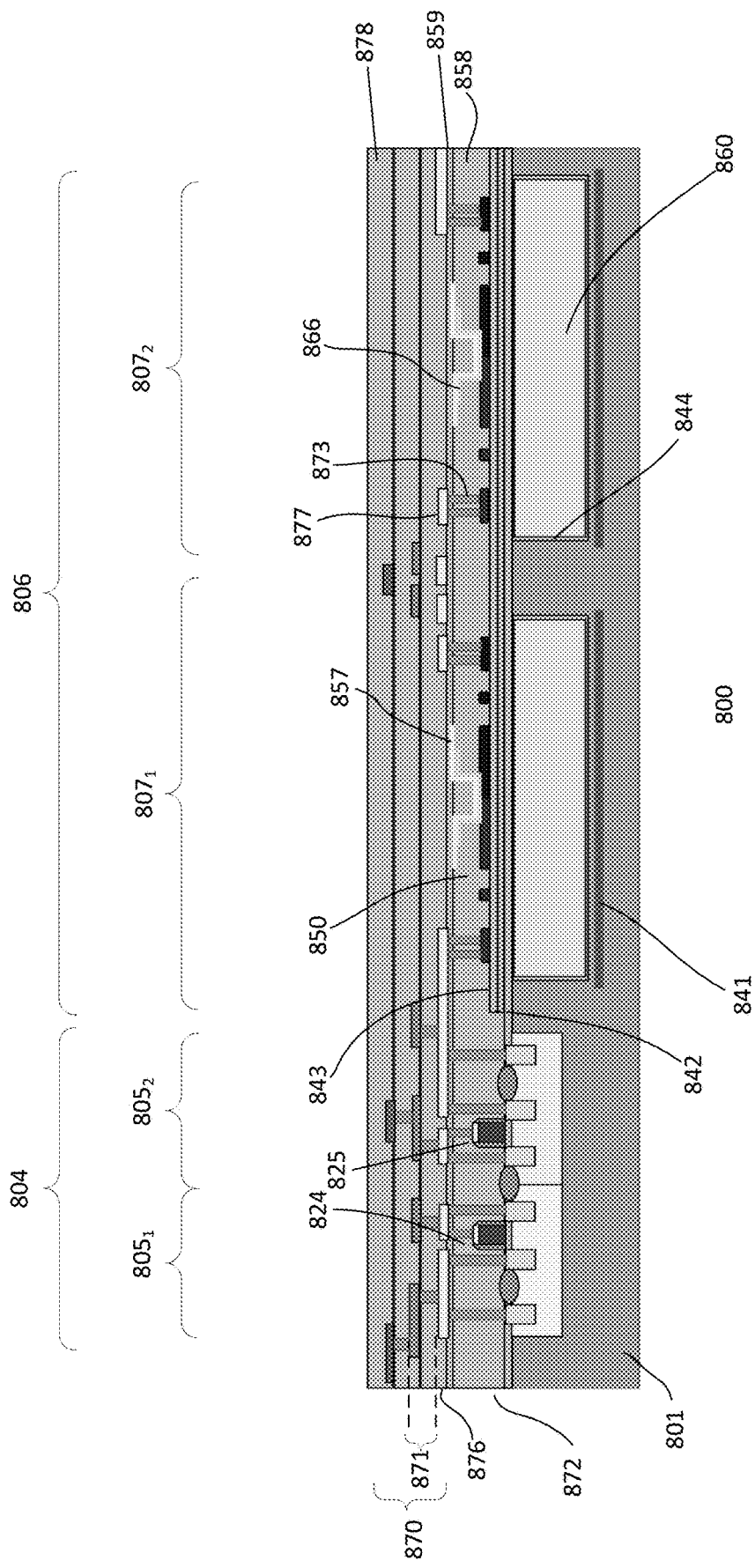
Figure 8J:
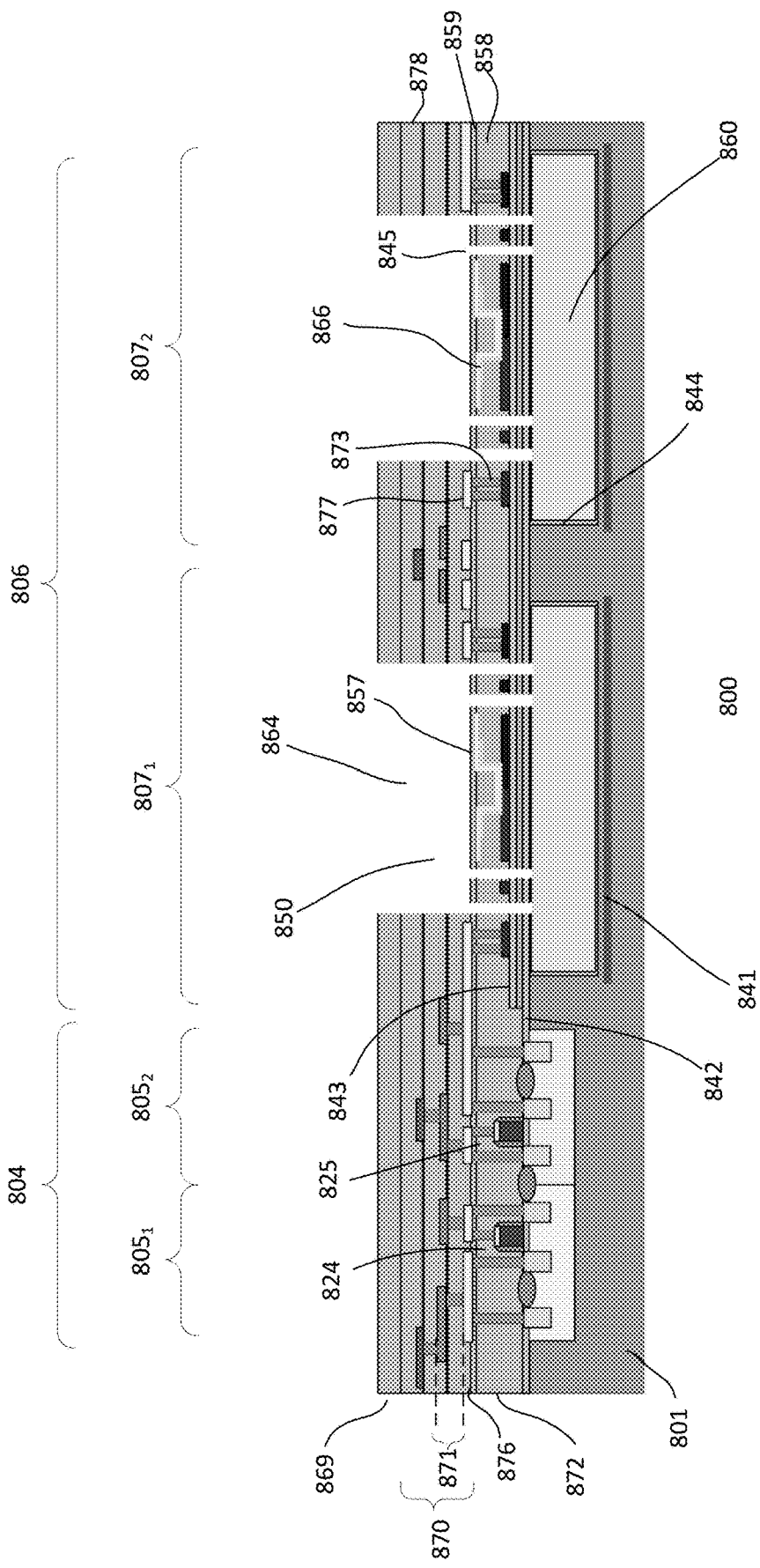
Figure 8K:
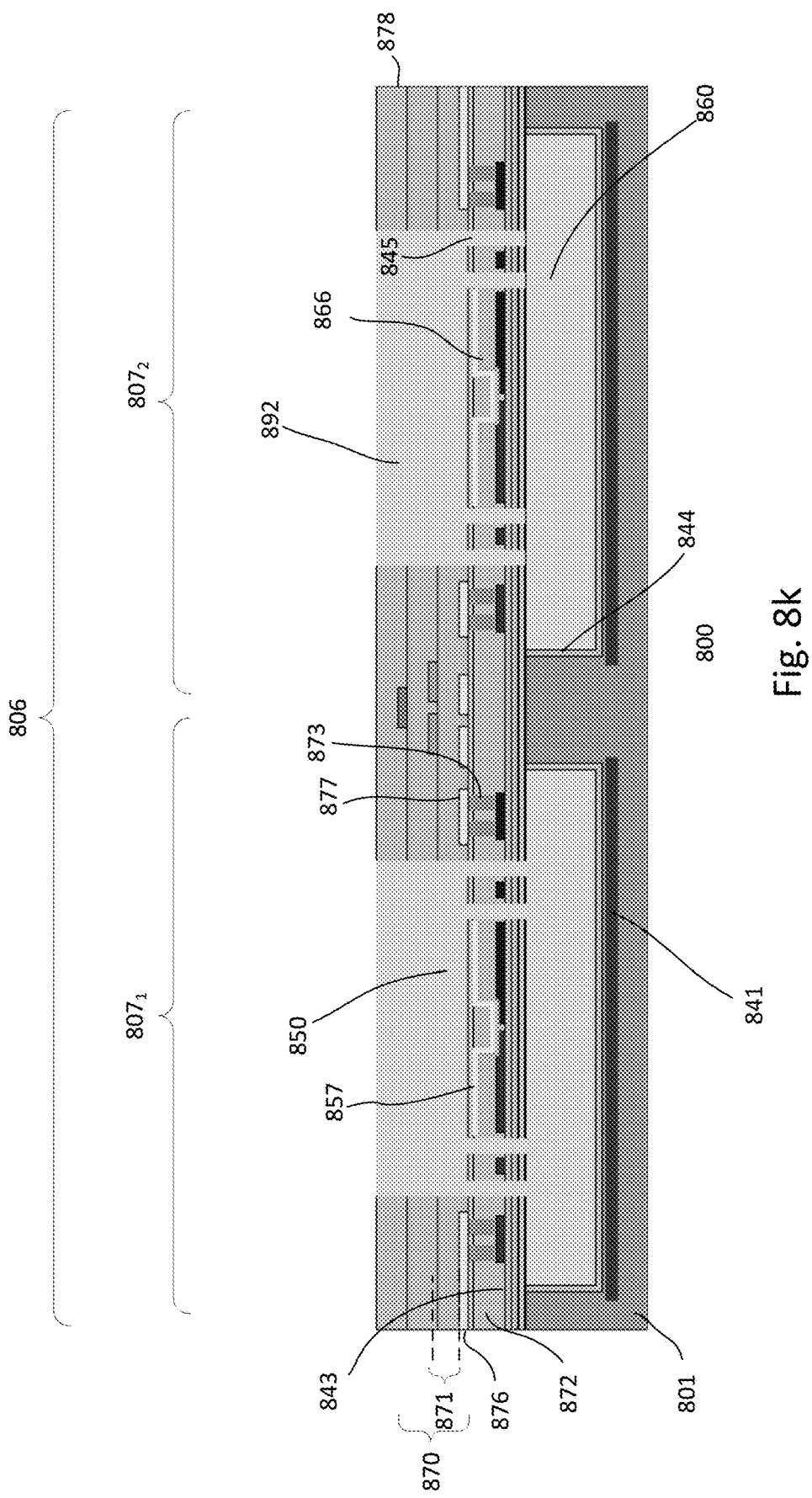
Figure 8L:
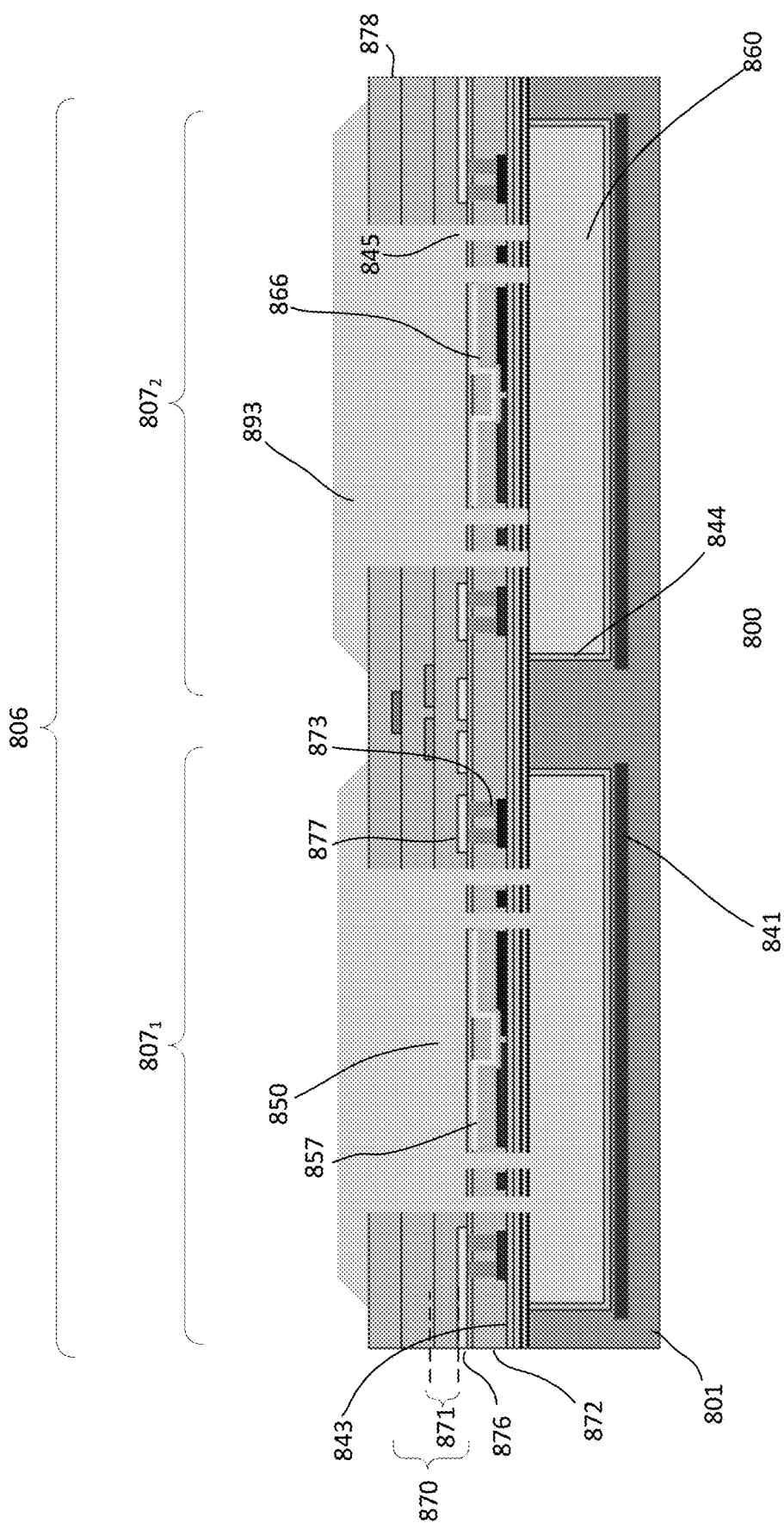
Figure 8M:
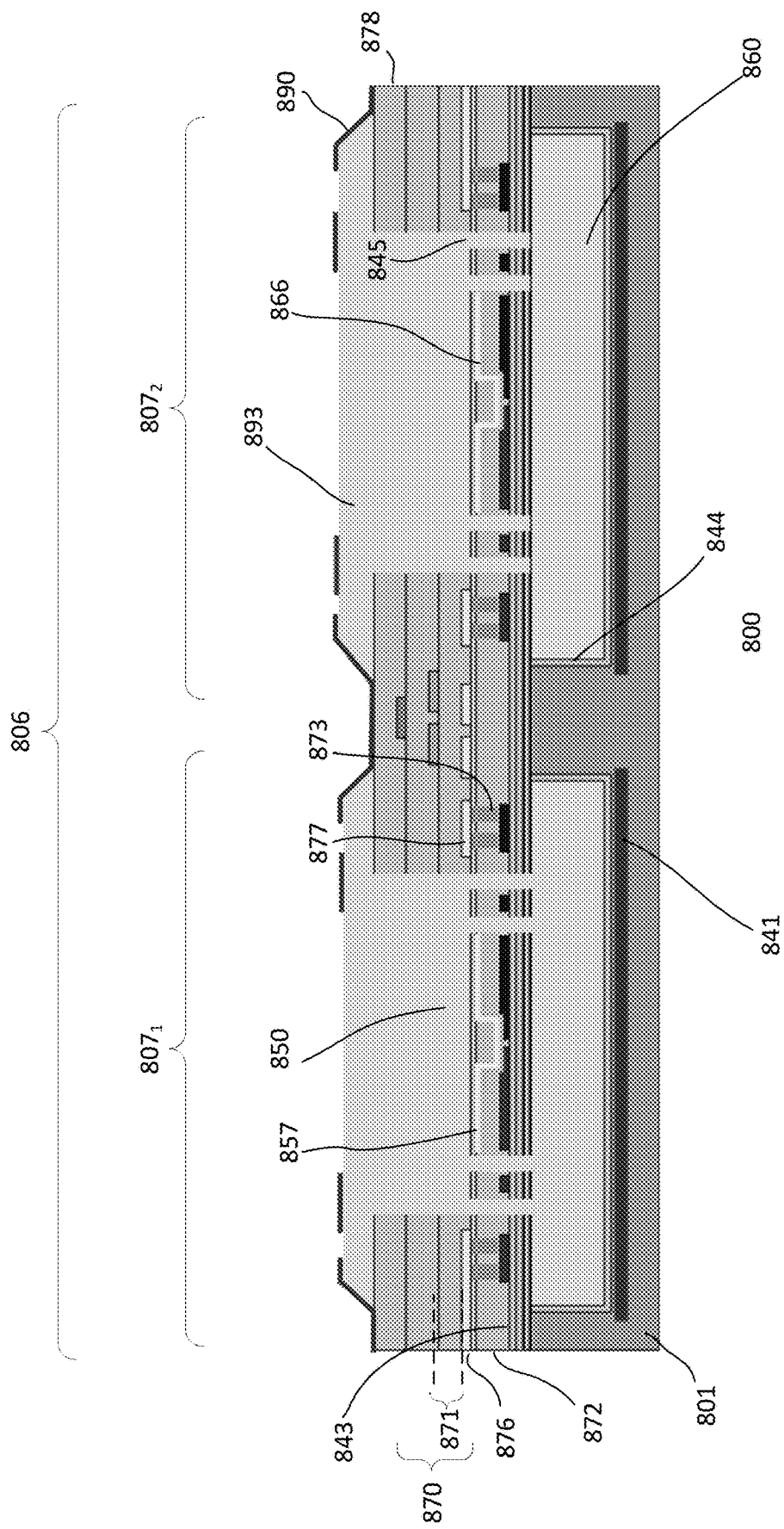
Figure 80:
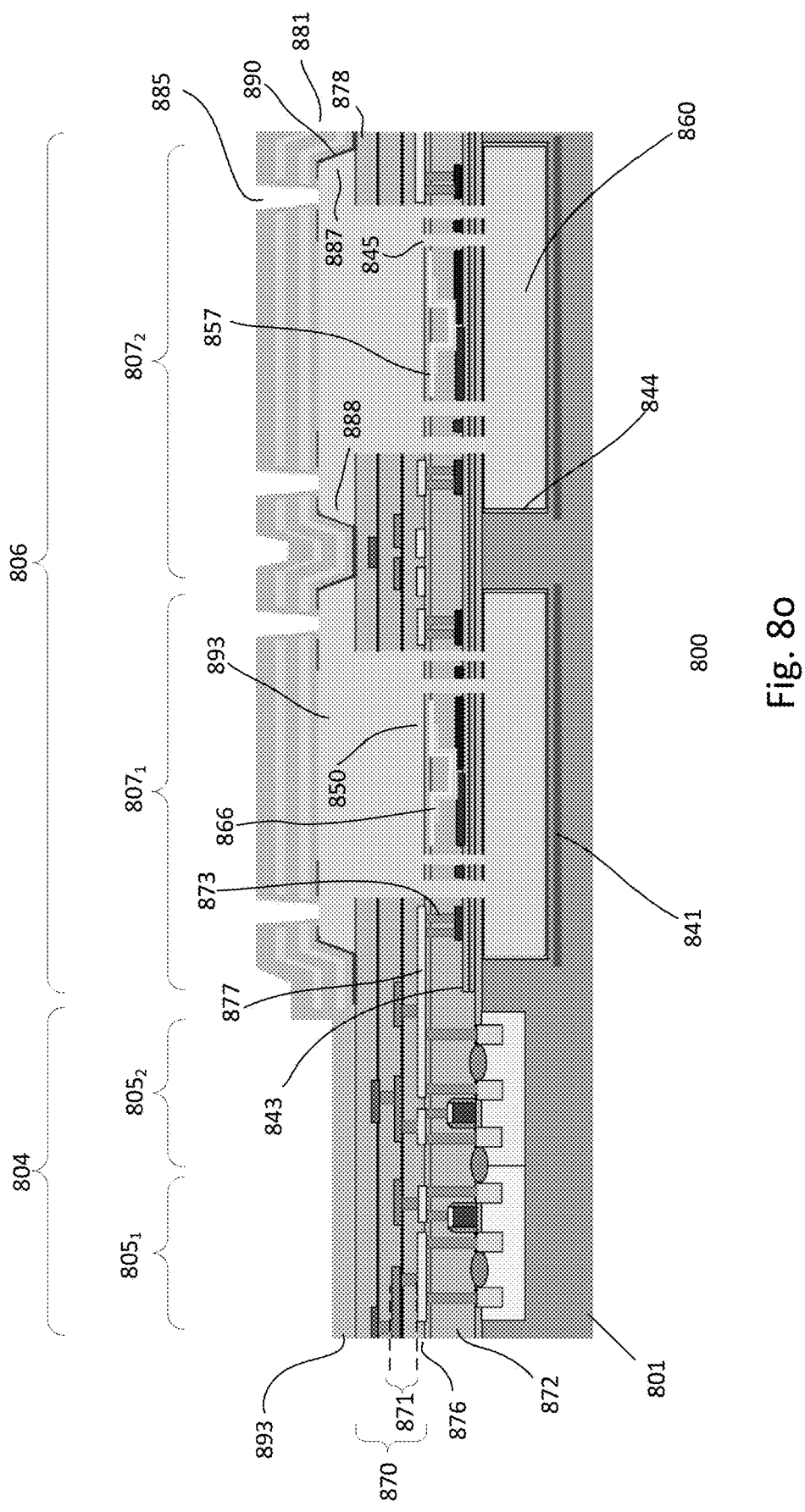
Figure 8P:
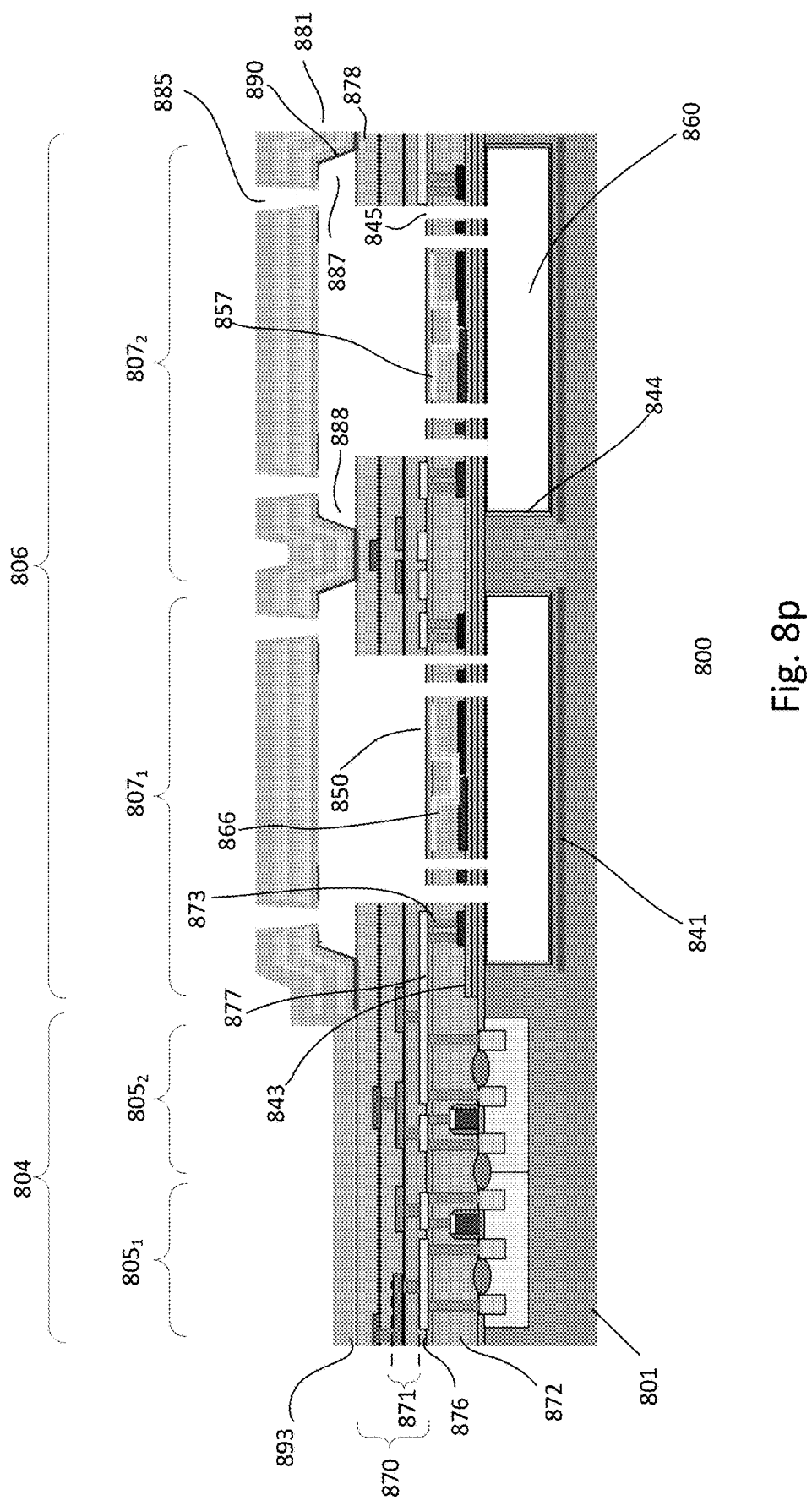
Figure 8Q:
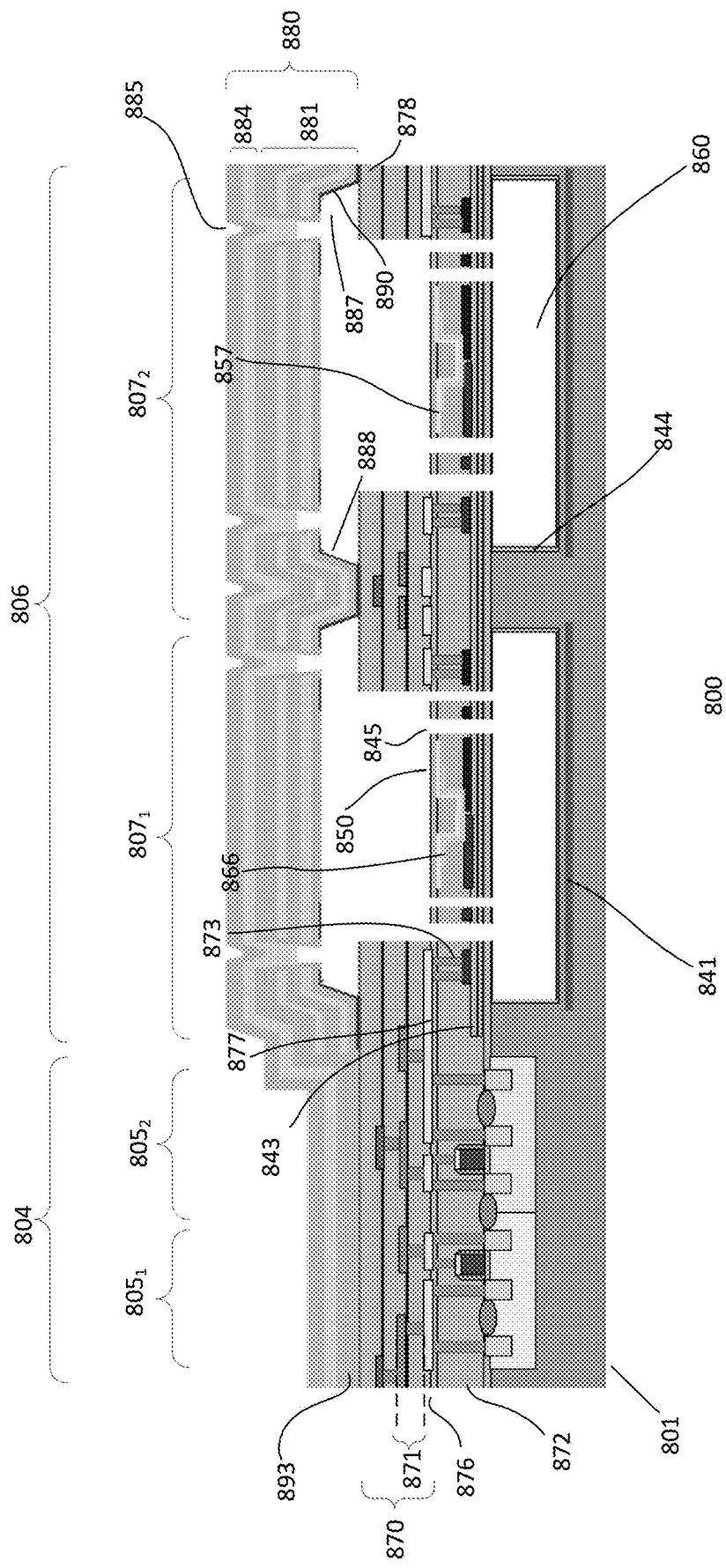
Figure 8R:
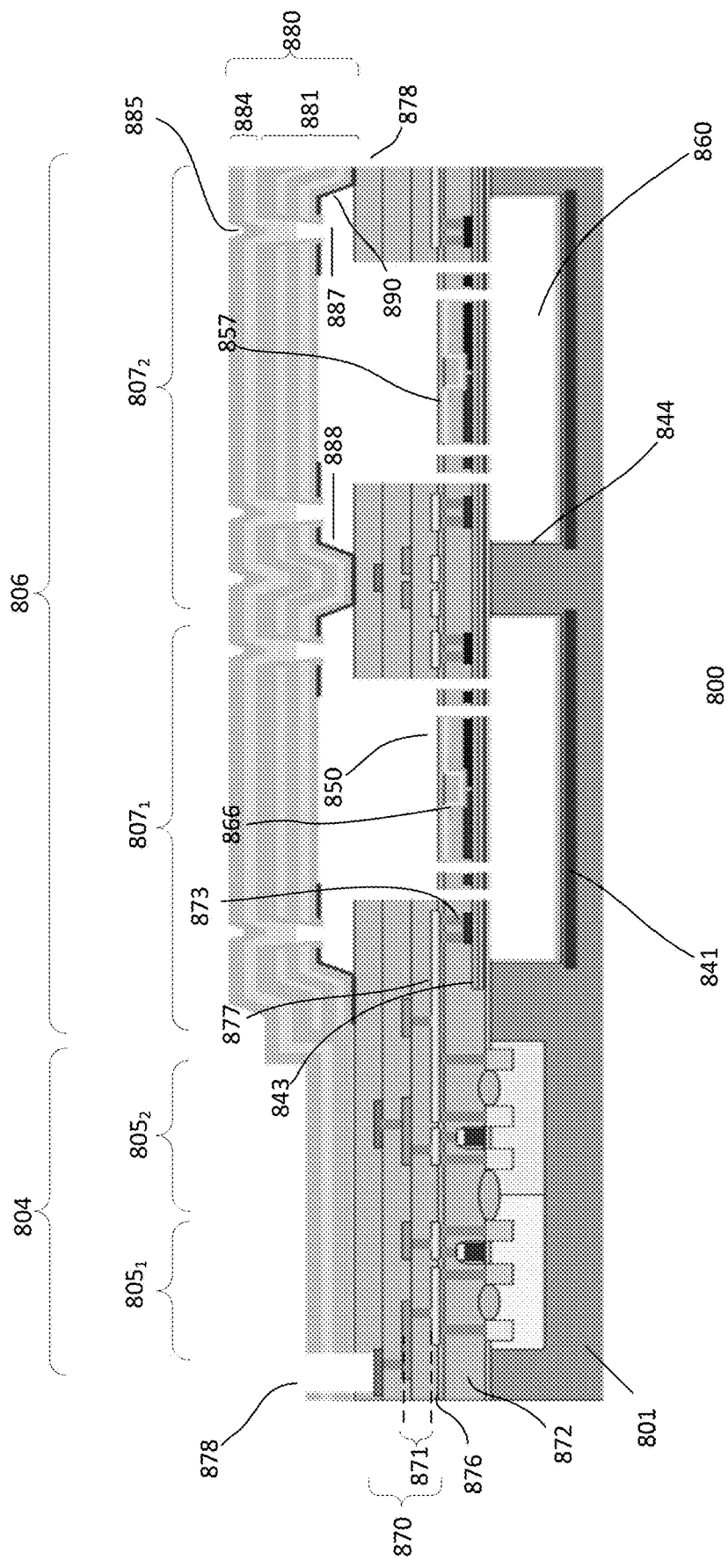

FIGS. 8a-r show simplified cross-sectional views of an embodiment of a process for forming a device 800. The device, for example, is similar to that described in FIG. 2a. Common elements may not be described or described in detail.

Referring to FIG. 8a, a substrate 801 is provided. The substrate, for example, may be a semiconductor substrate, such as a silicon substrate. Other types of substrates or wafers may also be useful. For example, the substrate may be a silicon germanium, germanium, a gallium arsenide, or a crystal-on-insulator (COI) such as silicon-on-insulator (SOI) substrate. The substrate may be a doped substrate. For example, the substrate can be lightly doped with p-type dopants. Providing a substrate with other types of dopants or dopant concentrations, as well as an undoped substrate, may also be useful.

The substrate, as shown, is prepared with first and second device regions 804 and 806. The first region is a CMOS region while the second region is a MEMS region. The CMOS region is configured to include CMOS components and the MEMS region is configured to include one or more MEMS components. As shown, the CMOS region includes first and second CMOS device regions $805_{1-2}$. The first and second CMOS regions may serve as device regions for first and second polarity type MOS transistors. Providing other types or other numbers of CMOS device regions may also be useful As for the MEMS region, as shown, it includes first and second MEMS device regions $807_{1-2}$. A MEMS device region is processed to include a MEMS structure or sensor. In one embodiment the MEMS structure is an IR sensor, as already described. Other types of IR sensors or MEMS structures may also be useful. Providing the MEMS region with other numbers of MEMS device regions may also be useful. For example, the MEMS region may include M×N MEMS device regions for a M×N sensor array The substrate is processed to form lower device cavities 860 for the MEMS device region. For example, a lower device cavity is formed in the substrate for each MEMS device region. The device cavities may be formed by etching the substrate using a mask and etch process. A mask and etch process may employ etching the substrate using a patterned mask with openings corresponding to the lower device cavities. The mask may be a hardmask, such as silicon oxide mask or a soft mask, such as a photoresist mask. The etch, for example, is an anisotropic etch, such as a reactive ion etch (RIE), which etches the substrate to form the lower device cavities.

As shown in FIG. 8b, an IR reflector 841 is formed at the bottom of a lower device cavity. For example, IR reflectors are formed on the bottom of the lower device cavities. In one embodiment, the reflector is a metal silicide layer formed at the bottom of the lower device cavity. The metal silicide reflector may be a titanium silicide ($TiSi_x$), a tungsten silicide ($WSi_x$) or an aluminum silicide ($AlSi_x$) reflector.

To form the metal silicide reflector, a conductive metal layer is formed on the substrate. The conductive metal layer may line the surface of the substrate and bottom of the lower device cavities. In one embodiment, the mask used to form the substrate remains. As such, the conductive metal layer covers the mask on the surface of the substrate. In the case of a photoresist mask, it is removed after depositing the conductive metal layer. This removes the conductive metal layer over the mask, leaving a portion of the conductive metal layer which covers the bottom of first and second lower device cavities. An anneal is performed, causing a reaction between the conductive metal and silicon substrate of the cavity bottom to form the metal silicide layer. In the case of a hardmask, the metal layer over the substrate is not removed. The hard mask prevents the reaction with the substrate. Unreacted metal and the hardmask are removed after the anneal. Removing the unreacted metal and hard mask may be achieved using a first wet etch.

Alternative types of reflectors may also be formed at the bottom of the lower device cavity. In another embodiment, the reflector is a doped region at the bottom of the cavity. For example, an implant may be performed using the mask that forms the lower device cavity. The implant dopes the bottom of the lower device cavity to form the reflector. The reflector dopants may be n-type or p-type. The dopant concentration of the reflector is selected accordingly to reflect IR radiation at a desired degree of reflection. For example, the dopant concentration of the doped reflector layer may be about $10^{21}$ dopants/$cm^3$. The conductive properties of the surface of the doped region are attributed to the high concentration of dopants being applied, thereby enabling the reflection of the incoming IR radiation. After implanting the dopants, the implant mask is removed.

In other embodiments, the reflector may be a non-conductive reflector, such as a photonic crystal reflector. For example, a photonic crystal layer is formed by etching the surface of the lower device cavity. The photonic crystal layer may include a grating pattern configured to reflect incident IR radiation. For example, different grating patterns of varying depths may be etched from the surface of the photonic crystal layer to adjust the wavelengths and properties of the reflected IR radiation. The photonic crystal layer may include a grating pattern configured to reflect incident radiation. Forming other types of reflectors may also be useful.

Referring to FIG. 8c, after forming the reflector, a reflector protective liner 844 is formed on the substrate. For example, the protective liner serves to protect the reflector from etchants, such as $XeF_2$, used in a release process to form the lower device cavities. The protective liner, in one embodiment, is a silicon oxide liner. Other types of protective liners may also be used. The protective liner may be formed by, for example, chemical vapor deposition (CVD). The protective liner lines the substrate as well as the sides and bottom of the first and second lower device cavities, covering the first and second reflectors.

A sacrificial layer 861 is formed on the substrate. The sacrificial layer covers the substrate and fills the lower device cavities. The sacrificial layer can be removed selectively without damaging the protective liner. In one embodiment, the sacrificial layer is an amorphous silicon layer. Other types of sacrificial materials may also be useful to serve as the sacrificial layer. The sacrificial layer may be formed by CVD. Excess sacrificial material over the substrate is removed. For example, a planarizing process, such as a chemical mechanical polish (CMP) is employed to remove the excess sacrificial material. In one embodiment, the CMP removes excess sacrificial material as well as the protective liner covering the substrate surface. The CMP forms a planar top surface on the substrate and sacrificial layer in the cavity. Other types of planarizing processes may also be useful. For example, etch back processes using mask or masks may also be useful.

A dielectric layer 842 is formed on the substrate. The dielectric may be a silicon oxide layer. Other types of dielectric layer may also be formed. The dielectric layer is patterned, leaving it remaining over the MEMS region. For example, the dielectric layer covers the lower device cavities, protecting the MEMS region while the CMOS region is processed. The dielectric layer also defines a top of the lower device cavities and serves as membranes or at least a part of the membranes for MEMS sensors. The dielectric layer may be formed by CVD and patterned using mask and etch processes.

Referring to FIG. 8d, the CMOS region is processed. For example, front-end-of-line (FEOL) processing is performed on the substrate. The CMOS region of the substrate is processed to form a first polarity type transistor 824 in a first CMOS device region $805_1$ and a second polarity type transistor 825 in a second CMOS device region $805_2$.

In one embodiment, first and second transistor wells are formed in the first and second transistor regions. The first transistor well may be a p-type well for an n-type MOS transistor and the second transistor well may be an n-type well for a p-type MOS transistor. The wells, for example, may be formed by ion implantation using an implant mask. The implant mask may be a photoresist implant mask patterned to provide openings for the implant regions. Separate implant processes are employed for forming p-type and n-type wells.

Isolation regions may be formed on the substrate to isolate the different regions of the substrate. The isolation regions, for example, may also be provided for well contact regions. The isolation regions, for example, are field oxide (FOX) isolation regions. The FOX regions may be formed by selective thermal oxidation of the substrate using a nitride mask. Other types of isolation regions may also be useful. For example, the isolation regions may be shallow trench isolation (STI) regions. The STI regions are trenches formed in the substrate and are filled with dielectric material, such as silicon oxide. The STI regions may have a coplanar top surface with the substrate produced by CMP. In one embodiment, the STI regions are formed prior to dopant implantation so as to prevent the doping of the silicon from influencing their growth.

Gate layers are formed on the substrate. In one embodiment, the gate layer includes a gate dielectric layer and a gate electrode layer. The gate dielectric layer may be a thermal oxide layer while the gate electrode layer may be a polysilicon layer. The gate electrode layer may be formed by CVD. The gate electrode layer, for example, covers the substrate in the CMOS and MEMS regions. The gate electrode layer is patterned to form gates in the transistor regions. Patterning the gate electrode layer may be achieved using mask and etch techniques. For example, the gate electrode layer is patterned by RIE using a patterned resist mask. A gate includes a gate electrode over a gate dielectric.

In one embodiment, the gate electrode layer is patterned to form gates in the transistor regions and MEMS structures in the MEMS device regions. The MEMS structures may be configured to form a plurality of IR sensors in a sensor array. The MEMS structures may be thermopile structures which serve as thermoelectric sensors, as described in FIGS. 7a-e. Other types of MEMS structures may also be useful.

In the process of forming the MEMS structures, one or more dielectric layers or 843 may be formed over the MEMS region and patterned to serve as the membrane. The additional layer or layers may be part of the process or intentionally added. As shown, the membrane is a continuous membrane for the MEMS device region. Other configurations of the membrane may also be useful. For example, the dielectric layers may be patterned to form individual membranes for each MEMS device region.

In alternative embodiments, the MEMS structures are formed with a separate process. For example, the MEMS structures may be formed before or after forming the gates. In such a case, a MEMS structure layer is formed on the substrate and patterned to form the line structures. The MEMS structure layer may be polysilicon. Other types of MEMS structure layers may also be useful. For example, the MEMS structure layer may be silicon germanium (SiGe), gallium nitride (GaN) or a 2D material, such as graphene, black phosphorus or molysulfide.

In the case that separate processes are used to form the MEMS structures, the CMOS region may be protected by a hardmask layer. The hardmask layer, for example, may be a dielectric layer, such as silicon oxide or silicon nitride layer. The hardmask layer may be patterned to expose the MEMS region, leaving the CMOS region protected. The hard mask layer may serve as an etch stop layer. Other types of hardmask layers may also be useful. The hardmask layer enables the MEMS structure layer to be patterned in the MEMS region while protecting the CMOS region. After forming the MEMS structure, the hard mask layer may be removed.

Source/drain (S/D) regions for the transistors are formed adjacent to the gates. The S/D regions are heavily doped regions. For example, the first transistor includes heavily doped n-type S/D regions while the second transistor includes heavily doped p-type S/D regions. Well taps may also be formed when the S/D regions are formed. Lightly doped extension regions may be provided for the S/D regions. Dielectric sidewall spacers may be formed on sidewalls of the gates to facilitate the formation of the lightly doped extension regions.

In one embodiment, lightly doped extension regions are formed adjacent to gates. P-type lightly doped extension regions are formed adjacent to the gate of the p-type transistor and n-type lightly doped extension regions are formed adjacent to the gate of the n-type transistor. Separate implants may be employed to form different types of lightly doped extension regions using implant masks, such as photoresist masks.

After forming the extension regions, a spacer dielectric layer is formed on the substrate. The spacer dielectric layer may be a silicon oxide layer. Other types of spacer dielectric layers may also be useful. An anisotropic etch is performed, removing horizontal portions of the spacer dielectric layer, leaving spacers on sidewalls of the gate. P-type S/D regions are formed adjacent to the gate of the p-type transistor and n-type S/D regions are formed adjacent to the gate of the n-type transistor. Separate implants may be employed to form different types of S/D regions using implant masks, such as photoresist masks.

In one embodiment, the implants to form the S/D regions are also employed to form the doped segments of the line structure. For example, the p-type implant to form p-type S/D regions also forms the p-type segment of the line structure and the n-type implant to form n-type S/D regions also forms the n-type segment of the line structure. Forming the doped segments of the line structure using separate implants from those used to form S/D regions may also be useful.

In other embodiments, stacked line units may be formed in the MEMS region, as previously discussed. Forming the stacked line units may be separated from the processes to form CMOS components (CMOS processes). Partially or fully incorporating the CMOS processes for forming the stacked line units may also be useful. This, for example, may depend on the CMOS process employed. Other configuration of forming the CMOS components and MEMS structure may also be useful.

Metal silicide contacts may be formed on the substrate. For example, metal silicide contacts may be formed on the S/D regions, gates and well contacts. A metal layer, such as Ti, W or Al, may be deposited on the substrate and annealed to cause a reaction between the metal and silicon to form metal silicide contacts. Unreacted metal is removed by, for example, a wet etch, leaving the metal silicide contacts.

In FIG. 8e, an ILD level is formed over the substrate. The ILD level includes disposing a first dielectric layer 858 over the substrate. In one embodiment, the dielectric layer covers the CMOS and MEMS regions. For example, the dielectric layer covers the transistors and MEMS structures. The dielectric layer serves as part of the first via or contact level of the ILD level. The dielectric layer may be silicon oxide formed by CVD. Other types of dielectric layers may also be useful. A polishing process, such as CMP, is performed to produce a planar top surface of the dielectric layer. The planar top surface is above the sensor and transistors. Providing any other planarization techniques such as spin-on-glass (SOG) to fill the gaps or planarize the surface of the substrate may also be useful.

Referring to FIG. 8f, thermocouple contact 866 is formed. A contact is configured to couple the first and second segments of a line structure. For example, the contact forms a thermo-coupler, coupling the line segments of the line structures 850 which is disposed on the membrane 843 above the lower device cavities. Forming the contacts may include forming via openings in the dielectric layer. The via openings expose the first and second line segments of the line structures. A metal contact layer is deposited on the substrate. The metal contact layer, for example, may be titanium (Ti) or aluminum (Al). The metal layer is patterned to form the contacts. As shown, the contacts line the via openings and cover a portion of the top surface of the dielectric layer adjacent to the via openings.

In FIG. 8g, the forming of the ILD continues with an absorber layer deposited on the substrate. The absorber layer covers the dielectric layer and the thermo-couplers. In one embodiment, the absorber layer is a TiN or NiCr absorber layer. Other types of absorber layers may also be useful. The absorber layer may be formed by, for example, sputtering. The absorber layer may be formed using other techniques. In one embodiment, for example, the thickness of the absorber is adjusted to form a layer having a sheet resistance of about 377 Ohm/sq. Providing any other thicknesses and sheet resistance for the absorber may also be useful. The absorber layer is patterned to form absorbers 857 over the thermopile structures in the MEMS regions. Patterning the absorber may be achieved by mask and etch techniques.

A second dielectric layer 859 is formed as part of the ILD level. The second dielectric layer 859 is formed over the substrate, the dielectric layer covers the absorbers and the first dielectric layer 858. The second dielectric layer also fills the openings over the absorber layer. The second dielectric layer, for example, is silicon oxide formed by CVD. The second dielectric layer serves as the upper portion of the first via layer of the ILD level. A dielectric layer may be deposited, filling the openings created by the contacts lining the via openings. A planarization process, such as CMP may be performed to provide a planar top surface between the top of the absorbers and the second dielectric layer.

As described, an array of single line structures is formed. The process can be employed to form multiple line structures stacked and coupled in series to form stacked line structures, such as previously described. For example, additional line structure layers using doping, dielectric layers and dopant implants may be performed. In addition, stacked line structures may be formed to provide an array of sensors, as described in FIG. 7e. Forming other types of MEMS structures may also be useful. The first and second dielectric layers, for example, serve as the first contact or via dielectric level 872 of the ILD level.

As shown, in FIG. 8h, the process includes forming contacts 873 in the first via dielectric level 872. The contacts are coupled to the various terminals in the CMOS and MEMS regions. For example, the contacts are coupled to the S/D regions, gates and well contacts. In addition, contacts 873 are provided for the MEMS structures or sensor terminals. The contacts may be tungsten contacts. Other types of contacts may also be useful. The contacts, for example, are formed by a single damascene technique. The single damascene technique includes forming vias, filling the vias with a contact layer, and polishing, such as CMP, to remove excess contact material. Forming contacts using other techniques may also be useful.

In FIG. 8i, the BEOL process commences. In one embodiment, the BEOL dielectric 870 with metal levels and IMD levels 871 are formed. For example, the first metal level 876 with metal lines 877 is formed over the IDL level. The first IMD level, as well as additional IMD levels, are subsequently formed above the first metal level. As discussed, a via dielectric level includes via contacts 873 and a metal dielectric level includes metal lines 877. The metal lines and vias form interconnections of the device. As shown, the BEOL dielectric includes 2 IMD levels. Other numbers of IMD levels may be provided for the BEOL dielectric. The uppermost metal level includes bond pads and serves as a pad level. A passivation layer 878 is formed over the uppermost metal or pad level. The passivation layer, for example, is silicon nitride. In some embodiments, the passivation layer may be a passivation stack having multiple passivation layers. For example, the passivation stack may include silicon oxide and silicon nitride layers. Other types of passivation layers may also be useful. The passivation layer may be formed by CVD.

Referring to FIG. 8j, the BEOL dielectric is patterned to form BEOL cavities 864 in the MEMS device regions to expose the sensors 850 and lower device cavity release openings 845 through, for example, the first via level dielectric and membrane. A two-step process may be employed. For example, the first process forms the lower device cavity release openings while the second process forms the BEOL cavities. The processes are performed using mask and etch techniques. Other configurations of forming the lower device cavity release openings and BEOL cavities may also be useful.

In one embodiment, an etch mask, such as photoresist, is processed to define openings in the BEOL dielectric for the lower device cavity release openings. An RIE etches through the BEOL and defines lower device cavity openings in the first contact level dielectric and membrane. After defining the lower device cavity release openings, the etch mask is removed. Another etch mask is formed on the substrate. The second etch mask is processed defines openings for the BEOL cavity. An RIE is performed to form the BEOL cavities.

The BEOL cavities serve as lower portions of the upper device cavities. In one embodiment, an etch mask 869, such as a photoresist layer, is formed over the BEOL dielectric. The photoresist layer is patterned to provide an opening corresponding to the BEOL cavities. An RIE is performed to etch the BEOL dielectric layer, forming the BEOL cavities. As shown, the BEOL dielectric material in the MEMS device regions is removed to expose the sensors. The BEOL cavities are separated by the BEOL, forming individual BEOL cavities for the MEMS device regions. The cavities may have a rectangular-shaped opening. In one embodiment, the BEOL cavities have vertical sidewalls defined by the mask. It is understood that the cavity sidewalls may not be exactly vertical due to etch process conditions. Furthermore, the etch process can be tuned to form slanted sidewalls. For example, the etch can be tuned to deposit polymer from the resist on sidewalls as the etch continues, forming slanted sidewalls.

In an alternative embodiment, the BEOL cavities openings may have a sidewall profile facilitated by the metal patterns in the IMD levels. The sidewall profile of the cavities may be a stepped profile. Other types of profiles may also be useful. The profile, for example, may be defined by metal rings in the various layers of the BEOL dielectric. The metal rings, for example, are rectangular-shaped metal rings and may be configured to be continuously smaller from top to down, forming a stepped profile. Other profiles may also be useful. The metal rings may be formed in metal levels, ring levels or a combination thereof. For example, an etch mask is used to form the BEOL cavities, with the metal patterns in the IMD levels defining the BEOL cavity profiles.

As shown in FIG. 8k, the cross-sectional view of the MEMS region 806 is shown for simplicity. The etch mask is removed after forming the BEOL cavities. In one embodiment, a first BEOL sacrificial layer 892 is formed over the dielectric layer and fills the BEOL cavities and covers the BEOL dielectric. The sacrificial layer may be the same as the sacrificial layer filling the lower device cavities. For example, the sacrificial layer may be an amorphous silicon (α-silicon) layer. Other types of sacrificial materials may also be used for the sacrificial layer which can be removed selectively to the BEOL dielectric. The sacrificial layer may be formed by CVD. Excess sacrificial material over the substrate is removed. For example, a planarizing process, such as a chemical mechanical polish (CMP), is employed to remove the excess sacrificial material. Employing other planarizing techniques may also be useful. The planarizing process forms a planar surface between the sacrificial layer and BEOL dielectric.

In FIG. 8*l*, a second or additional BEOL sacrificial layer 893 is formed over the substrate. The second BEOL sacrificial layer may be patterned to shape the upper portion of the upper device cavity. As shown, the additional BEOL sacrificial layer is patterned to form individual micro-casings for the MEMS device regions, as previously described. Patterning the additional BEOL sacrificial layer to form openings in the micro-casings, creating a homogenized vacuum level for the device regions as previously described, may also be useful.

In one embodiment, the sacrificial layer of FIG. 8*k* may overfill sufficiently and planarize to leave additional sacrificial material which serves as the additional sacrificial layer. This avoids an additional deposition process to form the additional sacrificial layer. In another embodiment, the sacrificial layer is not planarized, producing a cavity profile as shown in FIG. 2*b*.

Referring to FIG. 8*m*, a getter layer 890 is deposited on the substrate, covering the BEOL dielectric and sacrificial layer. The getter, for example, may be zirconium (Zr) alloys, titanium (Ti), nickel (Ni), aluminum (Al), barium (Ba) or magnesium (Mg). Other types of getter materials such as rare earth element including cerium (Ce), lanthanum (La), thorium (Th) or Uranium (U) may also be useful. The getter absorbs moisture and outgassing within the encapsulated device and thereby facilitates the maintenance of the integrity of the vacuum in the cavity, improving reliability. The getter layer, for example, is non-IR transparent. As such, the getter layer is patterned to allow IR to penetrate through the cap to the IR sensor. For example, the getter layer may be patterned to cover the periphery of the MEMS device regions, including sides and bottom of the bearing walls while leaving the sensor and release openings exposed. Other various patterns for the getter, as previously described, are also useful.

In one embodiment, the MEMS region includes one or more blind pixels along with one or more active pixels for sensing IR radiation. A blind pixel, for example, serves as a reference pixel for calibration purposes. This minimizes calibration errors. The blind pixel, for example, may be created by leaving the getter layer unpatterned, preventing transmission of IR to the sensor. To further ensure zero transmission of IR to the sensor, a reflective metal layer, such as Al, can be deposited and patterned to remain over the blind pixel device region. In one embodiment, the blind pixels may be disposed at the boundary of the active pixel or pixel array. For example, the MEMS region may include active device regions with unblinded pixels and inactive device regions with blinded pixels at the boundary of the active device regions. The inactive device region may include a single blind pixel or a line array of blind pixels.

In FIG. 8*n*, the process of forming a CMOS compatible IR transparent cap commences. The CMOS transparent cap is configured to transmit IR radiation within the wavelength range of 8-14 μm. The CMOS cap covers the device 800. For example, the CMOS cap covers the CMOS region and encapsulates the MEMS region 806. The process, as shown, forms a lower portion 882 of a base cap. The lower portion, in one embodiment, includes a plurality of IR transparent layers. Providing other numbers of IR transparent layers, including 1, is also useful. Infrared transparent layers may include, for example, $SiO_2$ and αSi. Other types of IR transparent layers, such as polysilicon (Si), germanium (Ge), silicon-germanium (SiGe) or zinc sulfide (ZnS), may also be useful. Providing IR transparent layers which can be deposited at a temperature compatible with the BEOL process may be useful.

In one embodiment, the lower portion of the base cap includes alternating IR transparent layers. Preferably, the bottom IR transparent layer which contacts the BEOL dielectric is etch-resistant to, for example a release etchant such as $XeF_2$. The bottom layer, for example, may be $SiO_2$. Other types of bottom layers may also be useful. In one embodiment, the lower portion includes alternating $SiO_2$ and αSi layers, with $SiO_2$ as the bottom layer. In one embodiment, the lower portion of the base cap includes 4 alternating IR transparent layers, forming a $SiO_2$/αSi/$SiO_2$/αSi stack. The IR transparent layers may be formed by CVD.

As shown, the sacrificial layer is configured to form a cap in which the base cap forms outer and inner bearing walls, 887 and 888 respectively, creating micro-casings for each MEMS device region. The sacrificial layer can be configured to form a cap in which the base cap only forms the outer bearing walls while the seal cap forms inner bearing walls through the release openings, as shown in FIGS. 3*a*-*b*. This can be configured to form micro-casings for each MEMS device region or include channels between neighboring pixels which create homogeneous vacuum level across the array of MEMS device regions, as shown in FIGS. 6*a*-*d*.

After forming the lower portion of the base cap, it is patterned. In one embodiment, the base cap is patterned to form release openings 885. In one embodiment, the patterning also removes lower portions of the base cap from the CMOS region. For example, having a lower portion of the base cap which is local to the MEMS region. Patterning the lower portion of the base cap can be achieved using mask and etch techniques. For example, a photoresist mask is exposed with an exposure source through a reticle. The pattern of the reticle is transferred to the resist layer, forming an etch mask. An RIE etches the lower portion of the cap, removing portions exposed by the resist mask.

In FIG. 8*o*, a dielectric layer 893 is formed on the substrate, covering the CMOS region and lower portion of the base cap in the MEMS region, including lining the release openings. The dielectric layer forms the fifth layer of the base cap. For example, the dielectric layer forms an upper portion of the base cap, completing the base cap 881. In one embodiment, the dielectric layer is a $SiO_2$ layer, forming a $SiO_2$/αSi/$SiO_2$/αSi/$SiO_2$ base cap stack.

The base cap is patterned to remove the dielectric layer lining the bottom of the release openings. Patterning the dielectric layer may employ mask and etch processes. Opening the release windows exposes the sacrificial layer in the upper device cavities.

As previously discussed, the base cap may be configured to have various numbers of layers. For example, the base cap may be configured to have 3 layers, such as a $SiO_2$/αSi/$SiO_2$ stack. In another embodiment, the base cap may be configured with a single layer. The single layer may include any type of an IR transparent layer which is resistant to the etchant used. In such cases, the single layer serves as the base cap.

In FIG. 8*p*, after opening the release openings, the substrate is subjected to a release process. The release process removes the sacrificial fill in the upper and lower device cavities through release openings 845 in the membrane. This exposes the MEMS structures on the membrane and reflectors at the bottom of the lower device cavities. In one embodiment, the release process includes a dry etch to remove the sacrificial fill. The etchant etches the sacrificial layer with a high etch rate compared to the BEOL dielectric as well as the protective layer over the reflector. For example, the etchant is highly selective to metal and silicon oxide. In one embodiment, a xenon difluoride ($XeF_2$) etchant is employed for the release process. Other etchants, such as anisotropic sulfur hexafluoride ($SF_6$) etchant, may also be used to perform the release process.

Referring to FIG. 8q, a seal cap 884 is formed over the base cap. The seal cap, for example, may include a plurality of IR transparent layers. Providing a seal cap with a single layer may also be useful. In one embodiment, the seal cap includes an $\alpha Si/SiO_2$ stack, forming a $SiO_2/\alpha Si/SiO_2/\alpha Si/SiO_2/\alpha Si/SiO_2$ cap stack. The seal cap seals the release openings, forming a vacuum within the MEMS region. As discussed, the cap can be structured to form micro-casings, each with its own vacuum, or partial micro-casings with a homogenous vacuum level across the array.

In FIG. 8r, the process forms pad openings 878 to expose pads in the pad level. For example, pad openings are formed through the cap and passivation layer at the CMOS region. Pad openings may be formed by mask and etch processes. For example, a resist layer is formed over an anti-reflective coating (ARC). The ARC, for example, may be employed to minimize IR reflection from the cap. The ARC, for example, may be an ARC stack with a plurality of dielectric layers configured to minimize IR reflection from the cap. The resist is exposed with an exposure source through a reticle. After development, the pattern on the reticle is transferred to the resist, creating an etch mask. An RIE is performed using the etch masks to form the pad openings. Although one pad opening is shown, it is understood that there may be a plurality of pad openings. Furthermore, the pad openings may be distributed on the device outside of the MEMS region.

As discussed, there may be different configurations of the base and seal caps. The base cap may have a plurality of layers or a single layer. Similar to the base cap, the seal cap can have a plurality of layers or a single layer. The seal cap may have the same or a different layer from the top base cap layer. For example, in the case of a single base cap layer and a single seal cap layer, the cap may be an IR transparent layer. The IR transparent layer may be any IR transparent layer which is resistant to the etchant. In some cases, the ARC can serve as a seal cap or remain over the seal cap and become part of the seal cap.

Figure 8S:
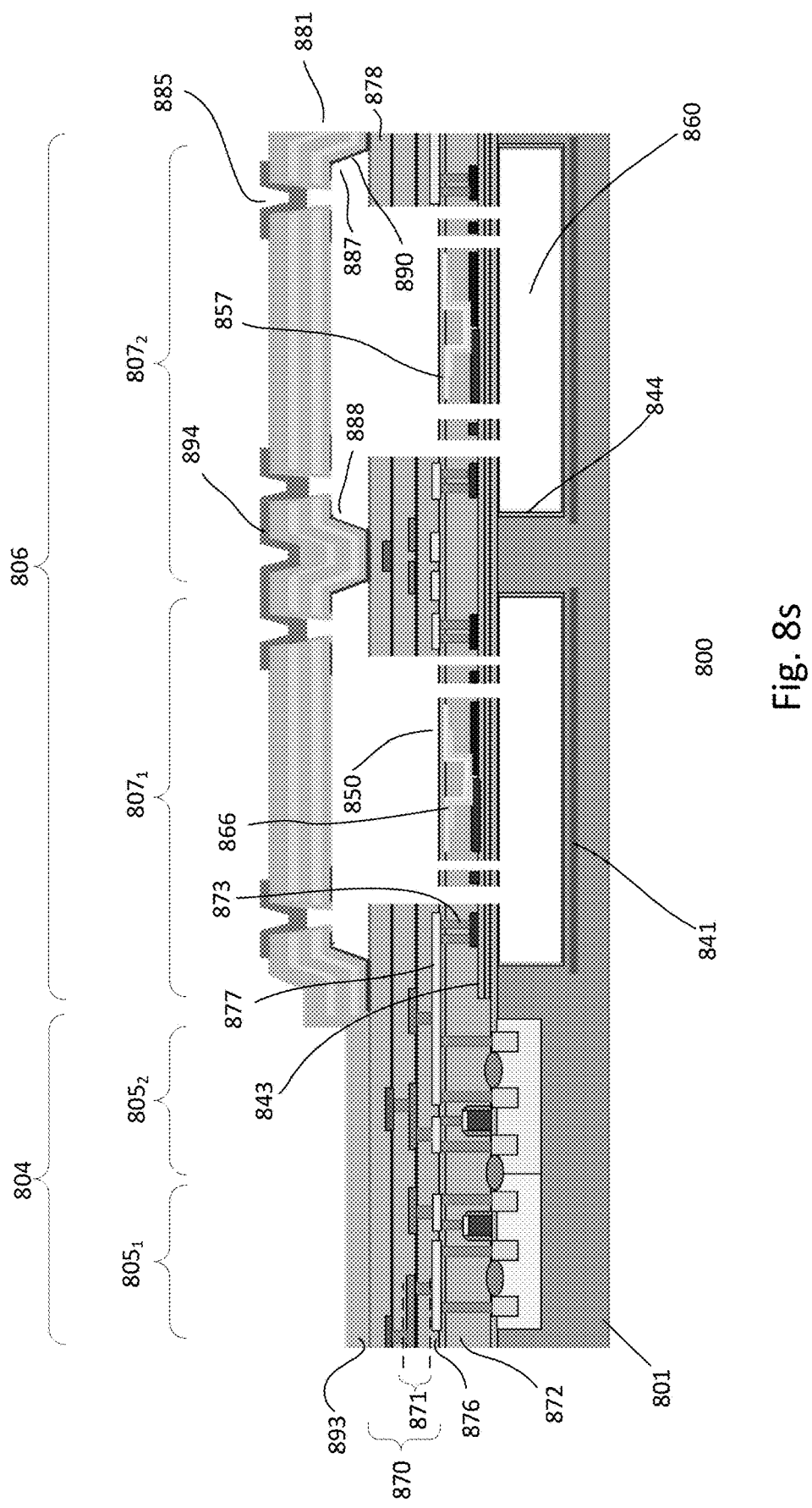
Figure 8T:
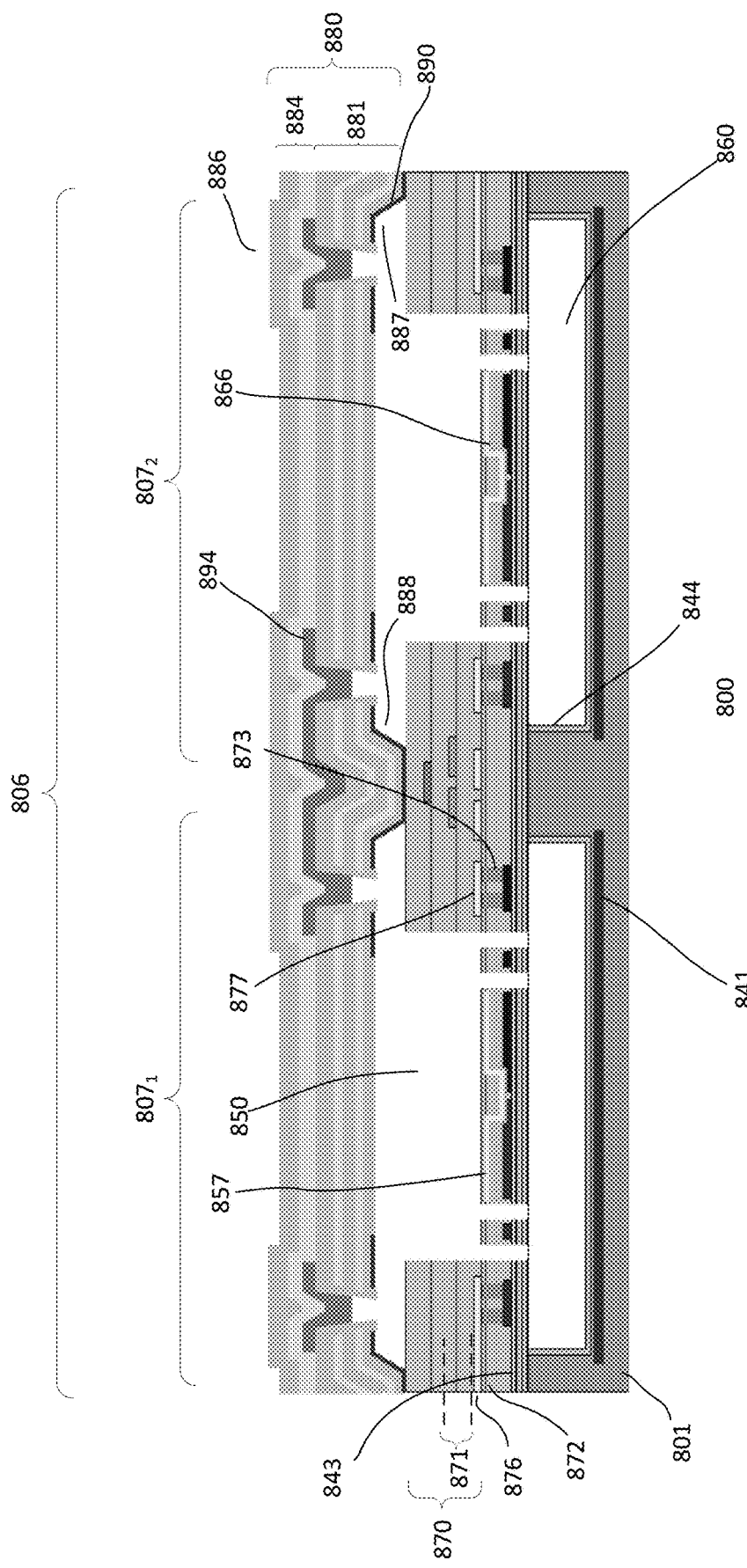

FIGS. 8s-t show an alternative process 800 for forming a device. Referring to FIG. 8s, it is at the stage of processing similar to that described in FIG. 8p. Common elements may not be described or described in detail. As shown, a base cap 881 is formed over the device, the base cap includes a top base cap layer 893 which covers the CMOS and MEMS regions. In one embodiment, the base cap includes a $SiO_2/\alpha Si/SiO_2/\alpha Si/SiO_2$ base cap stack with release openings 885. The device is further processed to remove the sacrificial layers in the upper and lower device cavities, exposing the sensors 850.

In one embodiment, metal studs 894 are formed to seal the release openings. To form the metal studs, a metal layer, such as aluminum, is formed on the substrate. Other types of metal layers may also be useful. The metal layer may be formed by sputtering or evaporation under a high vacuum level. This seals the micro-casings with high vacuum levels as well. Alternatively, the use of metal studs can seal partial micro-casings to provide homogenous vacuum level across the array. The metal layer is patterned by mask and etch processes. The pattern of the metal layer may be similar to that of the getter layer. For example, the pattern of the metal layer seals the release openings while providing openings in the sensor regions to enable the sensors to sense through the cap. The metal studs may form a lower portion 884 of the seal cap.

Referring to FIG. 8t, an upper portion 886 of the seal cap is formed on the substrate. The upper portion of the seal cap, for example, includes an $\alpha Si/SiO_2$ stack. Providing other configurations of the upper portion of the seal cap may also be useful. For example, the upper portion of the seal cap may include $SiO_2$, $\alpha Si$, ARC or combination thereof. After forming the upper portion of the sealing cap, the process continues as described in FIG. 8r.

Figure 8U:
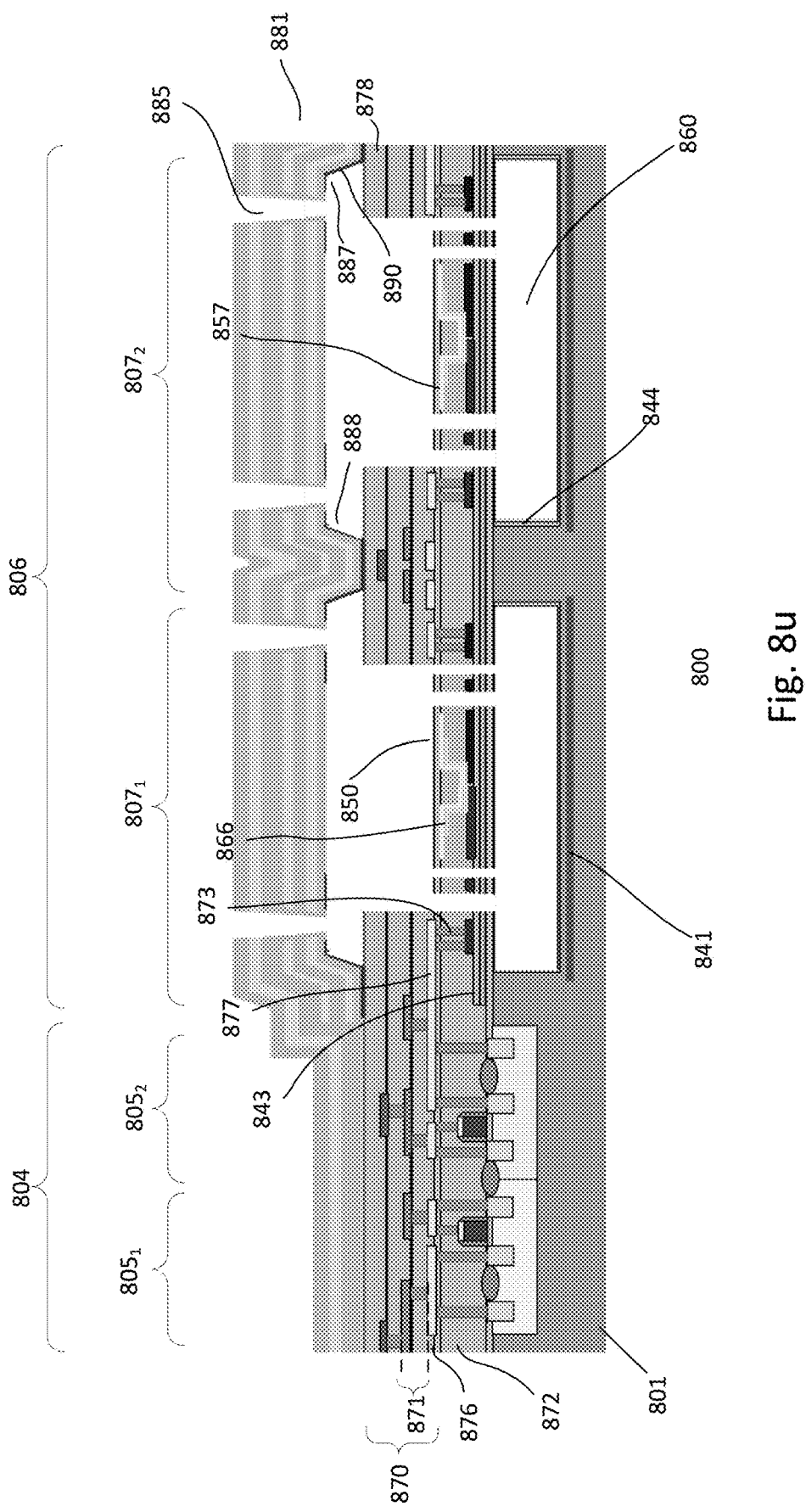
Figure 8V:
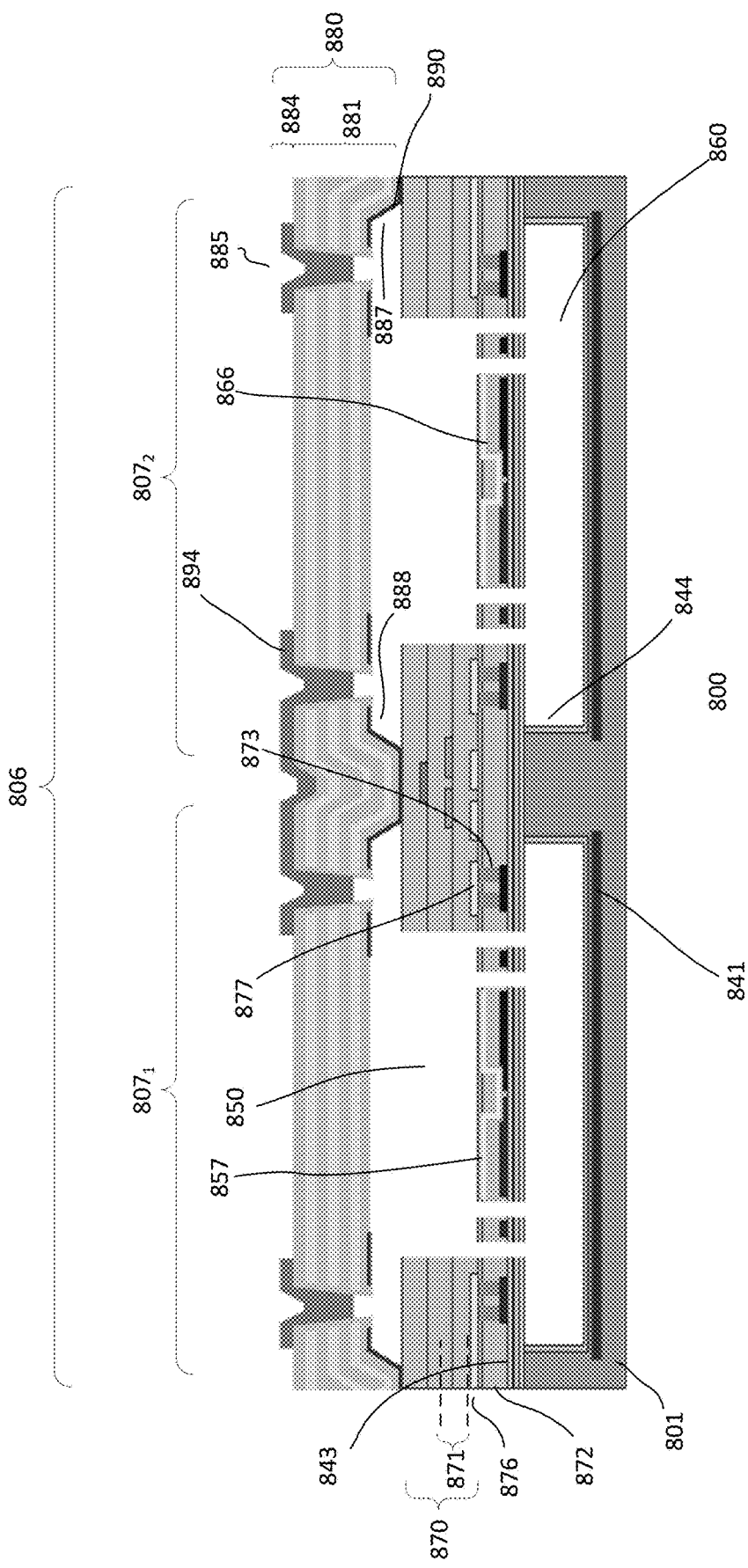

FIGS. 8u-v show an alternative process 800 for forming a device. Referring to FIG. 8u, it is at the stage of processing similar to that described in FIG. 8p. Common elements may not be described or described in detail. As shown, a base cap 881 is formed over the device, the base cap includes 3 uppermost layers covering the CMOS and MEMS regions. In one embodiment, the base cap includes a $SiO_2/\alpha Si/SiO_2/\alpha Si/SiO_2/\alpha Si/SiO_2$ base cap stack with release openings 885. The device is further processed to remove the sacrificial layers in the upper and lower device cavities, exposing the sensors 850.

Referring to FIG. 8v, a seal cap 884 is formed. In one embodiment, the seal cap includes metal studs 894. The metal studs 894 seal the release openings. To form the metal studs, a metal layer, such as aluminum, is formed on the substrate. Other types of metal layers may also be useful. The metal layer may be formed by sputtering or evaporation under a high vacuum level. This seals the micro-casings with high vacuum levels as well. Alternatively, the use of metal studs can seal partial micro-casings to provide homogenous vacuum level across the array. The metal layer is patterned by mask and etch processes. The pattern of the metal layer may be similar to that of the getter layer. For example, the pattern of the metal layer seals the release openings while providing openings in the sensor regions to enable the sensors to sense through the cap. The process continues as described in FIG. 8r.

Figure 9A:
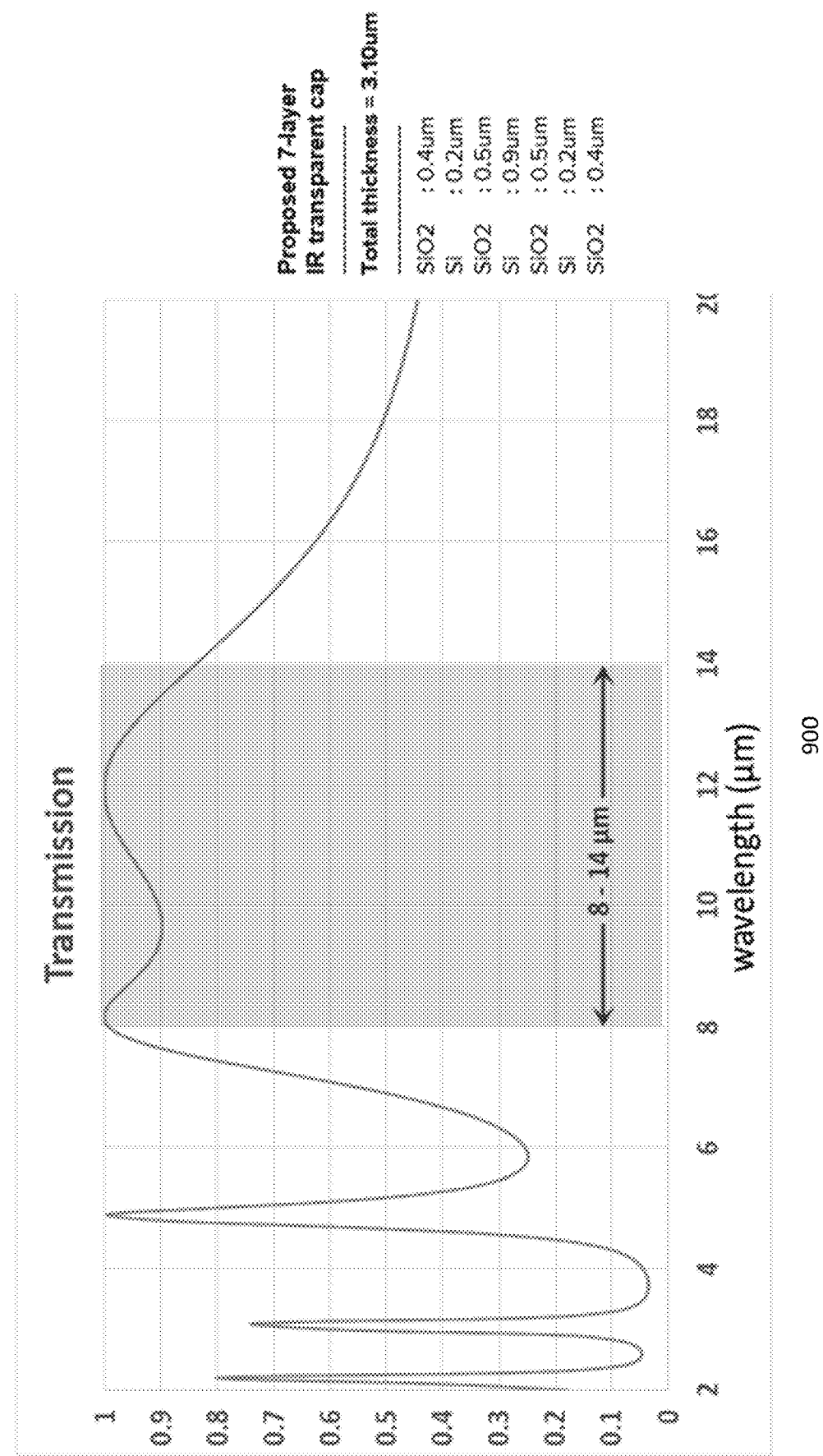
FIG. 9a shows an IR transmission graph of an embodiment of a cap.

FIG. 9a shows a graph 900 plotting IR transmission of an embodiment of a CMOS cap. The CMOS cap includes the following sequence of layers and thicknesses:

| | | | | |
|---|---|---|---|---|
| $1^{st}$ layer | — | $SiO_2$ | — | 400 nm |
| $2^{nd}$ layer | — | α-Si | — | 200 nm |
| $3^{rd}$ layer | — | $SiO_2$ | — | 500 nm |
| $4^{th}$ layer | — | α-Si | — | 900 nm |
| $5^{th}$ layer | — | $SiO_2$ | — | 500 nm |
| $6^{th}$ layer | — | α-Si: | — | 200 nm |
| $7^{th}$ layer | — | $SiO_2$ | — | 400 nm |

The total thickness of the CMOS cap is 3.1 um. As shown by the graph, greater than 90% of IR between 8-14 um is transmitted by the CMOS cap. Clearly, the CMOS cap can efficiently serve as an IR transparent cap for IR sensors.

Figure 9B:
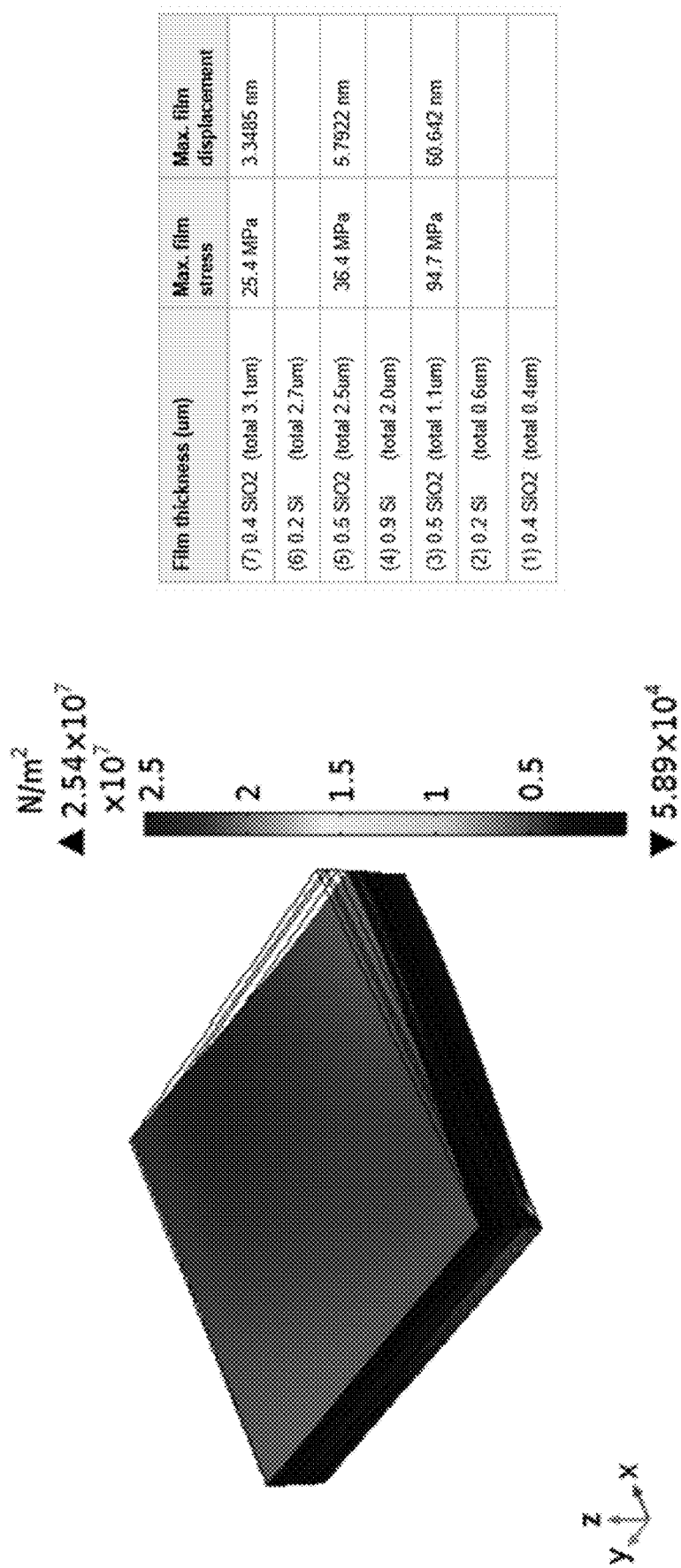
FIG. 9b shows a mechanical strength of an embodiment of a cap.

FIG. 9b shows simulation results 901 of the mechanical strength of an embodiment of a CMOS cap under atmospheric pressure. The CMOS cap includes the following sequence of layers and thicknesses:

| | | | | |
|---|---|---|---|---|
| $1^{st}$ layer | — | $SiO_2$ | — | 400 nm |
| $2^{nd}$ layer | — | α-Si | — | 200 nm |
| $3^{rd}$ layer | — | $SiO_2$ | — | 500 nm |
| $4^{th}$ layer | — | α-Si | — | 900 nm |

| 5th layer | — | SiO2 | — | 500 nm |
| 6th layer | — | α-Si: | — | 200 nm |
| 7th layer | — | SiO2 | — | 400 nm |

The simulation shows that the cap has a maximum film stress of 25.4 MPa, which is far below the fracture strength of a-Si and SiO$_2$. In addition, under atmospheric pressure, the cap exhibits a downward deflection of 3.35 nm. This is also far within the margin of the detector top cavity height of few microns. Clearly, the CMOS cap has sufficient mechanical strength to serve as a cap for IR sensors. As discussed, the cap is an IR transparent cap. For example, the cap is configured to transmit IR radiation within the wavelength of 8-14 μm. The cap is a CMOS process compatible cap. In one embodiment, the cap includes various IR transparent CMOS compatible layers. Infrared transparent layers include silicon (Si), such as amorphous silicon (αSi) and silicon oxide (SiO$_2$). Other types of IR transparent layers may also be useful. For example, IR transparent layers such as polysilicon (pSi), germanium (Ge), silicon-germanium (SiGe) or zinc sulfide (ZnS), may also be used.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

What is claimed is:

1. A device comprising:
   a substrate prepared with a complementary metal oxide semiconductor (CMOS) region with CMOS devices and a sensor region with micro-electro-mechanical system (MEMS) region with a MEMS component;
   a CMOS compatible cap disposed on the substrate over the CMOS region and MEMS region, wherein the CMOS compatible cap includes CMOS layers, the CMOS compatible cap is elevated over the MEMS region to provide a cap cavity between the cap and the MEMS region; and
   wherein the cap comprises
      a base cap having at least one cap release opening, and
      a seal cap for sealing the at least one cap release opening in the base cap.

2. The device of claim 1 wherein the MEMS component comprises a thermoelectric IR sensor.

3. The device of claim 2 wherein the cap comprises:
   a base cap having a CMOS IR transparent base cap layer, the base cap includes a cap release opening; and
   a seal cap for sealing the cap release opening in the base cap.

4. The device of claim 3 wherein the seal cap comprises a CMOS IR transparent seal cap layer sealing the release opening.

5. The device of claim 3 wherein the seal cap comprises a CMOS IR non-transparent seal cap layer sealing the release opening, wherein the seal cap layer is patterned to expose the CMOS IR-transparent base cap layer to allow IR transmission to the IR sensor while sealing the base cap.

6. The device of claim 5 wherein the seal cap further comprises a CMOS IR transparent seal cap layer disposed over the IR non-transparent patterned seal cap layer.

7. The device of claim 1 wherein the MEMS component comprises an array of thermoelectric IR sensor cells.

8. The device of claim 7 wherein the cap comprises:
   a base cap having a CMOS IR transparent base cap layer, the base cap includes a cap release opening; and
   a seal cap for sealing the cap release opening in the base cap.

9. The device of claim 8 wherein the cap comprises:
   an outer bearing wall surrounding the MEMS region; and
   inner bearing walls, wherein the outer bearing wall and inner bearing walls are configured to form micro-casings surrounding the sensor cells.

10. The device of claim 9 wherein the base cap comprises release openings for the micro-casings.

11. The device of claim 9 wherein the inner bearing walls comprise channels between adjacent sensor cells to provide homogeneous vacuum across the array of sensor cells.

12. The device of claim 8 wherein the seal cap comprises a CMOS IR transparent seal cap layer sealing the release opening.

13. The device of claim 8 wherein the seal cap comprises a CMOS IR non-transparent seal cap layer sealing the release opening, wherein the seal cap layer is patterned to expose the CMOS IR-transparent base cap layer to allow IR transmission to the IR sensor while sealing the base cap.

14. The device of claim 13 wherein the seal cap further comprises a CMOS IR transparent seal cap layer disposed over the IR non-transparent patterned seal cap layer.

15. The device of claim 8 wherein the base cap comprises:
   a base cap stack with an odd number of CMOS base cap layers; and
   wherein the odd number of CMOS base cap layers comprises alternating silicon oxide and amorphous silicon layers in which a top base cap layer and a bottom base cap layer of the base cap stack comprise silicon oxide.

16. A method for forming a device comprising:
   providing a substrate prepared with a complementary metal oxide semiconductor (CMOS) region with CMOS devices and a sensor region with micro-electro-mechanical system (MEMS) region with a MEMS component; and
   forming a CMOS compatible cap on the substrate over the CMOS region and MEMS region, wherein the CMOS compatible cap includes CMOS layers, the CMOS compatible cap is elevated over the MEMS region to provide a cap cavity between the cap and the MEMS region; and
   wherein forming the cap comprises
      forming a base cap having a CMOS IR transparent base cap layer, the base cap includes a cap release opening, and
      forming a seal cap for sealing the cap release opening in the base cap.

17. The method of claim 16 wherein the MEMS component comprises a thermoelectric IR sensor.

18. The method of claim 16 wherein the seal cap comprises a CMOS IR transparent seal cap layer sealing the release opening.

19. The method of claim 16 wherein the seal cap comprises:
   a CMOS IR non-transparent seal cap layer sealing the release opening, wherein the seal cap layer is patterned to expose the CMOS IR-transparent base cap layer to allow IR transmission to the IR sensor while sealing the base cap; and a CMOS IR transparent seal cap layer disposed over the IR non-transparent patterned seal cap layer.

20. The method of claim 16 wherein forming the cap further comprises:
   forming an outer bearing wall surrounding the MEMS region; and
   forming inner bearing walls, wherein the outer bearing wall and inner bearing walls are configured to form micro-casings surrounding the sensor cells.

* * * * *